United States Patent
Ooishi et al.

(10) Patent No.: US 6,301,187 B1
(45) Date of Patent: Oct. 9, 2001

(54) SYNCHRONOUS TYPE SEMICONDUCTOR MEMORY DEVICE PERMITTING REDUCTION IN RATIO OF AREA OCCUPIED BY CONTROL CIRCUIT IN CHIP AREA

(75) Inventors: Tsukasa Ooishi; Shigeki Tomishima, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/226,064

(22) Filed: Jan. 6, 1999

(30) Foreign Application Priority Data

Apr. 28, 1998 (JP) .................................. 10-119332
Jul. 22, 1998 (JP) .................................. 10-206774

(51) Int. Cl.$^7$ ..................................... G11C 8/00
(52) U.S. Cl. ........................... 365/233; 365/230.03
(58) Field of Search ............... 365/233, 230.03, 365/230.06, 230.08

(56) References Cited

U.S. PATENT DOCUMENTS

| | | | | |
|---|---|---|---|---|
| 4,740,923 | * | 4/1988 | Kaneko et al. | 365/230.03 |
| 4,839,860 | * | 6/1989 | Shineda et al. | 365/230.03 |
| 5,355,342 | * | 10/1994 | Ueoka | 365/230.03 |
| 5,361,343 | * | 11/1994 | Kosonocky et al. | 365/230.03 |
| 5,416,740 | * | 5/1995 | Fujita et al. | 365/230.03 |
| 5,473,566 | * | 12/1995 | Rao | 365/230.03 |
| 5,621,690 | * | 4/1997 | Jungroth et al. | 365/230.03 |
| 5,650,977 | | 7/1997 | Kyung et al. | 365/230.03 |
| 5,717,651 | * | 2/1998 | Kikukawa et al. | 365/230.03 |
| 5,970,021 | * | 10/1999 | Sakurai | 365/233 |
| 5,991,231 | * | 11/1999 | Koshikawa | 365/233 |
| 6,061,294 | * | 5/2000 | Koshikawa | 365/233 |

FOREIGN PATENT DOCUMENTS

| | | |
|---|---|---|
| 6-325575 | 11/1994 | (JP) . |
| 7-161183 | 6/1995 | (JP) . |
| 8-297966 | 11/1996 | (JP) . |
| 9-73776 | 3/1997 | (JP) . |
| 9-180455 | 7/1997 | (JP) . |
| 9-185883 | 7/1997 | (JP) . |

OTHER PUBLICATIONS

"A 32–Bank 1Gb Self–Strobing Synchronous DRAM with 1 Gbyte/s Bandwidth", Yoo et al., IEEE Journal of Solid–State Circuits, vol. 31, No. 1996, pp. 1635–1642.

"A 2.5–ns Clock Access, 250–MHz, 256–Mb SDRAM with Synchronous Mirror Delay", Saeki et al., IEEE Journal of Solid–State Circuits, vol. 31, No. 11, Nov. 1996, pp. 1656–1665.

"Limitations and Challenges of Multigigabit DRAM Chip Design", Itoh et al., IEEE Journal of Solid–State Circuits, vol. 32, No. 5, May 1997, pp. 624–634.

\* cited by examiner

Primary Examiner—Tan T. Nguyen
(74) Attorney, Agent, or Firm—McDermott, Will & Emery

(57) ABSTRACT

An address signal is transmitted to each bank by a common address bus. A column pre-decoder, and a row pre-decoder detect a selection of a corresponding bank in response to a signal transmitted by the address bus, and receive an address signal in response to a command signal from a command data bus. Circuits closer to the side of the address data bus and command data bus than to the circuit which latches the received data have a hierarchical power supply configuration.

20 Claims, 37 Drawing Sheets

IN STAND-BY STATE

WHEN ACTIVATED

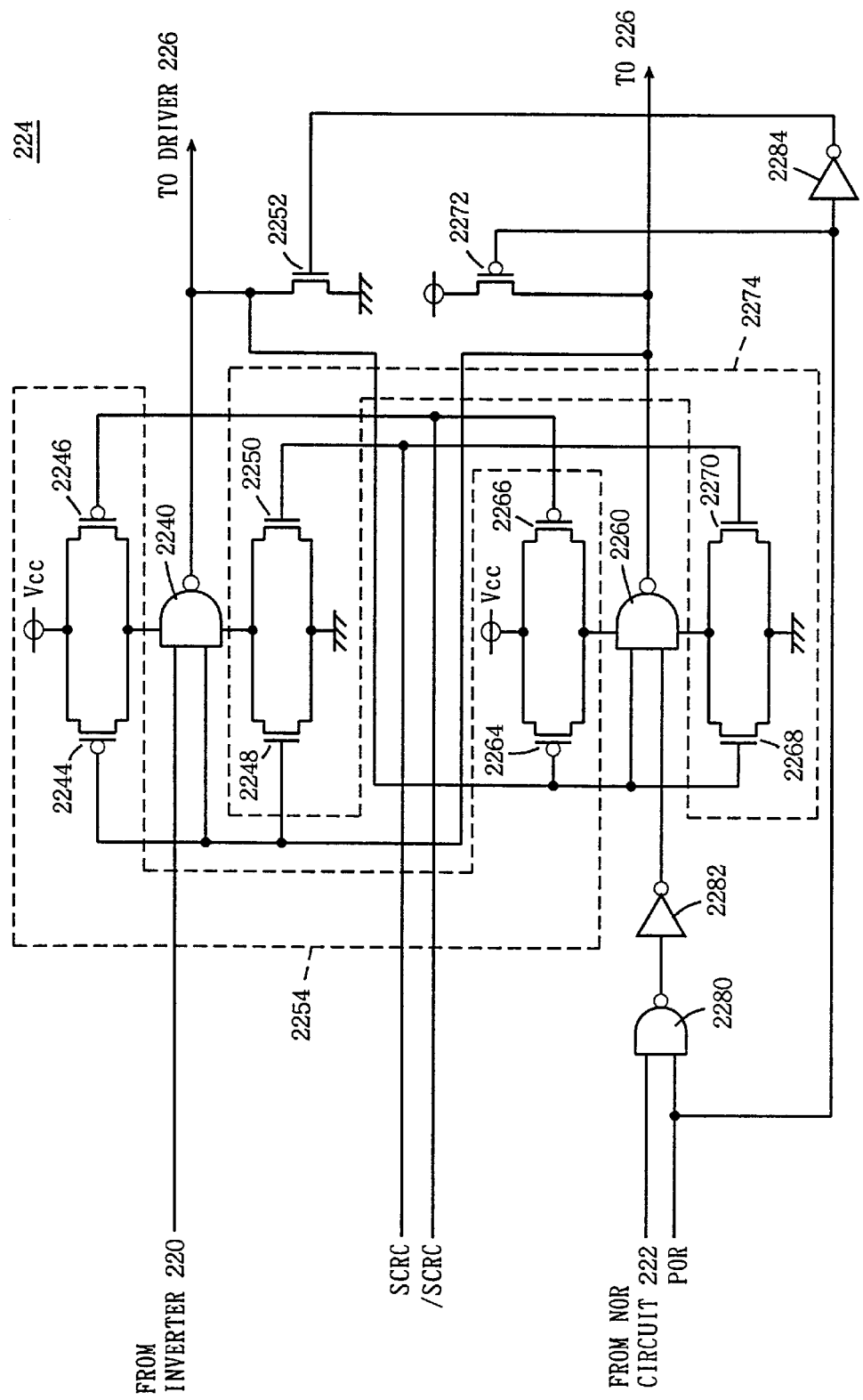
F I G. 8

SYNCHRONOUS TYPE SEMICONDUCTOR MEMORY DEVICE PERMITTING REDUCTION IN RATIO OF AREA OCCUPIED BY CONTROL CIRCUIT IN CHIP AREA

BACKGROUND OF THE INVENTION

1. Field of the Invention

The present invention relates generally to semiconductor memory devices, and more particularly to a semiconductor memory device operating in synchronism with an external clock signal.

2. Description of the Background Art

In accordance with improvements in the operating speed of recent microprocessors (hereinafter referred to as "MPUs"), synchronous type DRAMs (synchronous type Dynamic Random Access Memories, hereinafter referred to as "SDRAM") or the like which operate in synchronism with a clock signal are used as a main storage device in order to implement high speed accessing.

In controlling internal operations of the SDRAM, the operations are divided into row-related operations and column related-operations.

Meanwhile, the SDRAM employs the bank configuration in which the memory cell array is divided into banks operable independently from each other. The operations are controlled independently for each bank for the row-related operations and the column-related operations.

In the SDRAM, the operation power supply voltage should be lowered for securing the reliability, as the transistor size tends to be even more reduced because of high density integration. With relatively low operation power supply voltage, the threshold voltage of transistors is generally lowered. Such lowering of the threshold voltage however gives rise to current leakage when the transistors are in the cut-off state as well.

Furthermore, as described above, in a multi-bank SDRAM, the control circuit requires a complicated configuration, which increases the number of circuits on the entire chip, and leakage current is likely to increase in stand-by operations or active operations.

The increase in the leakage current in the stand-by and active operations should be inevitably reduced, if a SDRAM is for example used in a portable instrument operating on a battery.

Problems Associated with Increasing the Number of Banks

In the SDRAM, 2 or 4 banks are generally used in order to achieve high speed operations.

Furthermore, in the Rambus SLDRAM, a configuration with a larger number of banks, 8 or 16 banks are requested.

If a memory circuit and a logic circuit are both mounted on the same chip, increase in the width of a data transmission bath increase in the bit number) within a chip is also requested.

A multi-bank DRAM is for example disclosed by Yoo et al. "A 32-bank 1 Gb Self-Storobing Synchronous DRAM with 1 Gbyte/s Bandwidth", IEEE Journal of Solid-State Circuits, VOL. 31, No. 11, pp. 1635 to 1642, November 1996 (herein after referred to as "Conventional Art 1".

FIG. 35 is a schematic diagram of the configuration of a memory cell array in a multi-bank DRAM 4000 according to Conventional Art 1.

Referring to FIG. 35, the memory cell array portion includes a memory cell array 4500, a row decoder 4520, and a column decoder 4530. Memory cell array 4500 is divided into 8 banks along the direction orthogonal to the column direction, and the banks each include a sub array 4510. Each sub array includes memory cells for storing data.

Multi-bank DRAM 4000 activates a bank including a memory cell selected in response to an address signal, and reads/writes data from/to the memory cell selected by row decoder 4520 and column decoder 4530.

Meanwhile, memory cells having the same row address in memory cell array 4500 belong to the same bank, and are connected to one main word line. Thus, in a single row selecting operation, sense amplifiers corresponding to all the memory cells included in the same row should be activated, and this impedes reduction in the power consumption. Furthermore, a local column decoder is necessary for each of the banks, the area of a local column decode circuit band increases as the number of banks increases, and the chip area could be disadvantageously increased.

Conventional Art 2

In order to solve these disadvantages, Japanese Patent Laying-Open No. 9-73776 discloses a technique related to a multi-bank DRAM by which each bank is divided in the direction orthogonal to the row direction (hereinafter referred to as "Conventional Art 2").

FIG. 36 is a schematic diagram of the configuration of a memory cell array portion of a multi-bank DRAM 5000 according to Conventional Art 2.

Referring to FIG. 36, the memory cell array portion includes a memory cell array 5500, a row decoder 5520, a word line driver 5525, and a column decoder 5530.

Memory cell array 5500 includes 4 banks formed by dividing the array in the column direction. Each of the banks is divided into sub arrays 5510. Sub array 5510 includes a plurality of memory cells storing data.

In multi-bank DRAM 5000, memory cells having the same column address are included in the same bank, and the banks include sub column decoders 5531 to 5534. Thus, a column selecting line 5700 needs only be provided on a column basis.

FIG. 37 is a diagram of the arrangement of word lines in multi-bank DRAM 5000.

Referring to FIG. 37, multi-bank DRAM 5000 includes a main word line 5710 provided for each row as a common signal line to all the banks, a sub word line 5720 for selecting a corresponding row in the same bank, and a logic gate 5730 for associating main word line 5710 and sub word line 5720.

Main word line 5710 is connected with sub word line 5720 in each bank through logic gate 5730. Logic gate 5730 is provided for each row in each bank, and receives main word line 5710 and selecting signals B1 to B4. Logic gate 5730 takes the logical product of the main word line and a bank selecting signal to select a sub word line corresponding to main word line 5710 activated in the selected bank and starts a reading operation of data.

Thus, increase in the chip area by the area of the local column decoder band is restricted as much as possible, the sense amplifier band is divided on a bank basis and operates independently, and therefore the configuration is free from increase in the power consumption.

As the number of banks formed by dividing the array increases, the number of pieces of data which can be taken out from one bank is reduced, in other words, such a configuration is not suitable for multi-bit configurations.

SUMMARY OF THE INVENTION

It is an object of the present invention to provide a synchronous semiconductor memory device having a control circuit occupying a reduced area in the entire chip area by simplifying the configuration of the control circuit, if the storage capacity increases.

Another object of the present invention is to provide a synchronous semiconductor memory device such as SDRAM which permits reduction in current leakage in stand-by operations and active operations, if the storage capacity increases.

Yet another object of the present invention is to provide a synchronous semiconductor memory device which permits multi-bit data to be simultaneously input/output while restricting increase in the chip area or power consumption, if the number of banks is increased.

Shortly stated, a synchronous semiconductor memory device according to the present invention receives an address signal and a control signal, exchanges storage data and includes a memory cell array, an internal synchronizing signal generation circuit, an address signal input circuit, an address bus, and a plurality of selecting circuits.

The memory cell array has a plurality of memory cells arranged in a matrix of rows and columns. The memory cell array is divided into a plurality of memory cell blocks. The internal synchronizing signal generation circuit outputs an internal dock signal in synchronism with an external clock signal. The address signal input circuit receives an external address signal in synchronism with the internal dock signal.

The address bus is provided commonly to a plurality of memory cell blocks, and transmits an address signal from the address signal input circuit.

The plurality of selecting circuits are provided for the memory cell blocks, and select a memory cell according to an address signal from the address bus. The selecting circuit is activated in response to a selection of a corresponding memory cell block based on the address signal.

According to another aspect of the invention, a synchronous semiconductor memory device according to the present invention receives an address signal and a control signal, exchanges storage data and includes a memory cell array, an internal synchronous signal generation circuit, a central processing circuit, a command data bus, a plurality of local control circuits.

The memory cell array has a plurality of memory cells arranged in a matrix of rows and columns. The memory cell array is divided into a plurality of memory cell blocks.

The internal synchronizing signal generation circuit outputs an internal clock signal in synchronism with an external clock signal.

The central circuit receives an external control signal in synchronism with an internal clock signal, and outputs an internal control signal to control the operations of the synchronous semiconductor memory device.

The command data bus is provided commonly to the plurality of memory cell blocks and transmits the internal control signal.

The plurality of local control circuit is provided corresponding to the memory cell blocks, and controls the operations of the corresponding memory cell blocks in response to the command data bus. The local control circuit receives the internal control signal in response to the selection of a corresponding memory cell block.

According to yet another aspect of the present invention, a synchronous semiconductor memory device receives an address signal and a control signal in synchronism with an external clock signal, and includes a memory cell array, an internal synchronizing signal generation circuit, an address signal input circuit and a plurality of selecting circuits.

The memory cell array has a plurality of memory cells arranged in a matrix of rows and columns. The memory cell array is divided into a plurality of memory cell blocks arranged in a matrix of a first plurality of columns and a second plurality of rows.

The internal synchronizing signal generation circuit outputs an internal clock signal in synchronism with an external clock signal.

The address signal input circuit receives an external address signal in synchronism with the internal clock signal.

The address bus is commonly provided to the plurality of memory cell blocks, and transmits the address signal from the address signal input circuit.

The plurality of selecting circuits are provided corresponding to the memory cell blocks and select a memory cell based on the address signal from the address bus. The selecting circuit is activated in response t the selection of a corresponding memory cell block based on the address signal.

Therefore, a main advantage of the present invention lies in that the area occupied by the control-related circuitry in the chip area may be restricted, because the address bus is commonly provided to the plurality of memory cell blocks.

Another advantage of the present invention lies in that the area occupied by the control-related circuitry in the chip area may be restricted, because the command data bus is provided commonly to the plurality of memory cell blocks.

Yet another advantage of the present invention lies in that increase in the chip area or power consumption may be restricted if the number of memory cell blocks formed by dividing the array is increased.

The foregoing and other objects, features, aspects and advantages of the present invention will become more apparent from the following detailed description of the present invention when received in conjunction with the accompanying drawings.

BRIEF DESCRIPTION OF THE DRAWINGS

FIGS. 5A to 5C are diagrams for use in illustration of a hierarchical configuration, wherein FIG. 5A is a circuit diagram of the configuration of a hierarchical power supply, FIG. 5B is a diagram for use in illustration of the stand-by state, and FIG. 5C is a diagram for use in illustration of the active state;

FIG. 8 is a block diagram showing in detail the configuration of flip-flop circuit 224;

DESCRIPTION OF THE PREFERRED EMBODIMENTS

Figure 1:
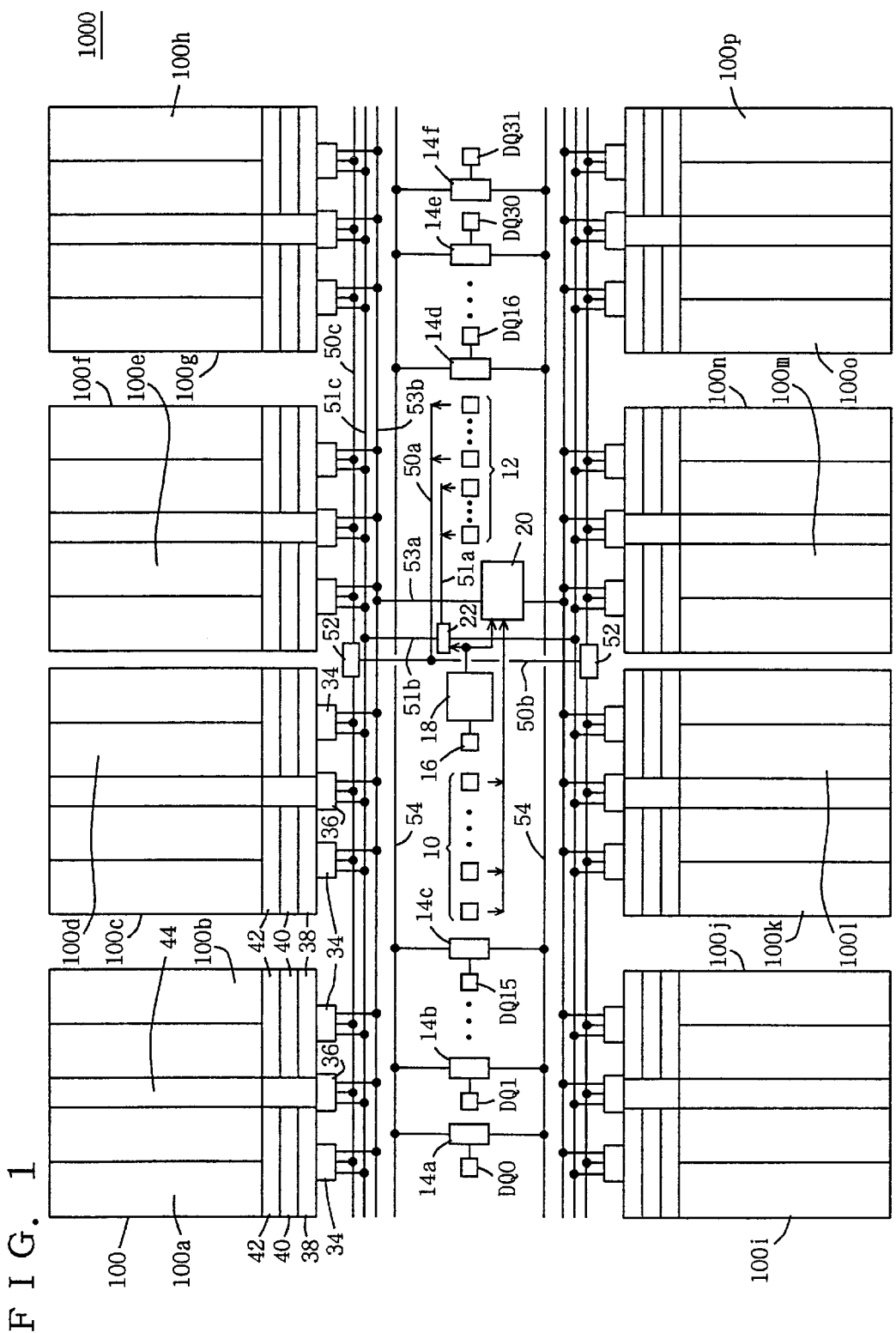
FIG. 1 is a schematic diagram of the configuration of a synchronism semiconductor memory device 1000 according to a first embodiment of the present invention.

FIG. 1 is a schematic block diagram of the configuration of a synchronous semiconductor memory device 1000 according to a first embodiment of the invention.

Referring to FIG. 1, synchronous semiconductor memory device 1000 includes a control circuit 20 which decodes external control signals /RAS, /CAS, /W, /CS and the like applied and received throb an external control signal input terminal group 10 and generates an internal control signal, command data buses 53a and 53b which transmit the internal control signal output from control circuit 20, and a memory cell array 10 having memory cells arranged in a matrix of rows and columns.

Memory cell array 100 is divided into 16 memory cell blocks 100a to 100b in total as shown in FIG. 1. For example, synchronous semiconductor memory device 1000 has a memory capacity of 1G bits, each memory cell block has a capacity of 64 M bits. Each block may independently function as a bank.

Synchronous semiconductor memory device 1000 further includes an internal synchronizing signal generation circuit 18 which receives an external clock signal external control signal Ext.CLK applied to a clock signal input terminal 16, starts a synchronizing operation under the control of control circuit 20, and outputs an internal clock signal int. CLK.

Internal synchronizing signal generation circuit 18 generates an internal clock signal int. CLK in synchronism with external control signal Ext.CLK for example by a delay clocked loop circuit (hereinafter referred to as "DLL circuit").

External address signals A0 to Ai (i: natural number) are received into synchronous semiconductor memory device 1000 in synchronism with internal clock signal int. CLK under the control of control circuit 20.

Among external address signals A0 to Ai, data of a prescribed number of bits is applied to a bank decoder 22 through an address bus 51a. Decoded bank addresses B0 to B7 are transmitted to the banks through address buses 51b and 51c from bank decoder 22.

Meanwhile, other external address signals applied to address signal input terminal group 12 are transmitted through address buses 50a and 50b to an address driver 52, from which the signals are transmitted to the banks (memory cell blocks) through an address bus 50c.

Synchronous semiconductor memory device 1000 further includes a row pre-decoder 36 provided for each of a memory cell block pair to latch and pre-decodes a row address transmitted by address bus 50c under the control of control circuit 20, a row decoder 44 to select a corresponding row (word line) in a memory cell block selected based on an output from row pre-decoder 36, a column pre-decoder 34 provided for each of a memory cell block to latch and pre-decode a column address transmitted by address bus 50c under the control of control circuit 20, a column pre-decoder line 40 which transmits an output from pre-decoder 34, and a column decoder 42 which selects a corresponding column (bit line pair) in a memory cell block selected based on an output from column pre-decoder line 40.

Synchronous semiconductor memory device 1000 further includes data input terminals DQ0 to DQ15 provided in a region at the central part of the chip along the longer side direction and data input terminals DQ16 to DQ31 provided outside the region in which an external control signal input terminal group 10 and an address signal input terminal group 12 are provided, input/output buffer circuits 14a to 14f provided corresponding to data input terminals DQ0 to DQ31, a data bus 54 which transmits data between an input buffer and a corresponding memory cell block, and read/write amplifiers 38 provided corresponding to memory cell blocks 100a to 100b to exchange data between data bus 54 and a selected memory cell column.

Signal /RAS applied to external control signal input terminal group 10 is a row strobe signal to start an internal operation of synchronous semiconductor memory device 1000, and determine the active period of signal /RAS. In response to the activation of signal /RAS, the circuits related to the operation of selecting a row in memory cell array 100 such as row decoder 40 are activated.

Signal /CAS applied to external control signal input terminal group 10 is a column address strobe signal and activates a circuit to select a column in memory cell array 100.

Signal /CS [/CAS] applied to external control signal input terminal group 10 is a chip select signal to indicate a selection of synchronous semiconductor memory device 1000, and a signal to instruct a writing operation by synchronous semiconductor memory device 1000.

The operations of receiving signals /CS, /RAS, /CAS and /W are performed in synchronism with internal clock signal int. CLK.

The operations of receiving an address signal applied to address signal input terminal group 12 and data exchange through data input/output terminals DQ0 to DQ31 are also performed in synchronism with internal clock signal int. CLK.

Figure 2:
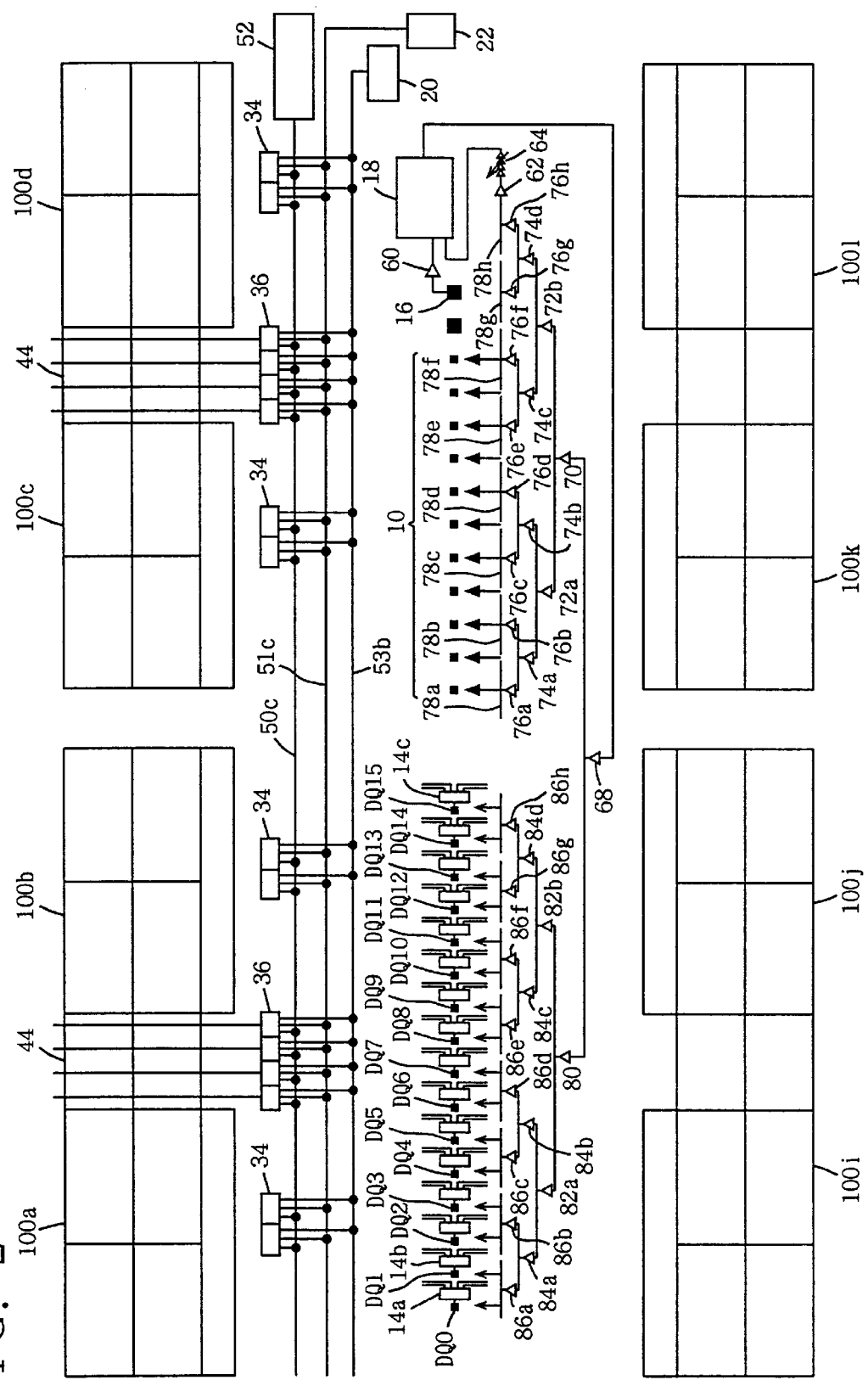
FIG. 2 a diagram showing the concept of the distribution of an internal clock signal int. CLK in the synchronism semiconductor memory device 1000 according to the first embodiment.

FIG. 2 is a diagram of the concept of the distribution of internal clock signal int. CLK to input terminals in external control signal input terminal group 10 and data input terminals DQ0 to DQ15.

Referring to FIG. 2, external clock signal Ext. CLK applied to clock signal input terminal 16 is applied to internal synchronizing signal generation circuit 18 through a buffer circuit 60.

Internal clock signal int. CLK output from internal synchronizing signal generation circuit 18 is applied to a buffer circuit 68. The output of buffer circuit 68 is divided into two, one of which is applied to a buffer circuit 70 and the other to a buffer circuit 80.

The output of buffer circuit 70 is further divided into two and applied to buffer circuits 72a and 72b.

The output of buffer circuit 72a is divided into two and applied to buffer circuits 74a and 74b.

Meanwhile, the output of buffer circuit 72b is further divided into two and applied to buffer circuits 74c and 74d.

The outputs of buffer circuits 74a, 74b, 74c, and 74d are further divided into two and applied to buffer circuits 76a and 76b, 76c and 76d, 76e and 76f, and 76g and 76h.

More specifically, the output of buffer circuit 70 is sequentially divided into two and finally into 8 dock signals. The 8 dock signals are applied to interconnections 78a to 78h. In synchronism with the clock signals supplied from the ends of interconnections 78a to 78h, an external control signal is received from external control signal input terminal group 10.

The clock signal from the end of interconnection 78h is applied to internal synchronizing signal generation circuit 18 through a replica buffer 62 and a delay adjusting circuit 64. Internal synchronizing signal generation circuit 18 generates internal clock signal int. CLK by synchronizing the output of delay adjusting circuit 64 with external clock signal Ext.CLK applied from buffer circuit 60.

Herein, assuming that there is not such delay adjusting circuit 64, buffer circuit 60 and replica buffer circuit 62 have the same configuration, and therefore external clock signal Ext.CLK applied to buffer circuit 60 and the clock signal on interconnection 78h applied to replica buffer circuit 62 are adjusted to in phase. Herein, the dock signal on interconnection 78h and the clock signals on interconnections 78a to 78g are in phase.

More specifically, the operation of receiving an external control signal is performed in synchronism with external clock signal external control signal Ext.CLK.

Herein, delay adjusting circuit 64 is provided to adjust the differences between external clock signal Ext.CLK and internal clock signal int. CLK in the amplitude level or the ratio of the active period to the cycle.

In the foregoing, the distribution of internal clock signal int. CLK to external control signal input terminal group 10 is described, data input/output terminal group DQ0 to DQ15 are provided with a similar configuration.

More specifically, the other one of the outputs of buffer circuit 68 is applied to buffer circuit 80, sequentially divided into two, and finally into the number of outputs of buffer circuits 86a to 86h. In synchronism with internal clock signals output from buffer circuits 86a to 86h, data is exchanged between data input/output buffer group DQ0 to DQ15.

Furthermore, although the distribution of internal dock signal int. CLK to external control signal input terminal group 10 and data input/output terminal group DQ0 to DQ15 are described by referring to FIG. 2, a similar configuration is provided to address signal input terminal group 12 and data input/output terminals DQ16 to DQ31. Thus, an address signal is received or a data signal is exchanged in synchronism with external control signal Ext.CLK.

Figure 3:
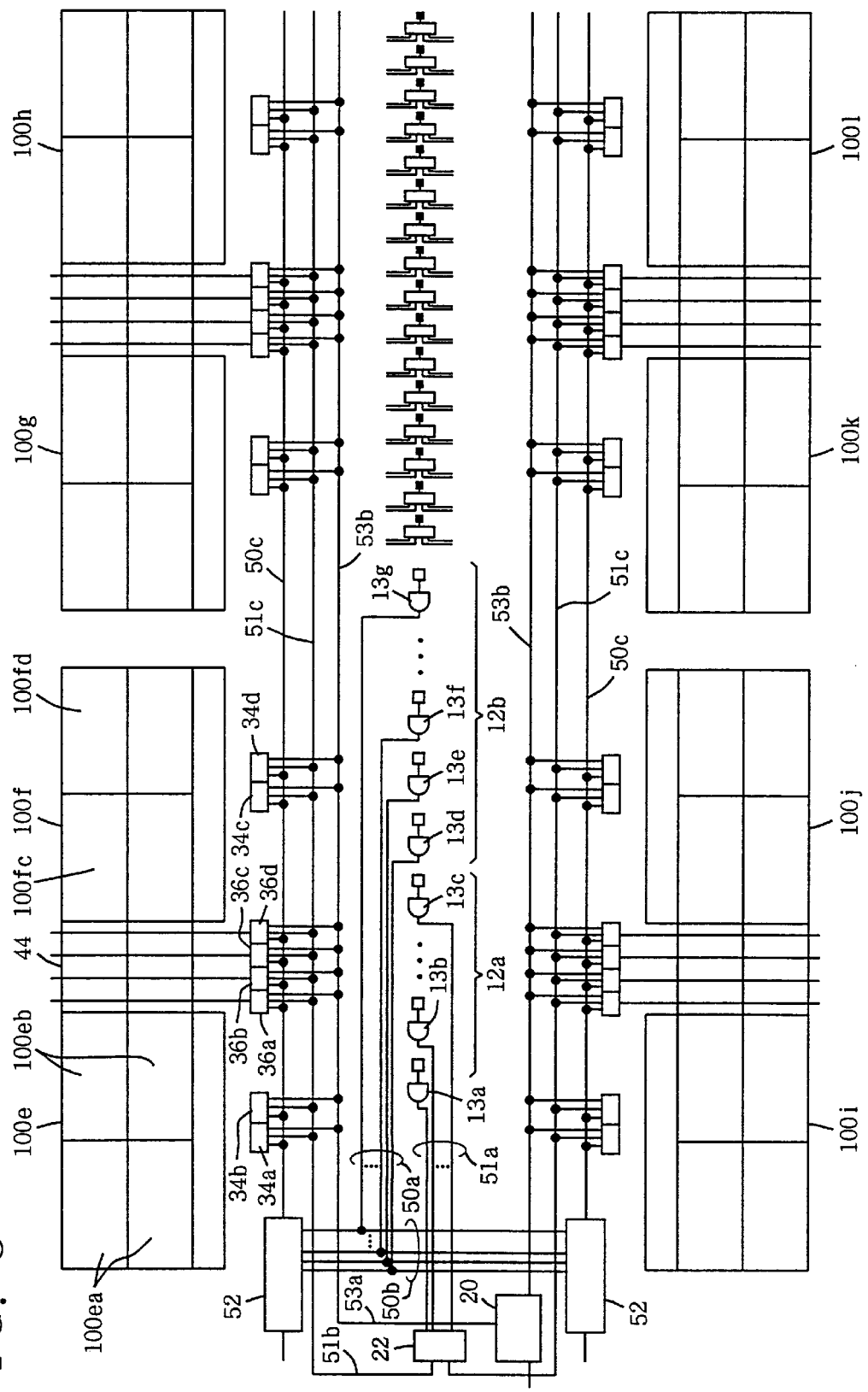
FIG. 3 is a schematic block diagram of the configuration of an address bus and a command bus in the synchronism semiconductor memory device.

FIG. 3 is a schematic block diagram of the configuration of address signal input terminal group 12, address buses 50a, 50b, 50c, 51a, 51b and 51c, and command data buses 53a and 53b in synchronous semiconductor memory device 1000 shown in FIG. 1.

The more significant data bits of an address signal applied to address signal input terminal group 12a among address signal input terminal group 12 are output to bank address bus 51a from input buffers 13a to 13c operating in synchronism with internal clock signal int. CLK. Bank decoder 22, upon receiving the data from bank address bus 51a, transmits a decoded signal to memory cell blocks (banks) through bank address buses 51b and 51c.

The less significant data bits of the address signal applied to address signal input terminal group 12b among address signal input terminal group 12 are applied to address driver 52 through address data buses 50a and 50b by input buffers 13d to 13g operating in synchronism with internal dock signal int. CLK. Address driver 52 transmits an address signal to each bank (memory cell block) through address data bus 50c.

Control circuit 20 receives and decodes command data applied to control signal input terminal group 10, and transmits the decoded command data to each memory cell block (bank) through command data buses 53a and 53b.

Among the banks, memory cell block 100e for example is further divided into sub blocks 100ea and 100eb.

Among row pre-decoders 36, row pre-decoder 36a corresponds to memory cell sub block 100ea, and row pre-decoder 36b to memory cell sub block 100eb. Row pre-decoder 36a is activated when it detects the selection of bank 100e in response to a bank address transmitted by bank address bus 51c, and an instruction of a row-related operation by command data bus 53b, and receives address data and command data from address bus 50c and command data bus 53b, respectively. Row pre-decoder 36a outputs a pre-decoded address signal to row decoder 44 accordingly.

Row pre-decoders 36b to 36d operate similarly.

Among column pre-decoders 34, column pre-decoder 34a corresponding to memory cell block 400ea receives corresponding address data from address bus 50c when it detects the selection of memory cell block 100e in response to a bank address transmitted through bank address bus 51c and the activation of a column-related operation by command data bus 53b.

Column pre-decoder 34a pre-decodes the received column address data, and outputs a pre-decoded column address signal to column pre-decoder line 40.

Figure 4:
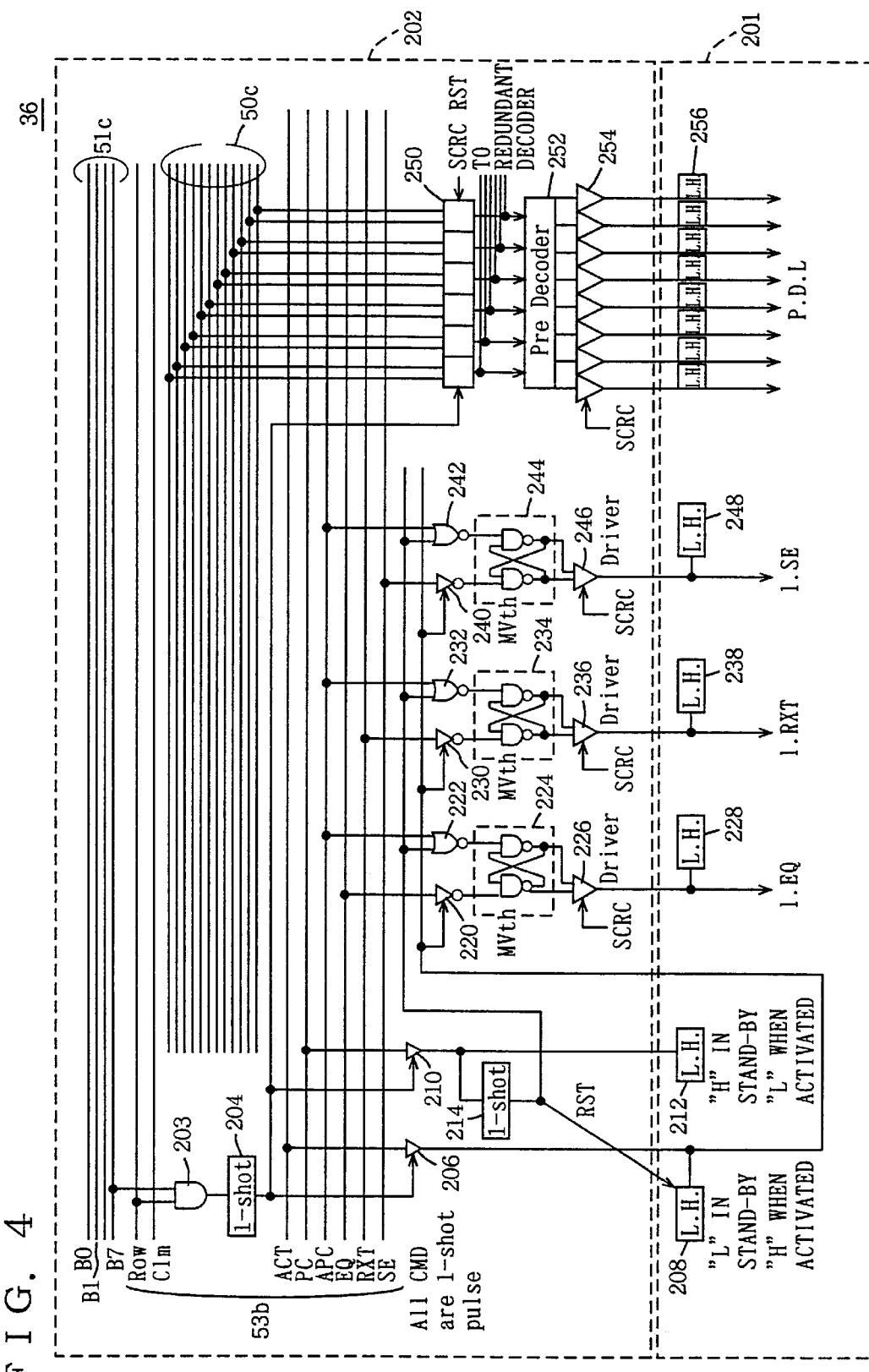
FIG. 4 is a schematic block diagram of the configuration of a row pre-decoder 36 according to the first embodiment of the invention.

FIG. 4 is a schematic block diagram of the configuration of row pre-decoder 36 in the configuration shown in FIG. 3.

Command address bus 53b transmits various signals including a signal Row to instruct an activation of a row-related circuit operation, a signal Clm to instruct an activation of a column-related circuit operation, a signal ACT to instruct an activation of an operation of the internal circuitry, a signal PC to instruct a bank to be reset (pre-charged), a signal APC to instruct all the banks to be pre-charged, a signal EZ to instruct to cancel equalization of a bit line or the like or disconnecting an unused bit line from a sense amplifier, a signal RXT to instruct an activation of a word line, and a signal SE to instruct an activation of a sense amplifier.

Bank address bus 51c transmits bank address signals B0 to B7 decoded by bank decoder 22. Address bus 50c transmits an address signal from address driver 52.

Among bank address signals, an active state signal is output from an AND circuit 203, if data bit B7 is activated, and signal Row is activated, and an active one-shot pulse is output from an one-shot pulse generation circuit 204 accordingly.

Accordingly, driver circuit 206 is activated and the level of signal ACT is received and held by a level holding circuit 208.

Similarly, in response to one-shot pulse generation circuit 204, driver circuit 210 is activated to receive the level of signal PC and the level is held by level holding circuit 208. Meanwhile, in response to an output from driver circuit 210, one-shot pulse generation circuit 214 outputs a reset signal to level holding circuit 208. An inverter 220 is activated in response to an output signal form level holding circuit 208 to receive and output signal EQ. Meanwhile, a NOR circuit 222 receives signal APC and a signal from one-shot pulse generation circuit 214 to output the NOR operation result. A flip-flop circuit 224 is set in response to an output from inverter 220 and reset in response to an output from NOR circuit 222. A driver circuit 226 activated by a hierarchical power supply control signal SCRC which will be later described receives and outputs the output of flip-flop circuit 224 and the output level of driver circuit 226 is held by a level holding circuit 228. The output level of level holding circuit 228 is applied to a corresponding memory cell block as a signal l.EQ.

Similarly, flip-flop circuit 234 is activated in response to level holding circuit 208, set in response to the output of an inverter which receives as an input the level of signal RXT transmitted through command data bus 53b, and reset by the output of NOR circuit 232 which receives the level of signal APC transmitted through one-shot pulse generation circuit 214 and command data bus 53b.

Driver circuit 236 receives the output of flip-flop circuit 234 and is activated by hierarchical power supply control signal SCRC. The output level of driver circuit 236 is held by level holding circuit 238, the output level of which is output as signal l.RXT to a corresponding memory cell block.

A flip-flop circuit 244 is set by the output of inverter 240 which receives and is activated based on the output level of level holding circuit 208, and is reset in response to the output of NOR circuit which receives the output signal of one-shot pulse generation circuit 214 and the level of signal AP transmitted through command data bus 53b. Driver circuit 246 receives the output of flip-flop circuit 244 and is activated by hierarchical power supply control signal SCRS. The output level of driver circuit 246 is held by level holding circuit 244, the output level of which is applied to a corresponding memory cell block as a signal l.SE.

Meanwhile, a latch circuit 250 is reset in response to an activation of hierarchical power supply control signal SCRC, activated in response to an activation of one-shot pulse generation circuit 204, and hold an address signal transmitted through address data bus 50c. An output from latch circuit 250 is transmitted to a redundant address decoder (not shown) and applied to a pre-decoder 252 and the pre-decoded result is applied to driver circuit 254 which is activated in response to hierarchical power supply control signal SCRC.

An output from driver circuit 254 is held by level holding circuit 256, the output of which is applied to a corresponding row re-decoder line.

In row pre-decoder 36 shown in FIG. 4, level holding circuits 208, 212 238, and 248, and level holding circuit 256 and a region 201 including a memory cell block is not controlled by the hierarchical power supply control signal, and operates using power supply potential Vcc and ground potential Vss as power supply potential.

Meanwhile, a region 202 in row pre-decoder 36 is controlled by the hierarchical power supply control signal, receives power supply potential Vcc and ground potential Vss for operation during the period in which signal SCRS is in an active state, and operates using, as power supply potential, a potential lower than power supply potential Vcc and a potential higher than ground potential Vss during the period in which hierarchical power supply control signal SCRC is in an inactive state (at an "L" level).

Concept of Hierarchical Power Supply

The concept of a hierarchical power supply used to the circuitry in region 202 in FIG. 4 will be now described.

Figure 5A:
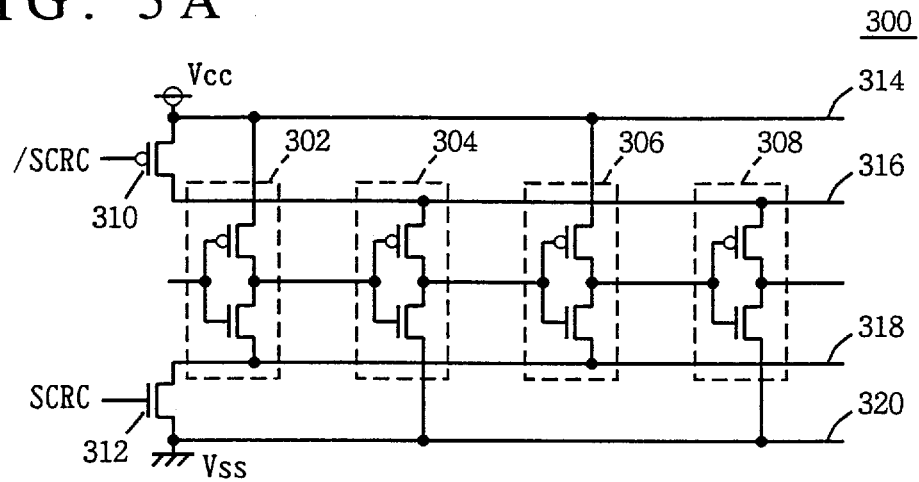
Figure 5B:
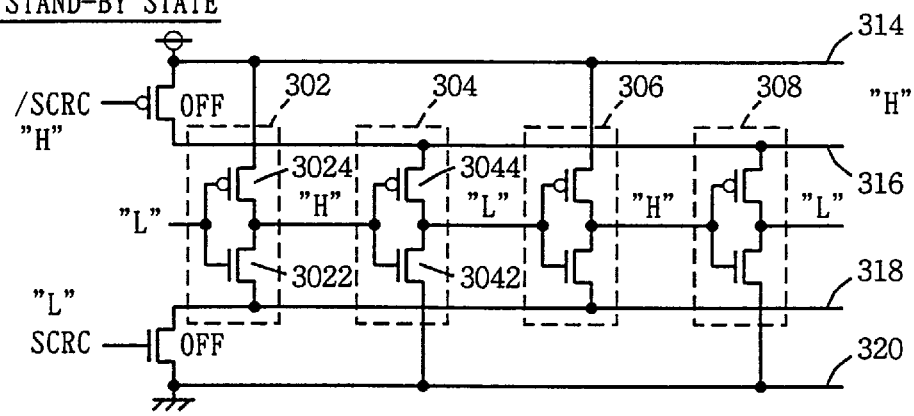
Figure 5C:
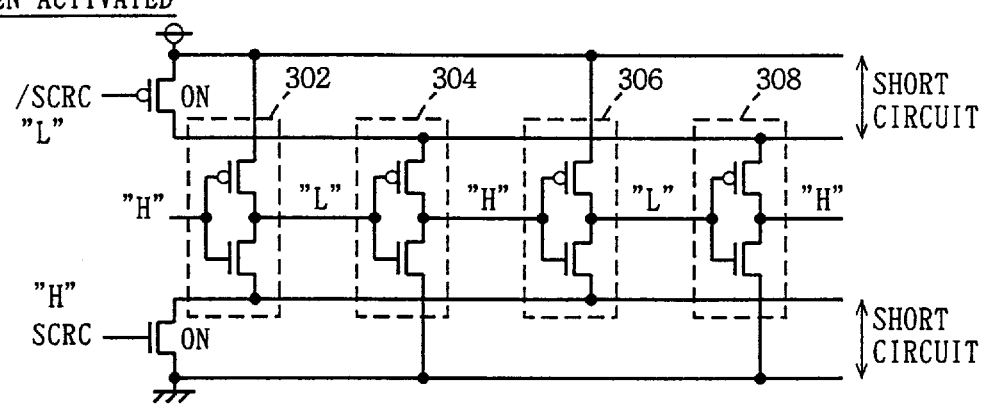

FIG. 5 is a diagram for use in illustration of the circuit configuration of the hierarchical power supply, FIG. 5A is a circuit diagram of the configuration of an inverter train driven by a hierarchical power supply, FIG. 5B a diagram showing the state of the inverter train shown in FIG. 5A in a stand-by state, and FIG. 5C a diagram showing the activated state of the inverter train shown in FIG. 5A.

Referring to FIG. 5A, inverters 302, 304, 306, and 308 are cascade-connected with one another. Interconnection 314 transmits power supply potential Vcc. Interconnection 316 is connected with interconnection 314 through a p-channel MOS transistor 310. P-channel MOS transistor 310 receives at its gate a signal /SCRS, the inverse of hierarchical power supply control signal SCRS.

An interconnection 320 transmits ground potential Vss. Interconnection 318 is connected with interconnection 320 through an n-channel MOS transistor 312. N-channel MOS transistor 312 receives at its gate hierarchical power supply control signal SCRC.

Inverters 302 and 306 are supplied with power supply potential from interconnections 316 and 320, respectively.

Now, referring to FIG. 5B, in the stand-by operation, signal SCRC is at an "L" level, and signal /SCRS is at an "H" level. Thus, n-channel MOS transistors 310 and 312 are both in an off state. As described above, if the threshold voltage is lowered in order to permit a transistor to operate at a high speed at a low power supply voltage, and transistors 310 and 312 and transistors included in inverters 302 to 308 are cut off, not-negligible current leakage is generated.

In FIG. 5B, the input level of inverter 302 is at an "L" level in the stand-by state. Accordingly, the input level of inverter 304 is at an "H" level, the input level of inverter 306 is at an "L" level, and the input level of inverter 308 is at an "H" level.

Although n-channel MOS transistor 312 is in an off state, there still exists some leakage current, the potential level of interconnection 318 is higher than the potential level of interconnection 320, in other words higher than ground potential Vss. Thus, the potential level of the gate of n-channel MOS transistor 322, among the transistors forming inverter 302, is at an "L" level, more specifically, the potential level of the source is higher than potential Vss. Thus, an n-channel MOS transistor 3022 is more intensely turned off, which reduces the leakage current passed through inverter 302.

Similarly, although p-channel MOS transistor 310 is cut off, the leakage current thereof pulls the potential level of interconnection 316 to a lower level than power supply potential Vcc. Thus, a p-channel MOS transistor 3044 is more intensely turned off, which reduces the leakage current passed through inverter 304.

In inverters 306 and 308, the leakage current is similarly reduced. More specifically, by employing the hierarchical power supply system, the power consumption by the train of inverters 302 to 308 is reduced in the stand-by state operations.

Meanwhile, referring to FIG. 5C, signal SCRC is at an "H" level, and signal /SCRS is at an "L" level, while p-channel MOS transistor 310 and n-channel MOS transistor 312 are both turned on.

In response to this, inverters 302 to 308 all operate by power supply potential Vcc and ground potential Vss, regardless of whether the input level of an inverter is at an "H" level or at an "L" level, prescribed current leakage is caused.

In the hierarchical power supply system, as shown in FIG. 5B, if the input level of each of the logic gate circuits (inverters in FIG. 5B) is fixed at a prescribed value, the leakage current can be effectively reduced. Note however that in if the input level of a logic circuit is not determined between the "L" level and "H" level in the stand-by operations, the above reduction scheme does not operate effectively in the logic gate.

When this is considered in view of pre-decoder 36 shown in FIG. 4, among pre-decoder 36, the circuitry in region 202 operates in the hierarchical power supply system, and therefore leakage current caused by the sub threshold current of the MOS transistor can be reduced in a normal stand-by state in which a bank is not activated.

On the other hand, in the circuitry included in region 201 among pre-decoder circuit 36, in other words, level holding circuits 208, 212, 228, 238, 248, and 256, the level held in these circuits change based on the operation state in the stand-by operations, and therefore these circuit do not employ the hierarchical power supply system.

More specifically, in the pre-decoder circuit shown in FIG. 4, since the operation of reading out data from a memory cell is performed during the activated period of the chip, the hierarchical power supply system is employed for the portion of the circuit other than necessary after a sufficient time period for receiving data from the outside, such that the sub threshold voltage is reduced.

Thus, if the hierarchical power supply system is employed for the circuit included in region 202, driver circuits 226, 236, and 246 operating based on the output levels of latch circuits 224, 234, and 244 operate only in the initial period to transfer the command level. After the command level is held by level holding circuits 228 to 248, driver circuits 226 to 246 take a tri-state form, their output levels are in a floating state. More specifically, in the circuits preceding to driver circuits 226 to 246, the operation command output to a corresponding memory cell block (bank) has its level held by level holding circuits 228 to 248, if the sub threshold current is reduced by the hierarchical power supply system.

Herein, in the circuits included in region 202, the MOS transistors forming flip-flop circuits 224, 234, and 244 do not take the hierarchical power supply system and each have a threshold voltage to sufficiently reduce the leakage current (hereinafter referred to as "MVth").

Address data received from address bus 50c is similarly received into latch circuit 250, then subject to a processing to be delivered to a corresponding memory cell block, and is driven for a prescribed period in driver circuit 254. Subsequently, if driver circuit 254 having a tri-state form operates by a potential lower than power supply potential Vcc or a potential higher than ground potential Vss, the output of driver circuit 254 is in a floating state.

The level of a pre-decode signal driven by driver circuit 254 is held by level holding circuit 256. Thus, in the circuits closer to control circuit 20 than to driver circuit 254, if the constituent MOS transistors have their sub threshold currents reset in the decreasing direction by the hierarchical power supply system, the pre-decode address signal output to the memory cell array may have its state held.

Figure 6:
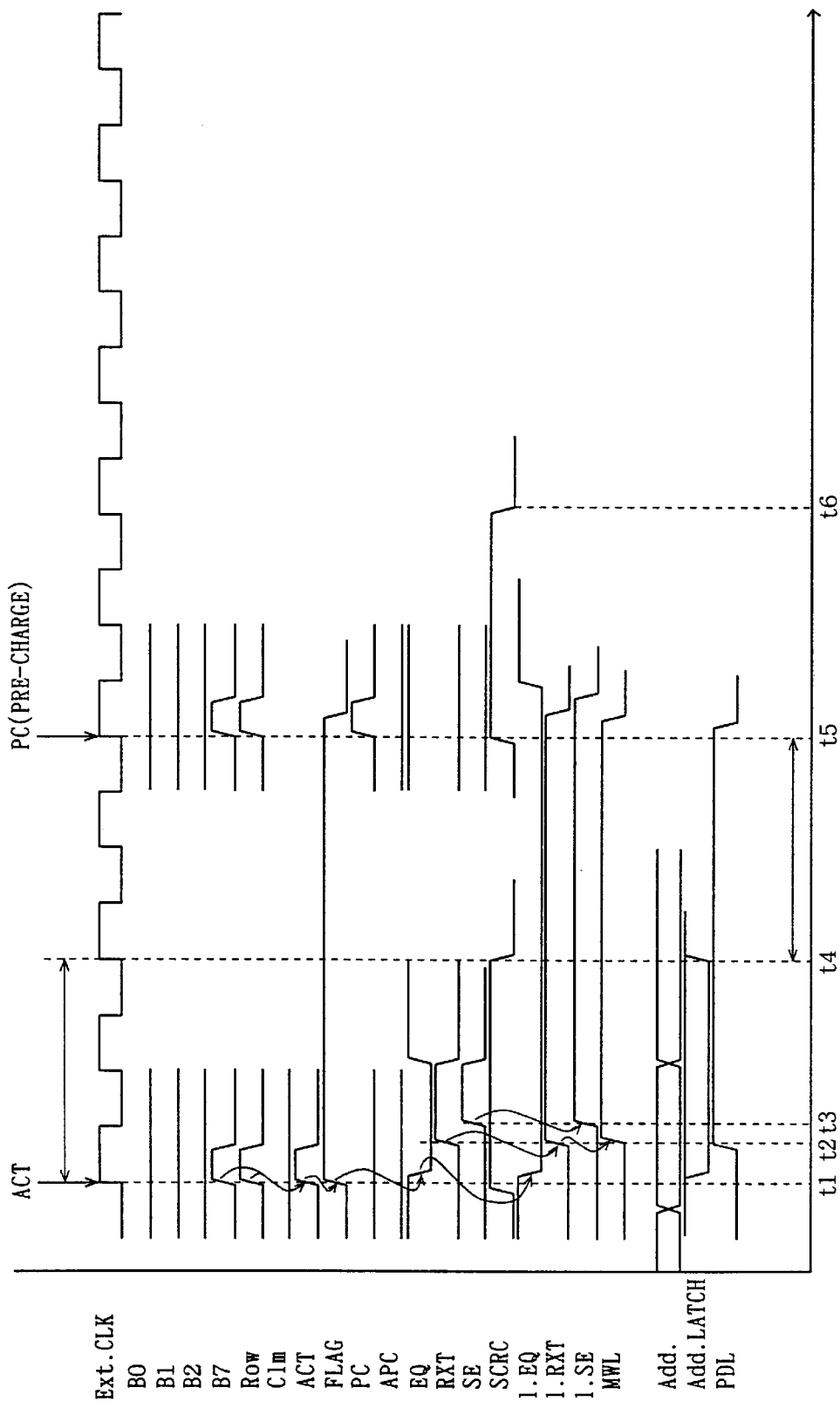
FIG. 6 is a timing chart for use in illustration of the operation of synchronous type semiconductor memory device 1000.

FIG. 6 is a timing chart for use in illustration of the operation of pre-decode circuit 36 shown in FIG. 4.

In FIG. 6, signals B0 to B7 indicate bank addresses, signal Row is a row-related access identification signal to instruct an activation of the row-related circuits, signal Clm is a column-related access identification signal to instruct an activation of the column-related circuits, and signal ACT is a bank activation signal transmitted from control circuit 20.

Furthermore, a flag signal is a signal held by level holding circuit 208 in response to an accessing to a bank (the bank hits), signal PC is transmitted from control circuit 20 to instruct a pre-charging operation of a selected bank, and signal APC is an all bank pre-charging signal transmitted from control circuit 20 to instruct a pre-charging operation of all the banks.

Signal l.EQ is a local bit line equalize signal held by level holding circuit 228, signal l.RXT is a local word line activation signal held by level holding circuit 238, signal l.SE is a local sense amplifier activation signal held by level holding circuit 228, and potential MWL is the potential level of a main word line in a memory cell block (bank).

Signal add. Latch is an address signal held by level holding circuit 256.

The operations will be now described.

At time t1, at a rising edge of external clock signal external control signal Ext.CLK, the bit B7 of the decoded bank address is in an active state, and a corresponding bank is selected. At this time, since signal row is also active, an active one-shot pulse is output from one-shot pulse generation circuit 204 accordingly. In response to this, signal ACT in an active state that has been transmitted by command data bus 53b is driven by driver circuit 206, and the level of the active signal ACT is held as a flag signal by level holding circuit 208.

In response to an activation of the flag signal, latch circuit 224 holds the level of signal EQ transmitted by command data bus 53b.

The level of signal EQ received by latch circuit 224 is driven by driver circuit 226, and held by level holding circuit 228 as an internal equalize signal int.EQ.

Meanwhile, at time t2, signal RXT transmitted by command data bus 53b is activated, and the level of the signal is received into latch circuit 234. In response to this, level holding circuit 238 holds the level of internal word line activation signal int.RXT.

Subsequently, at time t3, the level of signal SE is activated, and the level is received by latch circuit 244.

In response to an activation of internal word line activation signal int.RXT, the potential level of the main word line of a selected row is changed to an active state (at an "H" level).

Meanwhile, an address signal transmitted through address bus 50c is latched by latch circuit 50, pre-decoded by pre-decoder 252, and then driven by driver 254, and the level of a row pre-decoder line PDL is driven into a corresponding level. Based on the level of row pre-decoder line PDL, at time t4, signal SCRC attains an inactive state (at an "L" level).

More specifically, the time period from t1 to t4 is necessary for the operations of the total number of circuits in a single bank.

If signal SCRC is inactivated, the circuits included in region 202 changes into an operation mode in which current leakage is reduced.

On the other hand, internal equalize signal internal clock signal int.EQ, internal word line activation signal internal clock signal int.RXT, and internal sense amplifier activation signal int. CLK.SE output from level holding circuits 228, 238, and 248 maintain their levels.

At time t5, at a rising edge of external clock signal Ext.CLK, bank signal B7 and signal Row are activated, and pre-charge signal PC is activated, so that in response to the level of signal PC input through driver circuit 210, a signal output from one-shot pulse generation circuit 214 drives NOR circuits 222, 232, and 242, and the levels of flip-flop circuits 224, 234, and 244 are reset.

Meanwhile, since the levels of signal SCRC is activated at time t5, signal int. EQ, signal int.RXT, and signal int.SE are reset accordingly. The level held by latch circuit 250 is reset in response to the activation of signal SCRC, and the level of row pre-decoder line PDL is reset as well.

More specifically, during the period from time t4 to t5, the circuits included in region 202 are reset to reduce the leakage current, while the levels of signal int. EQ, signal int.RXT, and signal int.SE, and row pre-decoder line PDL are all maintained.

In the above-described configuration, an address data bus is commonly provided to banks operating independently from one another, so that the area occupied by the address bus may be reduced.

Furthermore, after a prescribed period (from t1 to t4) for receiving a command signal and an address signal to a selected and activated bank is over, in the circuits included in region 202, the hierarchical power supply system can reduce not only the leakage current in the stand-by state, but also the leakage current during the period in which the bank is in an active state.

Second Embodiment

In row pre-decoder circuit 36 shown in FIG. 4, the transistors forming flip-flop circuits 224, 234 and 244 have their threshold voltages at the level of MVth in order to restrict the current leakage therein at a sufficiently small level.

In flip-flop circuits 224, 234 and 244, the power consumption may be reduced by employing a hierarchical current configuration during the period from time t4 to t5 in FIG. 6 in the stand-by and active periods.

Figure 7:
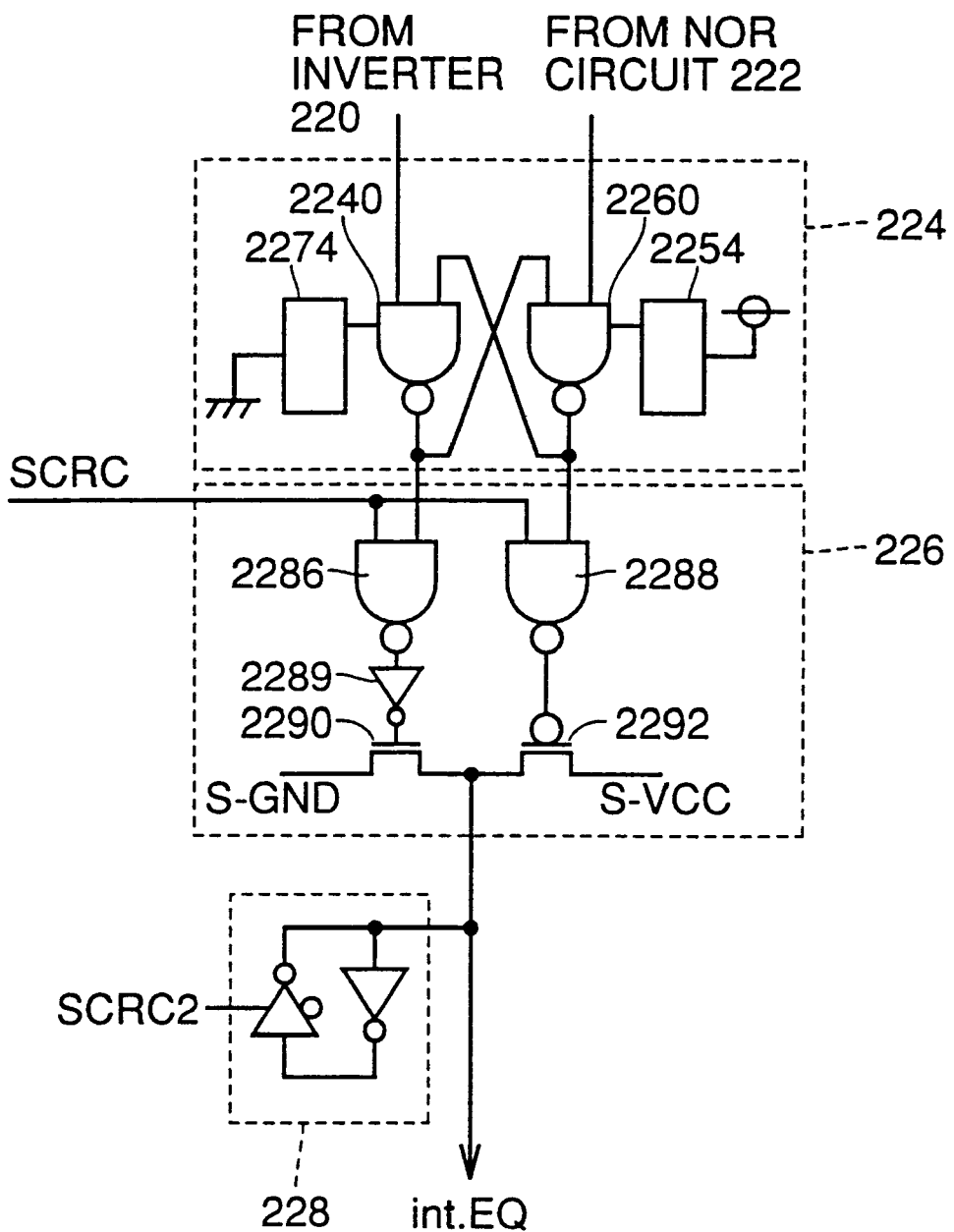
FIG. 7 is a schematic block diagram showing in detail the configuration of a flip-flop circuit 224 according to a second embodiment of the invention.

FIG. 7 is a schematic block diagram of the configuration of flip-flop circuit 224, driver circuit 226, and level holding circuit 228 when such a hierarchical current configuration is employed.

The circuit configuration other than flip-flop circuit 224 according to the second embodiment is the same as that of synchronous semiconductor memory device 1000 according to the first embodiment, and therefore the configuration of flip-flop circuit 224 will be mainly described.

Referring to FIG. 7, flip-flop circuit 224 includes NAND circuits 2240 and 2260 cross-coupled with each other, a switching circuit 2274 to switch the supply state of the ground potential to the cross-coupled NAND circuits 2240 and 2260, and a switching circuit 2254 to switch the supply state of power supply potential Vcc to NAND circuits 2240 and 2260.

More specifically, switch circuits 2254 and 2274 form a hierarchical power supply system.

Driver 226 includes a NAND circuit 2286 which receives signal SCRC at its one input node and one of the output signals of flip-flop circuit 224 at its other input node, a NAND circuit 2288 which receives signal SCRC at its one input node and the other output of flip-flop circuit 224 at its other input node, an inverter 2289 which receives the output of NAND circuit 2286, an n-channel MOS transistor 2290 having its gate potential controlled by the output of inverter 2289 and receiving a hierarchical power supply potential S-Vcc at its source, and a p-channel MOS transistor 2292 which receives the output of NAND circuit 2288 at its gate, and a hierarchical power supply potential S-Vcc at its source.

Level holding circuit 228 is a latch circuit activated by a signal SCRC 2. Signal SCRC2 is activated simultaneously with signal SCRC, and is inactivated simultaneously with the inactivation of signal SCRC at time t6 in FIG. 6.

FIG. 8 is a block diagram for use in illustration in detail the configuration of flip-flop circuit 224 in FIG. 7.

Switch circuit 2254 includes p-channel MOS transistors 2244 and 2246 connected parallel to each other between a power supply potential Vcc and the power supply node of NAND circuit 2240, and p-channel MOS transistors 2264 and 2266 connected in parallel to each other between power supply potential Vcc and the power supply node of NAND circuit 2260. A switch circuit 2274 includes n-channel MOS transistors 2248 and 2250 connected in parallel to each other between the ground power supply potential node of NAND circuit 2240 and ground potential Vss, and n-channel MOS transistors 2268 and 2270 connected in parallel to each other between the ground power supply potential node of NAND circuit 2260 and ground potential Vss.

The gates of n-channel MOS transistors 2250 and 2270 receive signal SCRC, and the gates of p-channel MOS transistors 2246 and 2260 receive signal /SCRC.

One input node of NAND circuit 2240 receives an output from inverter 220. The other input node of inverter 2240, the gate of n-channel MOS transistor 2268 and the gate of p-channel MOS transistor 2264 are connected to the output node of NAND circuit 2240.

Flip-flop circuit 224 further includes a NAND circuit 2280 receiving a signal POR which is reset (attains an "L" level) for a prescribed period after the power supply is turned on, and an output from a NOR circuit 222, and an inverter 2282 to invert and output an output received from NAND circuit 2280. The output of the inverter 2282 is input to the other input of NAND circuit 2260.

A p-channel MOS transistor 2272 is connected between the output node of NAND circuit 2260 and power supply potential Vcc, and the output gate of p-channel MOS transistor 2272 receives signal POR. Meanwhile, an n-channel MOS transistor 2252 is provided between the output node of NAND circuit 2240 and ground potential Vss, and the output gate of n-channel MOS transistor 2252 receives the output of inverter 2284 which receives and inverts signal POR for output.

More specifically, the output level of NAND circuit 2240 is reset to an "L" level at the activation of signal POR, the potential levels at the output node of NAND circuit 2260 is reset to an "L" level or "H" level at the activation of signal POR.

Thus, as shown in FIG. 8, if signal SCRC is in an active state, NAND circuits 2240 and 2260 receive power supply potential Vcc and ground potential Vss to operate, and during the period in which signal SCRC is inactivated, self-biasing is effected in order to reduce the leakage current.

Thus, as is the case with first embodiment, the power consumption may be reduced during the period in which a selected bank is in an active state.

Third Embodiment

Figure 9:
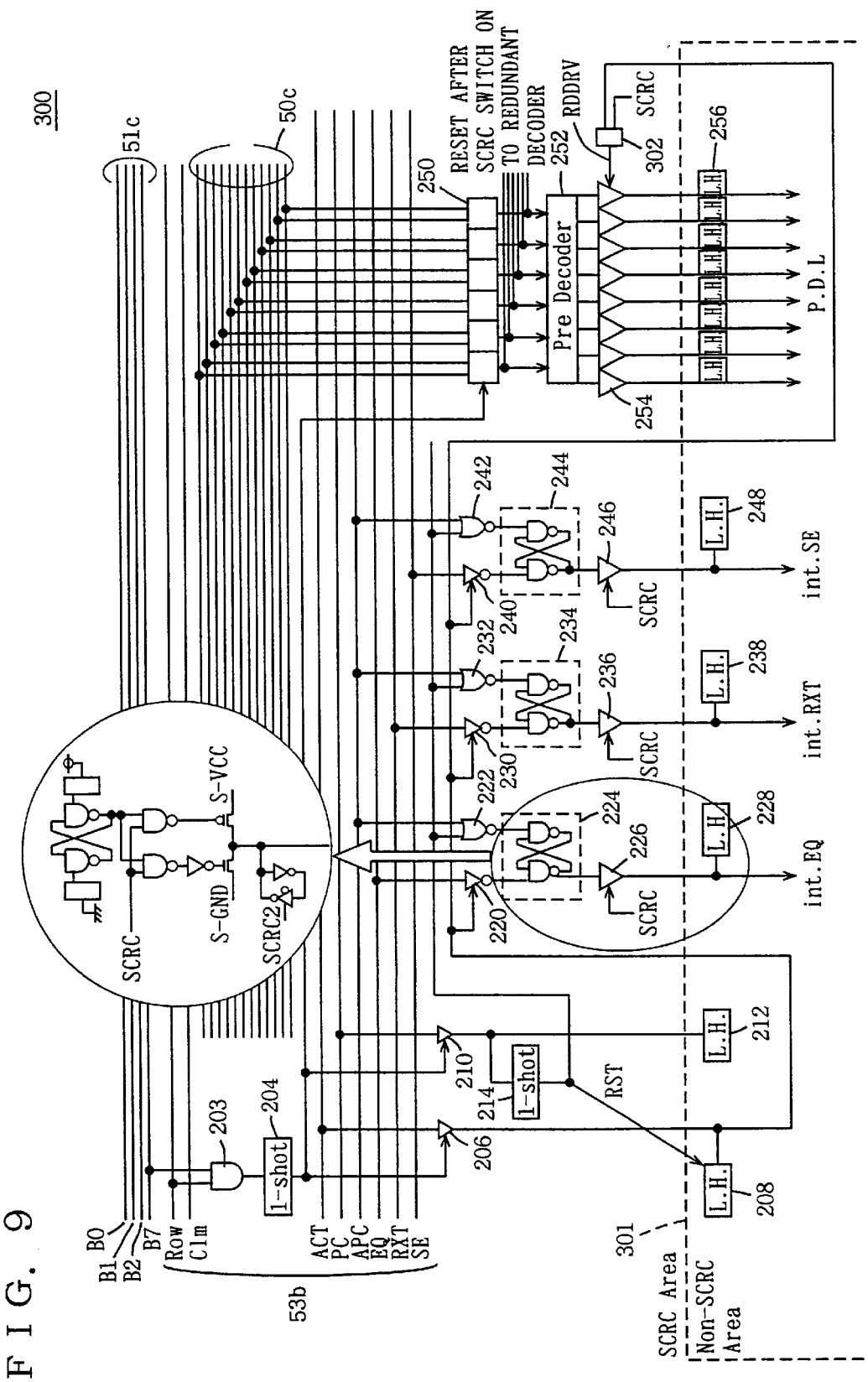
FIG. 9 is a schematic block diagram showing the configuration of a row pre-decoder 300 according to a third embodiment of the invention.

FIG. 9 is a schematic block diagram of the configuration of a row pre-decoder circuit 300 according to a third embodiment of the invention.

The third embodiment is different from the pre-decoder circuit according to the second embodiment in that driver circuit 254 is not activated by signal SCRC, but by a driver control circuit 302 controlled by the value of the flag held by level holding circuit 208 and signal SCRC.

Driver circuit 302, when inactivated after once activated, maintains driver circuit in an inactive state if signal SCRC attains an active state again during the active period of signal ACT.

More specifically, by controlling driver circuit 254 using driver control circuit 302, if a row address is received by level holding circuit 256 and then an operation is performed to activate signal SCRC again, the operation of preventing driver 254 from being activated, and thus preventing pre-decode address signals held by level holding circuit 256 from being reset is performed.

More specifically, after driver circuit 254 is inactivated after once activated, as latch circuit 250 and pre-decoder 252, in other words, the circuits to receive an address signal has been reset, the pre-decode address signal held by level holding circuit 256 is prevented from being reset in response to the re-activation of driver circuit 254.

The other features are the same as those of the row pre-decoder circuit according to the first embodiment, the same portions are denoted with the same reference characters and the description thereof is not repeated.

Figure 10:
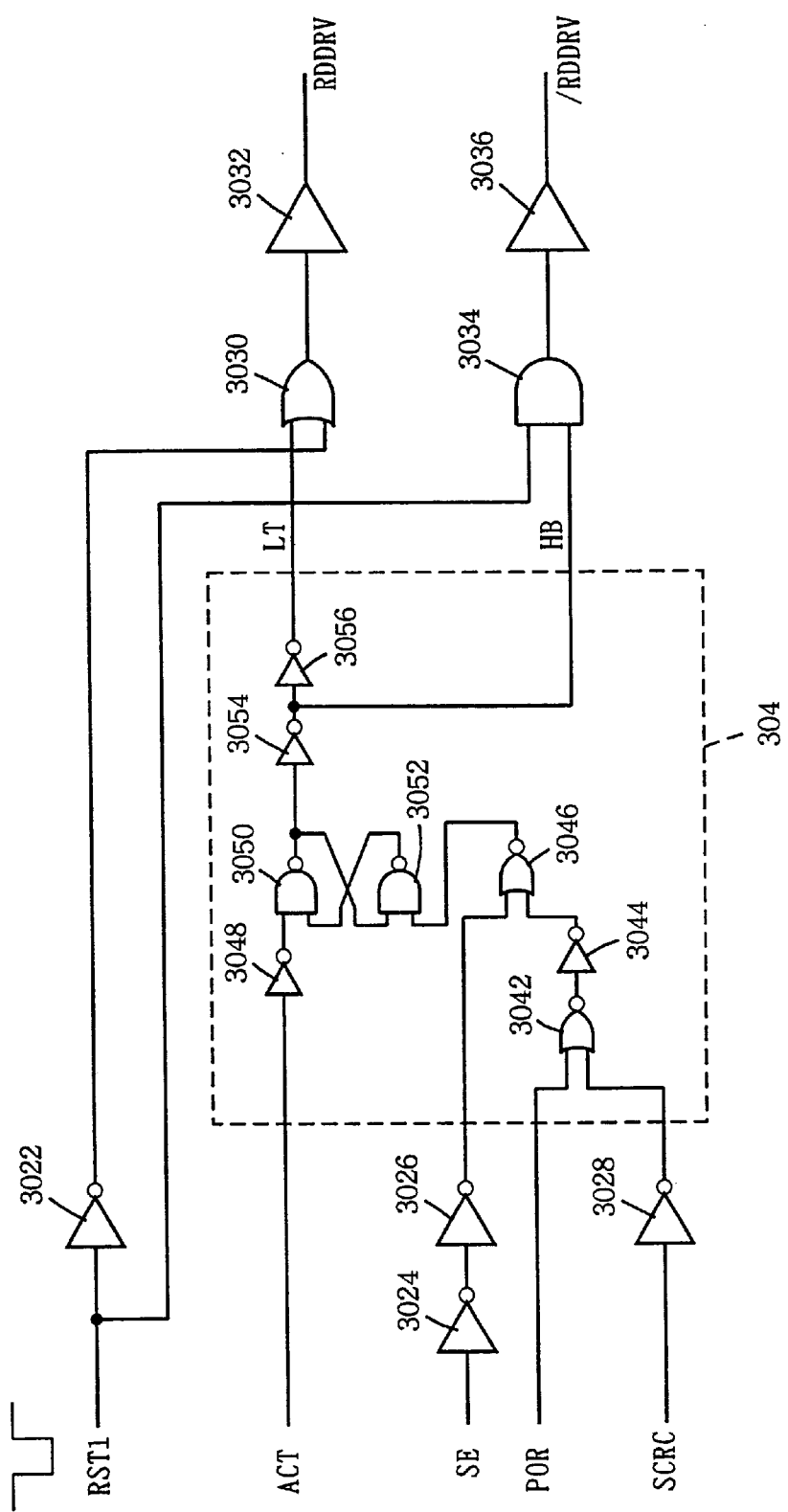
FIG. 10 is a schematic block diagram of the configuration of a driver control circuit 2

FIG. 10 is a schematic block diagram of the configuration of driver control circuit 302 shown in FIG. 9.

Driver circuit 302 includes an inverter 3022 which receives a signal RST 1 attaining an "L" level for a prescribed period in response to a pulse signal RST output from the one-shot pulse generating circuit 214 when pre-charge signal PC is activated, and the level of a flag output from level holding circuit 208 is reset, an inverter 3024 which receives and inverts signal SE, an inverter 3026 which receives and inverts the output of inverter 3024, an inverter 3028 which receives and inverts the level of signal SCRC, a flip-flop circuit 304 which receives signal ACT, the output of inverter 3026, signal POR, and an output from inverter 3028 and controls the levels of output signals LT and HT, an OR circuit 3030 which receives the output of inverter 3022 and signal LT, an AND circuit 3034 which receives signals ST and HB, a buffer circuit 3032 which processes an output received from OR circuit 3030, and outputs a driver driving signal RDDRV, and a buffer circuit 3036 which receives the output of AND circuit 3034 and outputs the inverse of signal RDDRV.

Flip-flop circuit 304 includes an SR flip-flop circuit formed by NAND circuits 3050 and 3052 cross-coupled with each other. The level of the SR flip-flop circuit is set based on the output of inverter 3048 receiving signal ACT. Flip-flop circuit 304 further includes a NOR circuit 3042 which receives signal POR and the output of inverter 3028, an inverter 3044 which receives the output of NOR circuit 3042, and a NOR circuit 3046 which receives the outputs of inverters 3026 and 3044. Based on the output of NOR circuit 3046, the level of SR flip-flop circuit is reset.

Thus, during the period in which the level of signal RDDRV is maintained after the signal is activated, if signal SCRC is inactivated and reset, and then signal SCRC is once again activated, signal RDDRV will not be activated.

Figure 11:
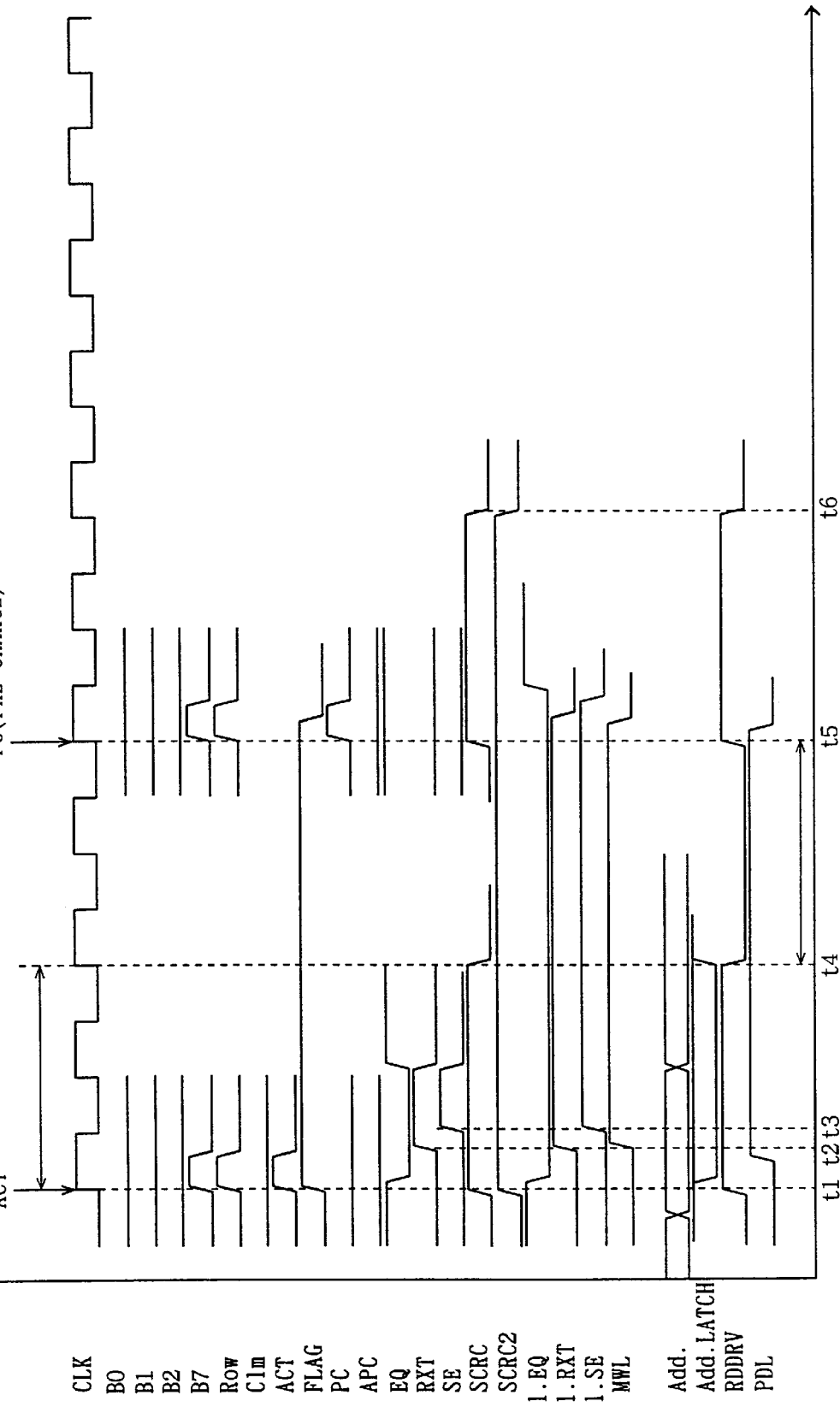
FIG. 11 is a first timing chart for use in illustration of the operation of pre-decoder 300 according to the third embodiment of the invention.

FIG. 11 is a timing chart for use in illustration of the operation of row pre-decoder circuit 300 shown in FIG. 9.

In FIG. 11, a signal SCRC2 is generated by control circuit 20, and resets level holding circuits 228, 238, 248 and the like, while signal RDDRV controls the operation of driver circuit 254.

At time t1, in response to bank address signal B7 and signal Row being activated, the level of signal ACT being activated is received by level holding circuit 208 from command data bus 53b, and the level of the flag output from level holding circuit 208 changes into an "H" level.

In response to this, driver control signal RDDRV output from driver 302 attains an active state ("H" level).

Signals SCRC and SCRC2 also attain an active state.

The following operations are the same as those of row pre-decoder 36 shown in FIG. 6, except that signal RDDRV is inactivated at time t4, and the description is not repeated.

Figure 12:
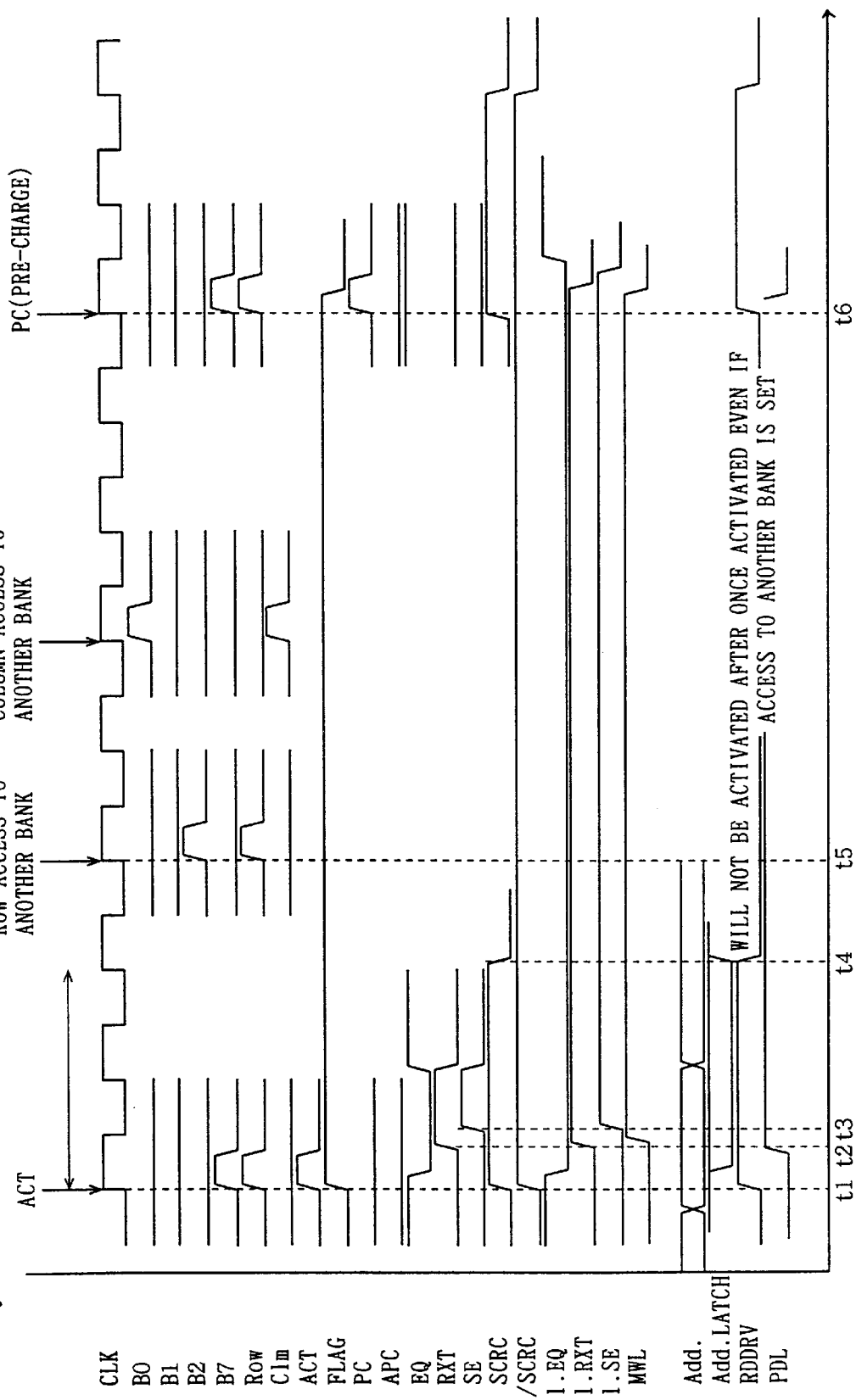
FIG. 12 is a second timing chart for use in illustration of the operation of the synchronous type semiconductor memory device according to the third embodiment of the invention.

FIG. 12 is a timing chart for use in illustration of the operation when a plurality of different banks are serially accessed, in the configuration of row pre-decoder shown in FIG. 9.

As is the case with FIG. 11, at time t1, in response to bank address signal B7 and signal Row both being in an inactive state, the level of signal ACT being activated is received by level holding circuit 208 from command data bus 53b.

Thereafter, the bank operation to bank address B7 will proceed similarly to the case of FIG. 11.

Subsequently, at time t5, bank address B2 and signal Row are activated, and a bank different from the bank accessed at time t1 is row-accessed. At this time, signal RDDRV after activated and then inactivated will not be activated if an accessing to another bank is set, and the level of the row pre-decoder line in the bank selected at time t1 maintains its original level.

In the following description, flip-flop circuits 224, 234, and 244 are driven in a hierarchical power supply configuration controlled by signal SCRC as is the case with the second embodiment, but a MOS transistor-based configuration in which the threshold value is set at the level of MVth so as to reduce leakage current may be employed.

Once a row address is received by a corresponding bank, the level of row pre-decoder line PDL may be maintained at a prescribed level, so that the thus received row pre-decode signal is prevented from being reset.

Fourth Embodiment

Figure 13:
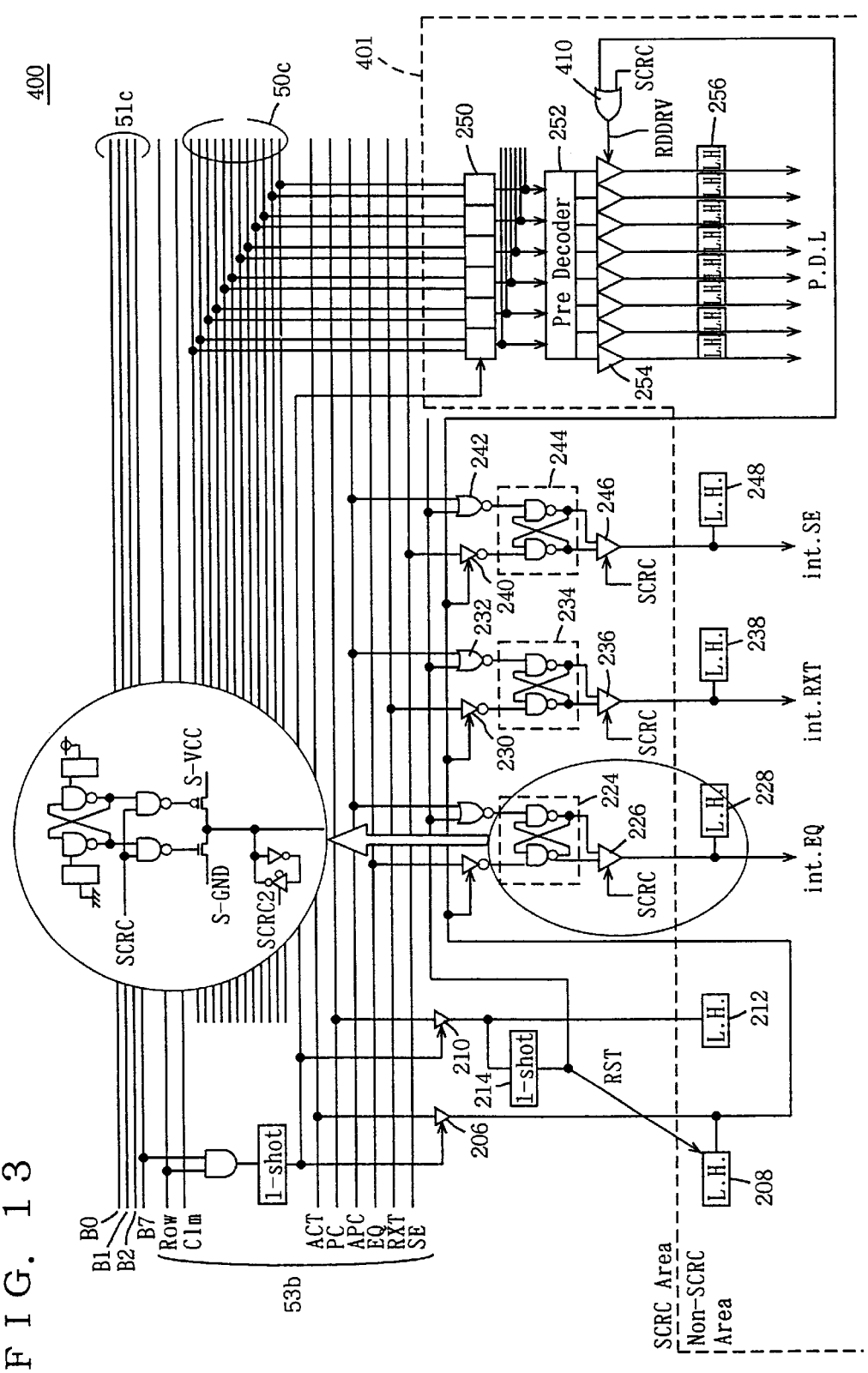
FIG. 13 is a schematic block diagram showing the configuration of a row pre-decoder 400 according to a fourth embodiment of the invention.

FIG. 13 is a schematic block diagram of the configuration of a row pre-decoder circuit 400 according to a fourth embodiment of the invention.

The fourth embodiment is different from the configuration of pre-decode circuit 300 shown in FIG. 9 in the following points.

More specifically, in row pre-decoder circuit 400 according to the fourth embodiment, latch circuit 250, pre-decoder circuit 252, driver circuit 254, and level holding circuit 256 for a row address signal do not take a hierarchical power supply configuration, and the operation is based on power supply Vcc and ground potential Vss, if signal SCRC is inactivated.

Driver circuit 254 is activated from an output signal from an OR circuit 410 which receives signal SCRC and a flag signal output from level holding circuit 208.

The other features are the same as those of row pre-decoder circuit 300 shown in FIG. 9, the same portions are denoted with the same reference characters and the description will not be repeated.

Figure 14:
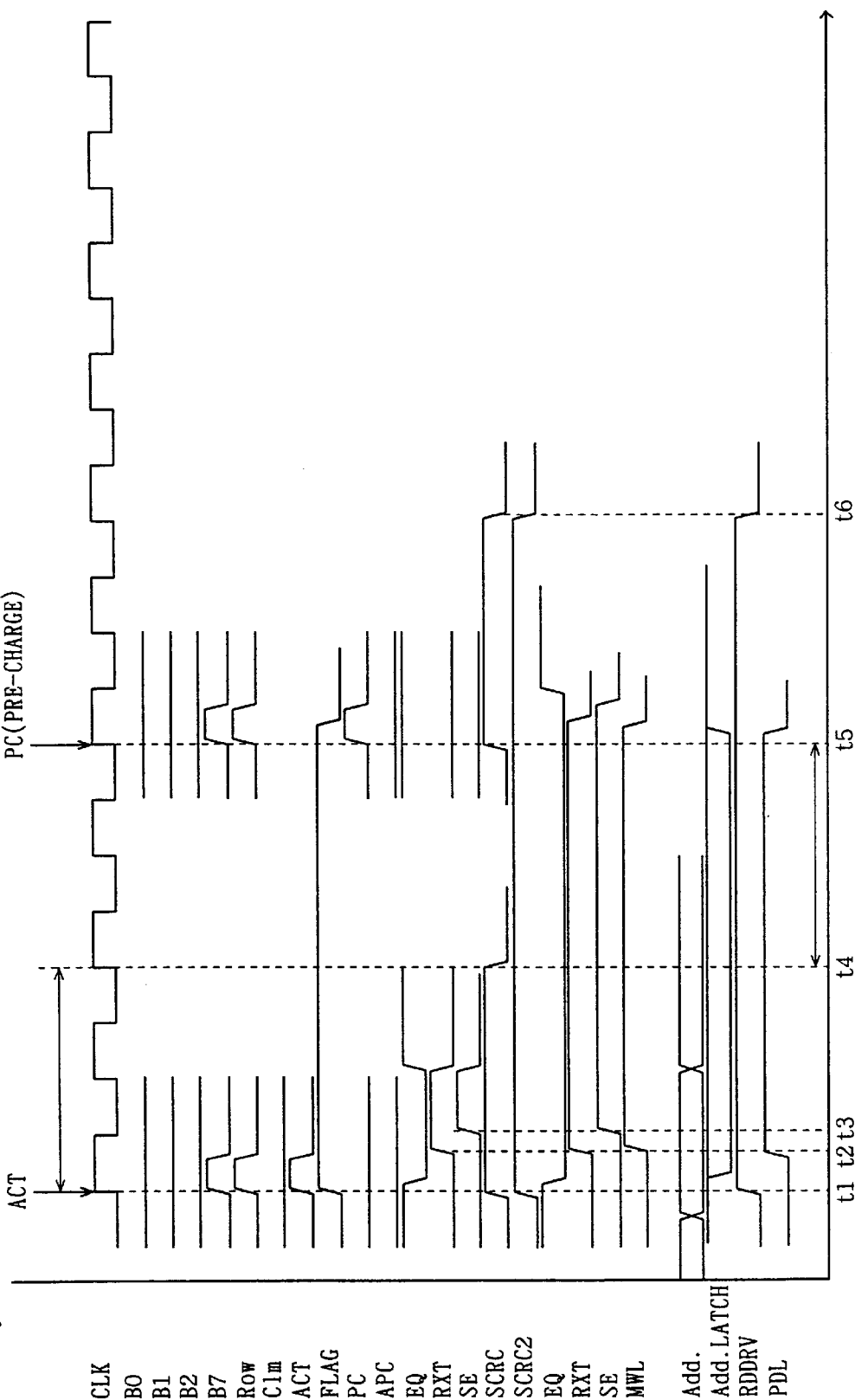
FIG. 14 is a timing chart for use in illustration of the operation of row pre-decoder 40o shown in FIG. 13.

FIG. 14 is a timing chart for use in illustration of the operation of row pre-decoder circuit 400 shown in FIG. 13.

At time t1, in response to bank address signal B7 and signal Row being activated, the level of signal ACT being activated is received by level holding circuit 208 from command data bus 53b, and the level of the flag output from level holding circuit 208 changes into the "H" level.

In response to this, driver control signal RDDRV output from driver control circuit 302 attains an active state ("H" level).

Signals SCRC and SCRC2 also attain an active state.

The following operations are the same as those of row pre-decoder 300 shown in FIG. 6, except that signals RDDRV, SCRC and SCRC2 all attain an inactive state at time t6, and therefore, the description is not repeated.

Figure 15:
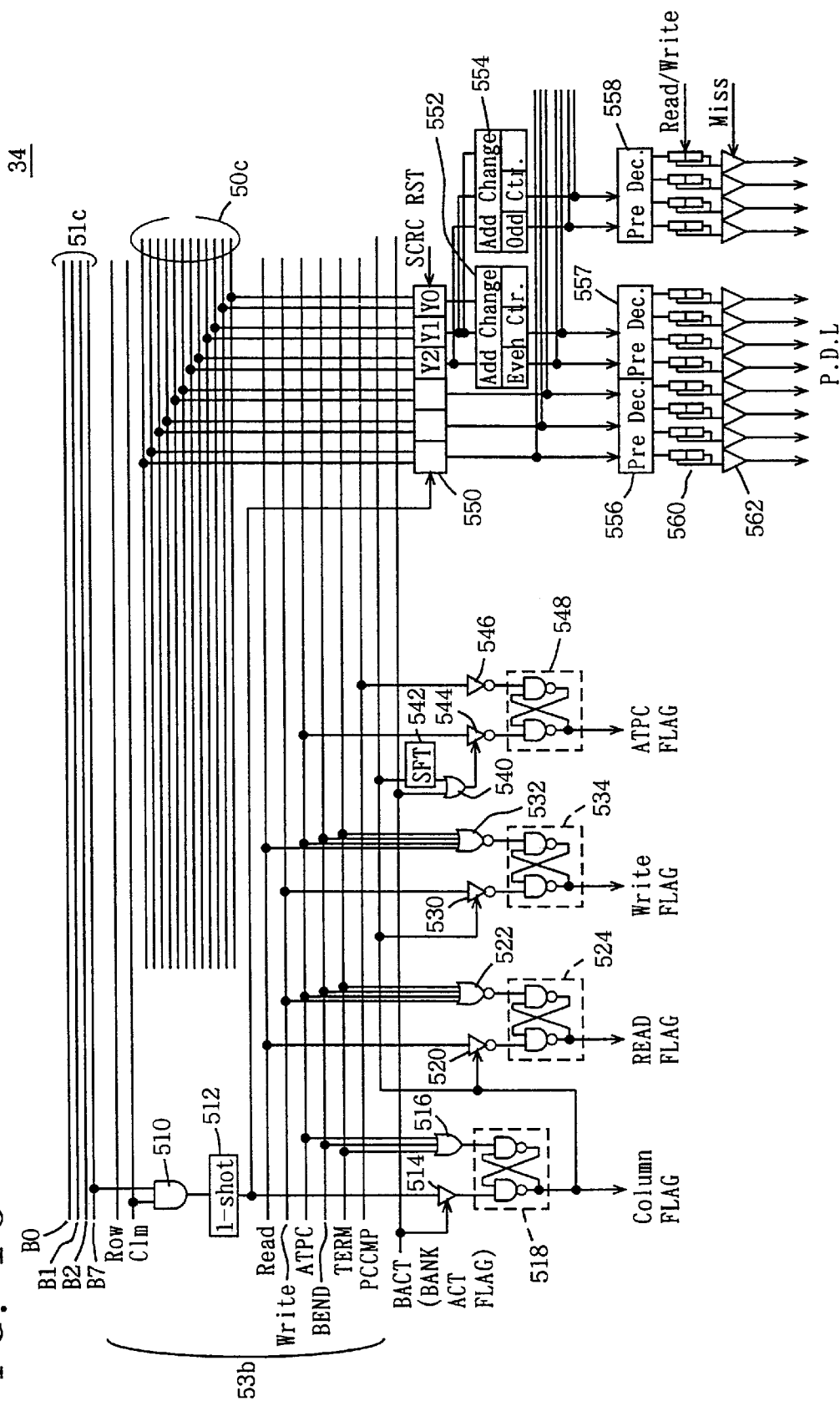
FIG. 15 is a schematic block diagram showing the configuration of a column pre-decoder 34.

FIG. 15 is a schematic block diagram of the configuration of a column pre-decoder 34.

Referring to FIG. 15, control circuit 20 transmits a reading-based access identification signal READ for instructing a reading operation, a writing-based access identification signal WRITE, an auto pre-charging identification signal ATPC for instructing an auto pre-charging operation, a burst end identification signal BEND for instructing a termination of a burst operation for each of the banks, a termination identification signal TERM for instructing a forcible termination of a column selecting operation when another bank is selected during the column selecting operation, and a pre-charging operation identification signal PCCM for instructing a termination of a pre-charging operation.

Signal BACT is a flag signal held by level holding circuit 208 as a bank is selected as described in conjunction with FIG. 13.

Column pre-decoder circuit 34 includes an AND circuit 510 which receives bank address signal B7 corresponding to a signal Clm transmitted from command data bus 53b, a one-shot pulse generation circuit 512 for outputting a one-shot pulse in response to an activation of the output of AND circuit 510, a drive circuit 514 activated in response to an activation of flag signal BACT for driving the output of one-shot pulse generation circuit 512, an OR circuit 516 which receives signals ATPC, BEND and TERM, a flip-flop circuit 518 set by the output of drive circuit 514 and reset by the output of OR circuit 516 for outputting a column flag signal Col.FLAG indicating an activation of a column-related operation.

Column pre-decoder 34 further includes an inverter circuit 520 activated in response to an activation of column flag signal Col.FLAG for driving signal READ transmitted by command data bus 53b, an OR circuit 522 which receives signals WIRTE, ATPC, BEND, and TERM, a flip-flop circuit 534 set by the output of inverter circuit 520 and reset by the output of OR circuit 522 for outputting a write flag signal READ.FLAG indicating an activation of a reading operation.

Column pre-decoder circuit 34 further includes an inverter circuit 530 activated in response to an activation of column flag signal Col.FLAG for driving signal WRITE transmitted by command data bus 53b, an OR circuit 532 which receives signals READ, ATPC, BEND and TERM, and a flip-flop circuit 534 set by the output of OR circuit 530 and reset by the output of OR circuit 532 for outputting a write flag signal WRITE.FLAG indicating an activation of a writing operation.

Column pre-decoder 34 further includes a shift circuit 542 which receives and delays column flag signal Col.FLAG, an OR circuit 540 which receives flag BACT and the output of shift circuit 542, an inverter circuit 544 activated in response to an activation of the output of OR circuit 540 for driving signal ATPC transmitted by command data bus 53b, an inverter circuit 546 which receives signal PCCMP transmitted by command data bus 53b, and a flip-flop circuit 548 set by the output of inverter circuit 544 and reset by the output of inverter 546 for outputting an auto pre-charging flag signal ATPC.FLAG indicating an activation of an auto pre-charging operation.

Column pre-decoder 34 further includes a latch circuit 550 activated in response to an output signal from one-shot pulse generation circuit 512 for receiving a column signal transmitted by address bus 50c. Latch circuit 550 is reset in response to an activation of signal SCRC.

Column pre-decoder 34 further includes an even-bit adjusting circuit 552 and an odd-bit adjusting circuit 554 for adjusting the less significant bits of an address signal corresponding to a column selecting line (not shown) to activate, based on the less significant bits of a column address held by latch circuit 550, a pre-decoder 556 for pre-decoding more significant bit data from latch circuit 550, a pre-decoder 557 for pre-decoding less significant bit data from even-bit adjusting circuit 552, a pre-decoder 558 for pre-decoding less significant bit data from odd-bit adjusting circuit 554, a shift circuit 560 activated by signal READ or WRITE for delaying pre-decode signals from pre-decoders 556, 557, and 558 by a prescribed number of clocks (e.g. 2 docks) for output, and a drive circuit 562 activated in response to a signal Miss indicating that an address from a redundant decoder (not shown) does not correspond to a defect address and receiving an output from shift circuit 560 for driving the level of a column pre-decode line based on the output signal of shift circuit 560.

Figure 16:
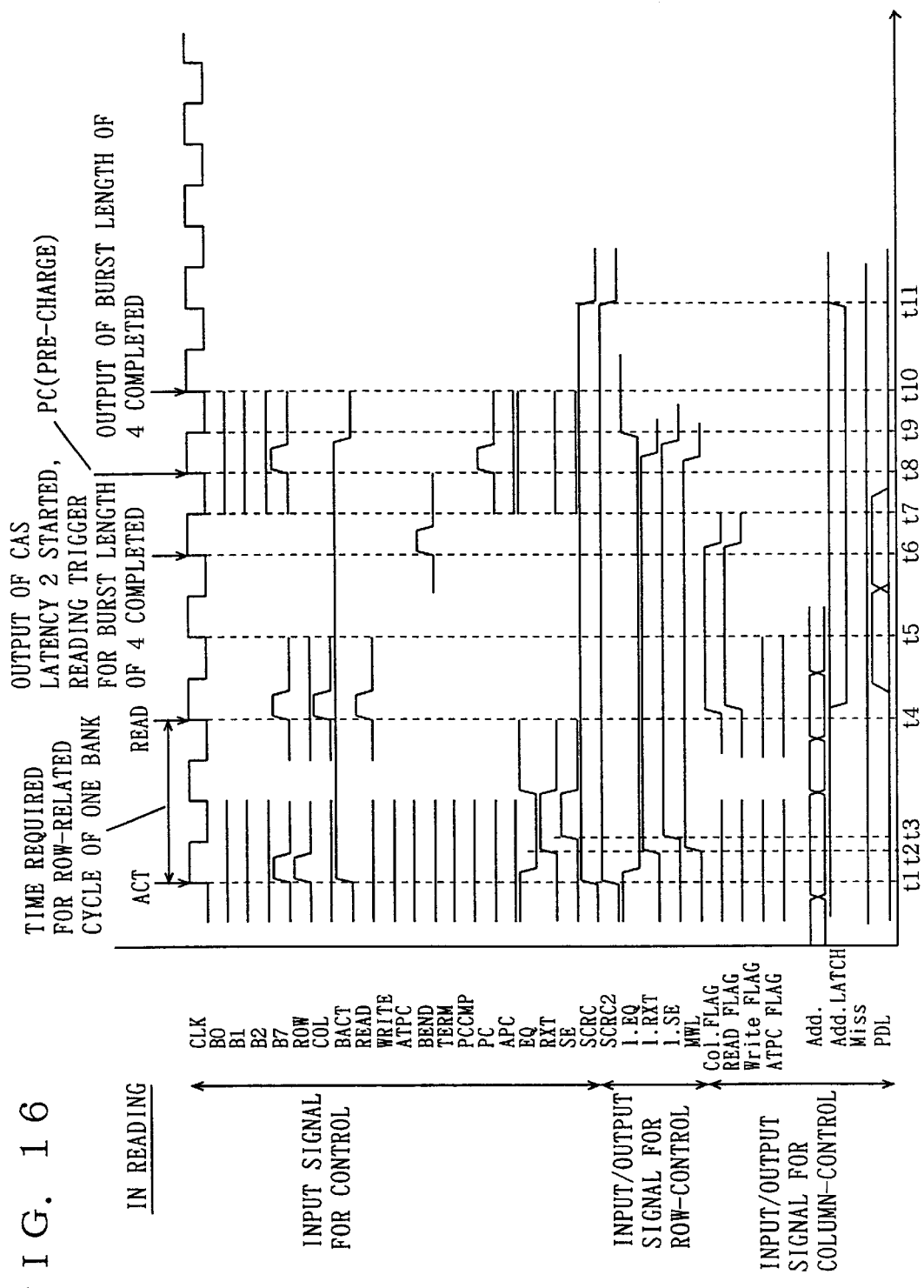
FIG. 16 is a timing chart for use in illustration of the operations of row pre-decoder 400 and column pre-decoder 34 in a reading operation.

FIG. 16 is a timing chart for use in illustration of the reading operation of row pre-decoder circuit 400 and column pre-decoder 34 shown in FIGS. 13 and 15.

Referring to FIG. 16, at time t1, a selected bank is activated, and in response to an inactivation of equalize signal EQ, local equalize signal l.EQ is also inactivated, and the equalized state of a bit line pair or the like in the selected bank is cancelled. Meanwhile, signals SCRC and SCRC2 are activated.

At time t2, word line activation signal RXT is activated, a selecting operation of a word line is performed based on a row address signal, at time t3, local sense amplifier activation signal l.SE is also activated in response to an activation of sense amplifier activation signal SE, and data from a plurality of selected memory cells is amplified as a corresponding bit line potential.

At time t4, when signal READ is activated to designate a reading operation, flag signals Col.FLAG and READ.FLAG are activated. Meanwhile, a column address signal is received by the selected bank, and at time t5 and t6, data from the selected memory cell is read out from the bank and held. At time t6, signal BEND is activated in response to a completion of the reading of data for a burst length of 4.

At time t6 and t7, external dock signal Ext.CLK rises and falls, in response to which the data read out from the bank at time t5 and held is subjected to parallel/serial conversion and externally output.

At time t8 and t9, external clock signal Ext.CLK rises and falls, in response to which the data read out from the bank at time t6 and held is subjected to parallel/serial conversion and externally output.

Meanwhile, at time t8, a selected bank is pre-charged in response to an activation of signal PC.

At time t10, output of data for the burst length of 4 completes.

At time t11, signal SCRC is inactivated, and the part other than region 401 changes to an operation mode based on a hierarchical power supply and with reduced current leakage.

Figure 17:
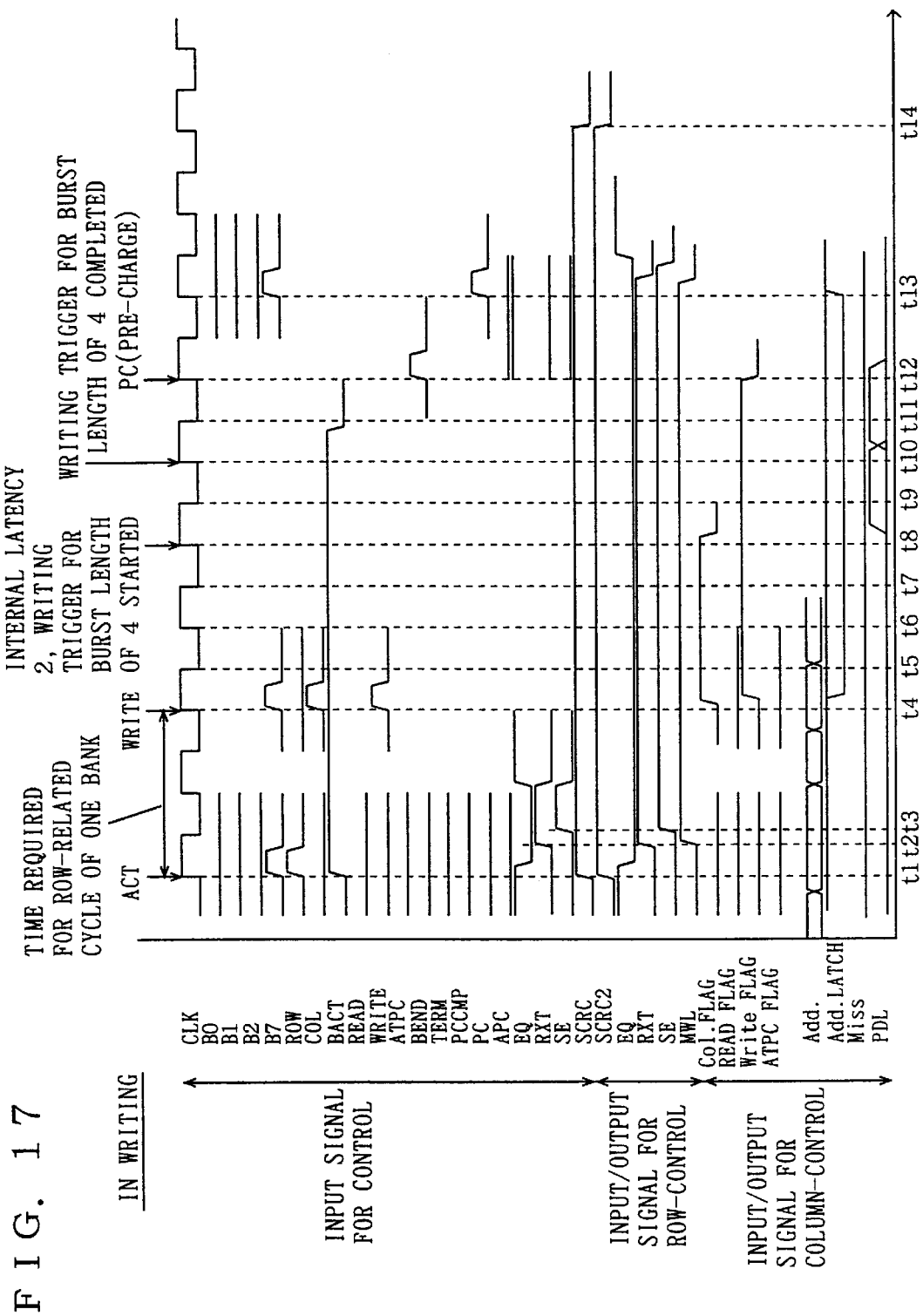
FIG. 17 is a timing chart for use in illustration of the operations of row pre-decoder 400 and column pre-decoder 34 in a writing operation.

FIG. 17 is a timing chart for use in illustration of the writing operation of row pre-decoder circuit 400 and column pre-decoder circuit 34 shown in FIGS. 13 and 15.

Referring to FIG. 17, at time t1, a selected bank is activated, and local equalize signal l.EQ is inactivated in response to an inactivation of equalize signal EQ, and the equalized state of a bit line pair or the like in the selected bank is cancelled.

At time t2, word line activation signal RXT is activated, a selecting operation to a word line is performed in response to a row address signal, and at time t3, local sense amplifier signal l.SE is activated in response to an activation of sense amplifier activation signal SE, so that data from a plurality of selected memory cells is amplified as a corresponding bit line potential.

At time t4, when signal WRITE is activated and a reading operation is designated, flag signals Col.FLAG and WRITE.FLAG are activated. Meanwhile, a column address signal is received by the selected bank, and writing data is received from the outside and held at time t5 and t6.

Subsequently, at time t7 and t8, writing data is received from the outside and held.

When time corresponding to internal latency 2 (two cycles of clocks) defined by shift circuit 560 passes, at time t8, a writing operation to a memory cell is started.

At time t9 and t10, external clock signal Ext.CLK rises and falls, in response to which the data written from the outside and held at time t5 and t6 is written into the selected memory cell.

At time t11 and t12, external clock signal Ext.CLK rises and falls, in response to which the data written from the outside and held at time t7 and t8 is written into the selected memory cell.

At time 12, data writing for the burst length of 4 completes.

Meanwhile, at time t13, a selected bank is pre-charged in response to an activation of signal PC.

At time t11, signal SCRC is inactivated, and the part other than region 401 changes to an operation mode based on a hierarchical power supply and with reduced current leakage.

Thus, the area occupied by the control-related circuits in the chip area may be reduced, while the power consumption in the stand-by operation and active operation may be reduced as well.

Note that the configuration and operation of column pre-decoder 34 as described above is basically the same among the first to third embodiments.

Fifth Embodiment

In the first to fourth embodiments, a memory cell block corresponding to each bank is as shown in FIG. 1.

However, an array form having a matrix of rows and columns may be employed for the bank configuration.

Figure 18:
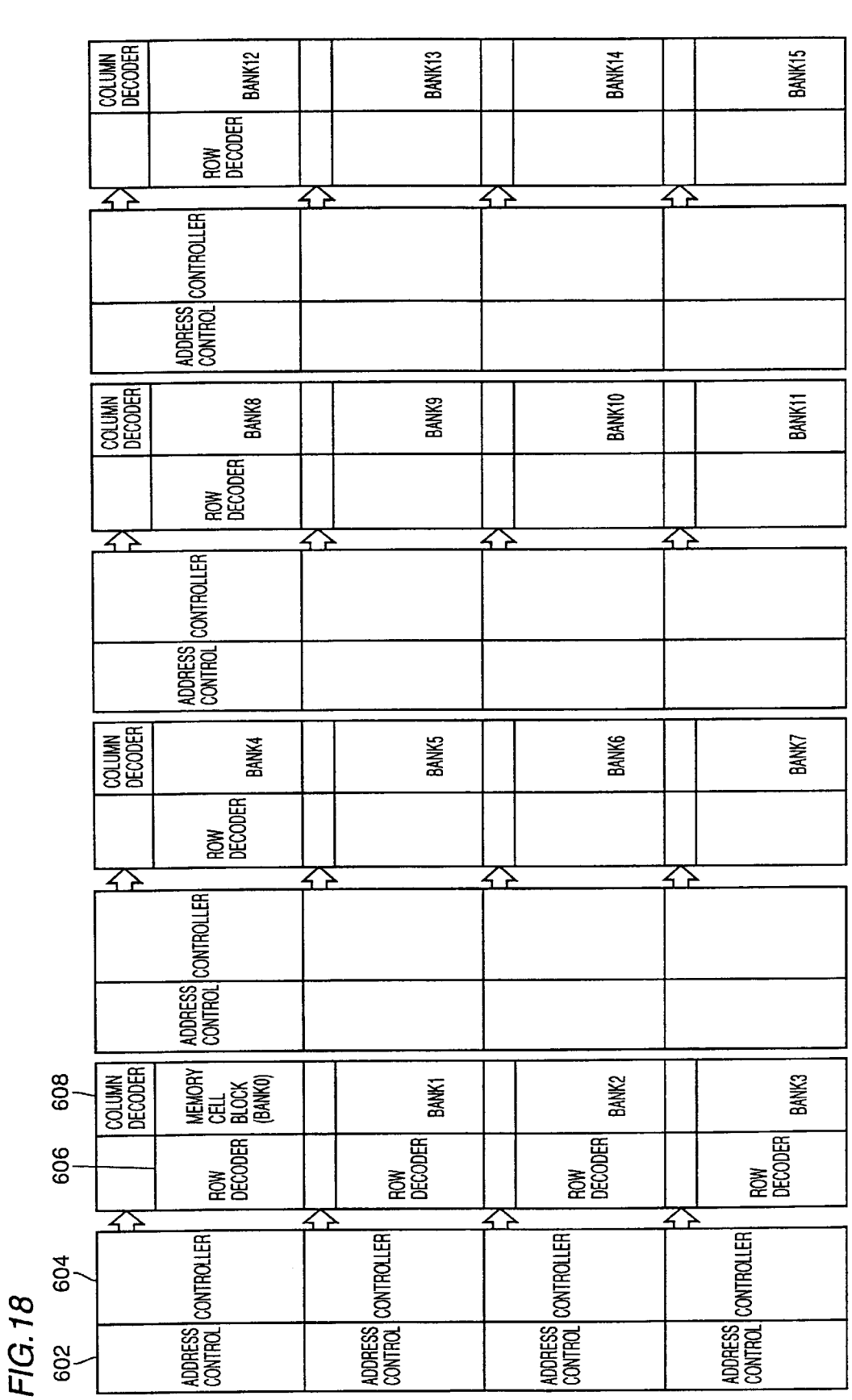
FIG. 18 is a schematic block diagram for use in illustration of the configuration of first synchronous semiconductor memory device having banks arranged in an array form.
Figure 19:
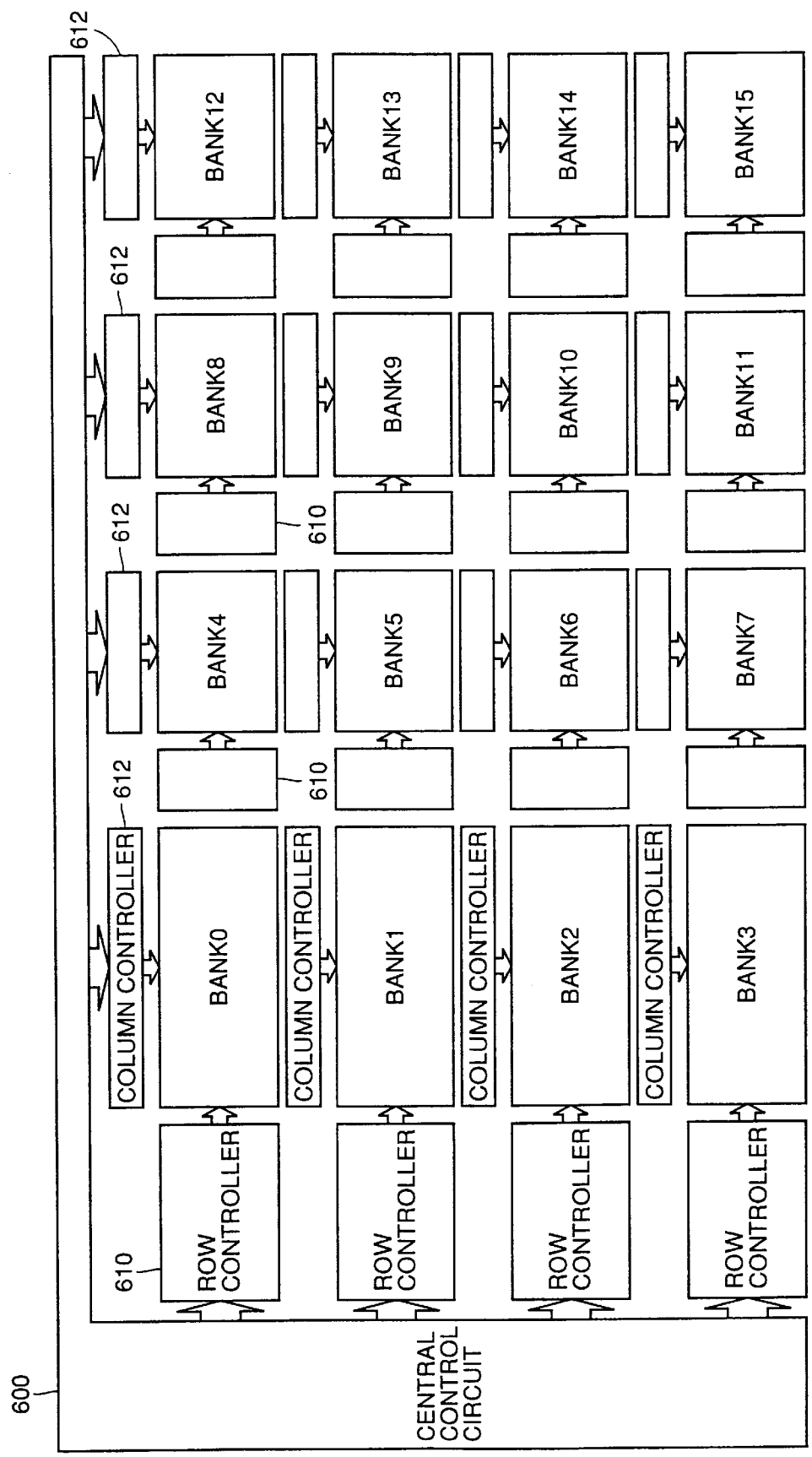
FIG. 19 is a schematic block diagram for use in illustration of the configuration of a second synchronous semiconductor memory device having banks arranged in an array form.

In the array form configuration, a controller, an address control circuit, a column decoder, and a row decoder are provided for each of banks such that independent operations are enabled as shown in FIG. 18 or 19, similarly to conventional cases.

More specifically, FIG. 18 is a schematic block diagram for use in illustration of a first synchronous semiconductor memory device having banks arranged in an array form.

In the arrangement shown in FIG. 18, 16 banks, bank 0 to bank 15 are arranged in an array. An address control circuit 602 and a controller 604 are provided corresponding to banks 0 to 3 to control a row decoder 606. Address control circuit 600 and controller 604 also control a column decoder 608 in each bank.

The same configuration is also provided for each of the groups of banks 4 to 7, 8 to 11 and 12 to 15.

FIG. 19 is a schematic block diagram for use in illustration of a second synchronous semiconductor memory device having banks arranged in an array.

Also in the arrangement shown in FIG. 19, 16 banks, bank 0 to 15 are arranged in an array. A row controller 610 and a column controller 612 are provided for each of banks 0 to 15, and control column and row selecting operations to each bank.

In any of the arrangements shown in FIGS. 18 and 19, increase in the power consumption associated with a sense amplifier operation is restricted as compared to the conventional synchronous semiconductor memory devices of the multi-bank configuration in which the memory mat is divided in the row- or column-direction, and yet the number of I/Os (the number of data bits) which can be taken out can be secured.

In this case, however, the area of the control-related circuits in the chip area significantly increases as the number of banks increases.

Figure 20:
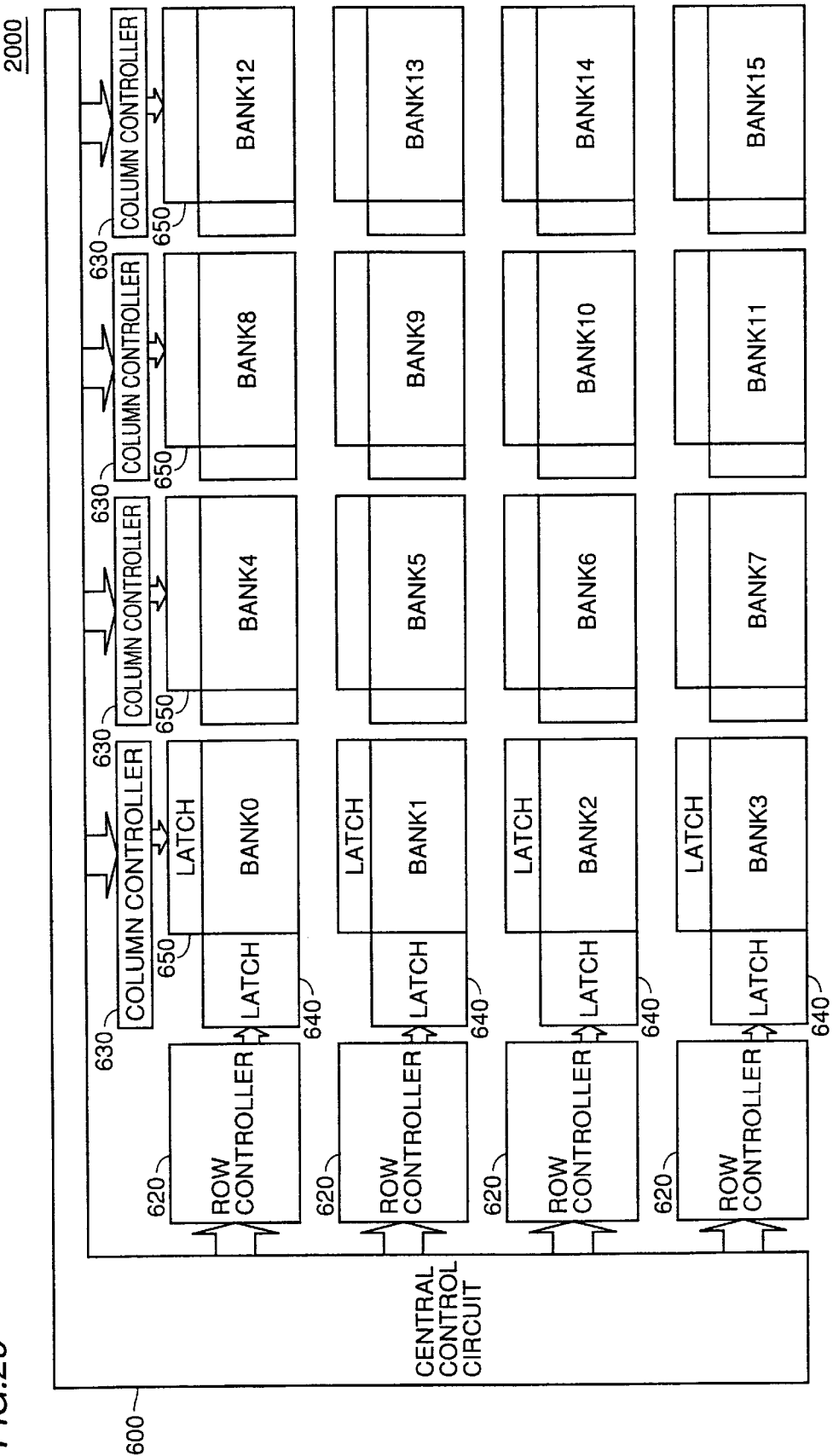
FIG. 20 is a schematic block diagram for use in illustration of the configuration of synchronous semiconductor memory device 2000 according to a fifth embodiment of the invention.

FIG. 20 is a schematic block diagram of the configuration of a multi-bank synchronous semiconductor memory device 2000 which addresses this disadvantage.

Unlike the configuration shown in FIG. 19, a row controller 620 which controls the operation of each bank based on command data from a central control circuit 600 is shared among four banks in the row-direction, and a column controller 630 is shared among four banks in the column-direction.

Accordingly, each bank is provided with a local control circuit 640 for holding a command from row controller 620 in response to a selection of a corresponding bank, and a column local control circuit 650 for holding a command from column controller 630 in response to a selection of a corresponding bank.

Therefore, if banks are arranged in an array as described above, an address bus and a command bus may be shared among a plurality of banks as in the first and fourth embodiments, so that the area occupied by the control-related circuits may be reduced and the power consumption may be reduced.

Figure 21:
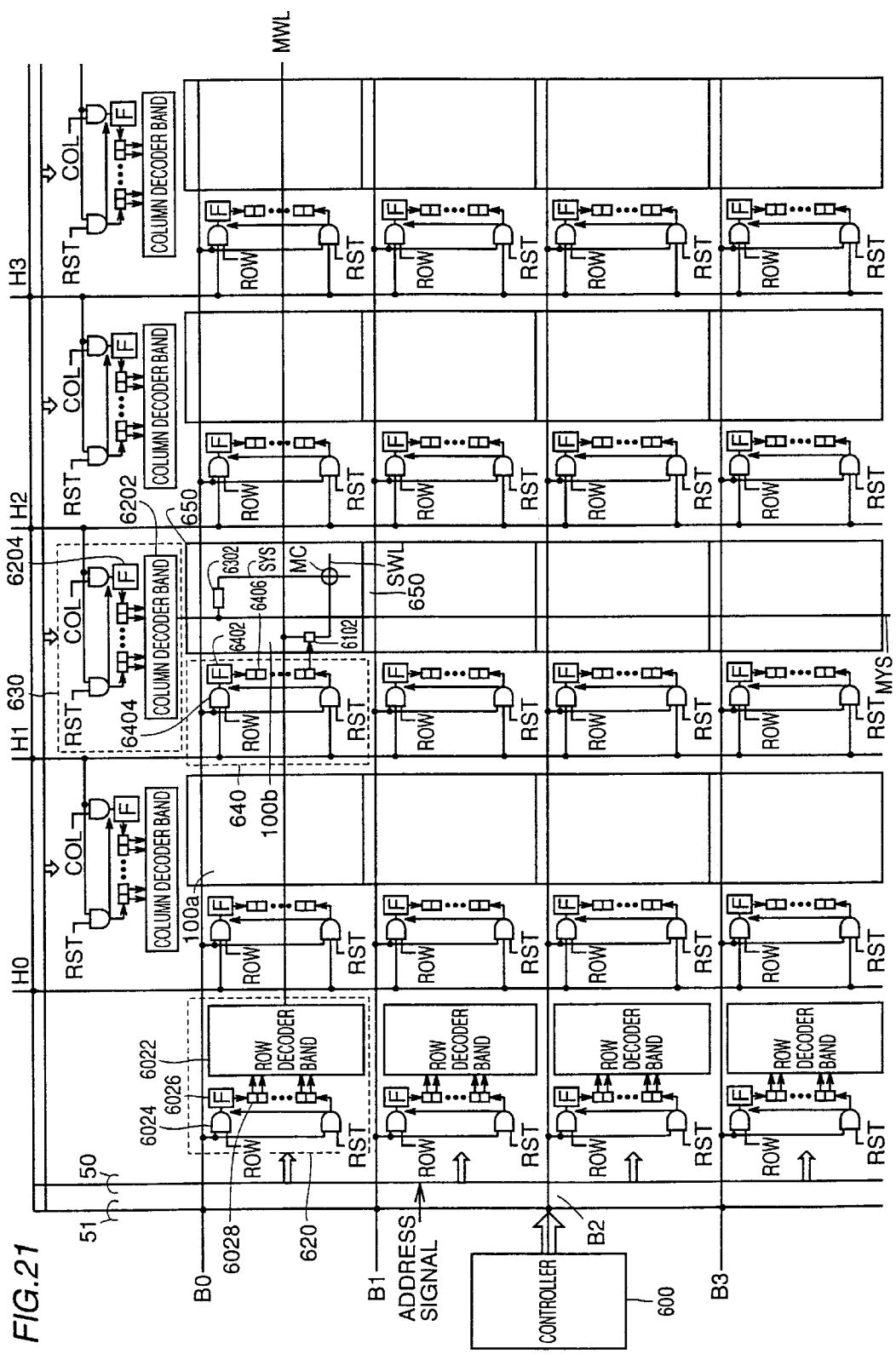
FIG. 21 is a schematic block diagram for use in illustration of the configuration of synchronous semiconductor memory device 2000 sharing an address bus and a command data bus.

FIG. 21 is a schematic block diagram of the configuration in which an address bus and a command bus are shared in an array of banks in synchronous semiconductor memory device 2000 shown in FIG. 20.

Among the banks arranged in an array, when we look at memory cell block 100b, a command signal from controller (central control circuit) 600 is transmitted to a row main control circuit 620, a column main control circuit 630, a row local control circuit 640, and a column local control circuit 650.

Bank address signals, in other words, vertical bank address signals B0 to B3 identifying bank addresses in the row-direction and horizontal bank address signals H0 to H3 identifying bank addresses in the column direction are transmitted to row main control circuit 620, column main control circuit 630, row local control circuit 640 and column local control circuit 650. A flag generation circuit 6026 in row main control circuit 620 and a flag generation circuit 6402 in row local control circuit 640 hold an active level in response to an activation of a corresponding horizontal bank address signal, and a flag generation circuit 6204 in column main control circuit 630 holds an active level in response to an activation of a corresponding vertical bank address signal.

Meanwhile, an address signal is transmitted to a main row decoder 6022 and a main column decoder 6202 through an address bus 50, which further transmits the address signal to row local control circuit 610 and column main control circuit 630.

Row main control circuit 620, column main control circuit 630, row local control circuit 640 and column local control circuit 650 are each activated if selected per se based on a bank address signal, and receive command data or an address signal.

Main row decoder 6022 and main column decoder 6202 are each also activated when selected per se based on a bank address signal and receives the address signal.

For example, if row main control circuit 620 is selected, the output of an AND circuit 6024 is activated, in response to which a command is received by a flag generation circuit (flip-flop circuit) 6026.

Meanwhile, row address data is received a latch circuit 6028 and held.

Similarly, if row local control circuit 640 is selected, the output of an AND circuit 6404 is activated, in response to which a command is received by flag generation circuit (flip-flop circuit) 6402.

Meanwhile, row address data is received by a latch circuit 6406 and held.

Main row decoder 6022 selects a main word line MWL, and row local control circuit 640 selects a sub word line SWL by a selecting circuit 6102.

Main column decoder 6202 selects a main column selecting line MYS, column local control circuit 650 selects a sub column selecting line SYS by a selecting circuit 6302.

Thus, a memory cell is selected.

Figure 22:
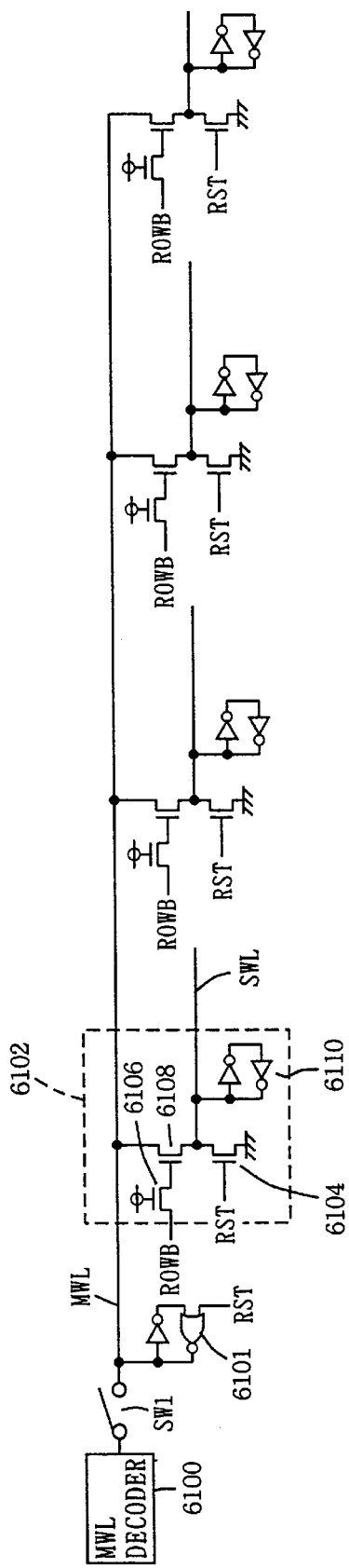
FIG. 22 is a diagram for use in illustration of the arrangement of main word lines and sub word lines.

FIG. 22 is a diagram for use in illustration of main word lines and sub word lines.

Referring to FIG. 22, an MWL decoder circuit 6100 included in main row decoder 6022 selects and activates a main word line MWL based on a row address signal. In the selecting operation, a switch SW1 conducts and couples main word line MWL and MWL decoder circuit 6100.

The potential level of the activated main word line is held by a latch circuit 6101 which has been reset by a reset signal RST in a non-selected state.

Latch circuit 6101 is included in a latch circuit 6028.

The potential level of sub word line SWL is reset to a ground potential by the function of an n-channel MOS transistor 6104 which conducts in response to an activation of reset signal RST in a non-selected state.

In a selecting operation, the potential level of sub word line SWL is latched by latch circuit 610.

Meanwhile, when sub word line SWL is selected, a signal ROWB from row local control circuit 610 is activated (into an "H" level), the gate potential of an n-channel MOS transistor 6108 is driven through a p-channel MOS transistor 6106, such that n-channel MOS transistor 6108 conducts. Accordingly, the potential level of main word line MWL is transmitted to sub word line SWL.

Subsequently, switch SW1 is cut off, and MWL decoder circuit 6100 or the like is reset.

Through the above-described operations, the potential levels of selected main word line MWL and sub word line SWL are held, while MWL decoder circuit 6100 or the like is reset or brought into an operation state based on a hierarchical power supply, so that the power consumption may be reduced during an active operation as well.

Hereinafter, a bank provided in the first row and in the second column in FIG. 21 for example is referred to as bank 12.

Figure 23:
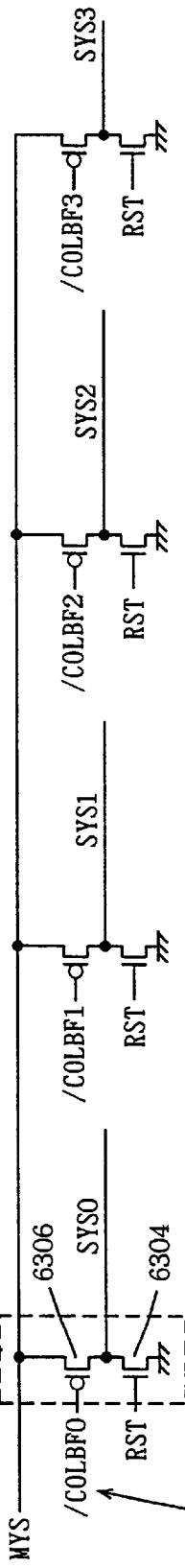
FIG. 23 is a diagram for use in illustration of the arrangement of main column selecting lines and sub column selecting lines.

FIG. 23 is a diagram for use in illustration of the arrangement of main column selecting line MYS and sub column selecting lines SYS0 to SYS3 corresponding to banks 01 to 31 belonging to the first column among and banks 00 to 33 by way of illustration.

For example, sub column selecting line SYS0 is reset to a ground potential by an n-channel MOS transistor 6304 which conducts in response to an activation of reset signal RST.

Meanwhile, if sub column selecting line SYS0 is selected, a signal /COLBF0 is activated (into an "L" level) corresponding to bank 01 from column local control circuit 630, and a p-channel MOS transistor 6306 conducts. In response to this, the potential level of main column selecting line MYS is transmitted to sub column selecting line SYS.

Other sub column lines SYS1 to SYS3 have the same configuration. The same arrangement of main column selecting lines and sub column selecting lines is provided for banks belonging to other columns.

Note that the hierarchical arrangement of word lines and column selecting lines shown in FIGS. 21 and 22 is applicable to synchronous semiconductor memory devices according to the first to fourth embodiments.

Figure 24:
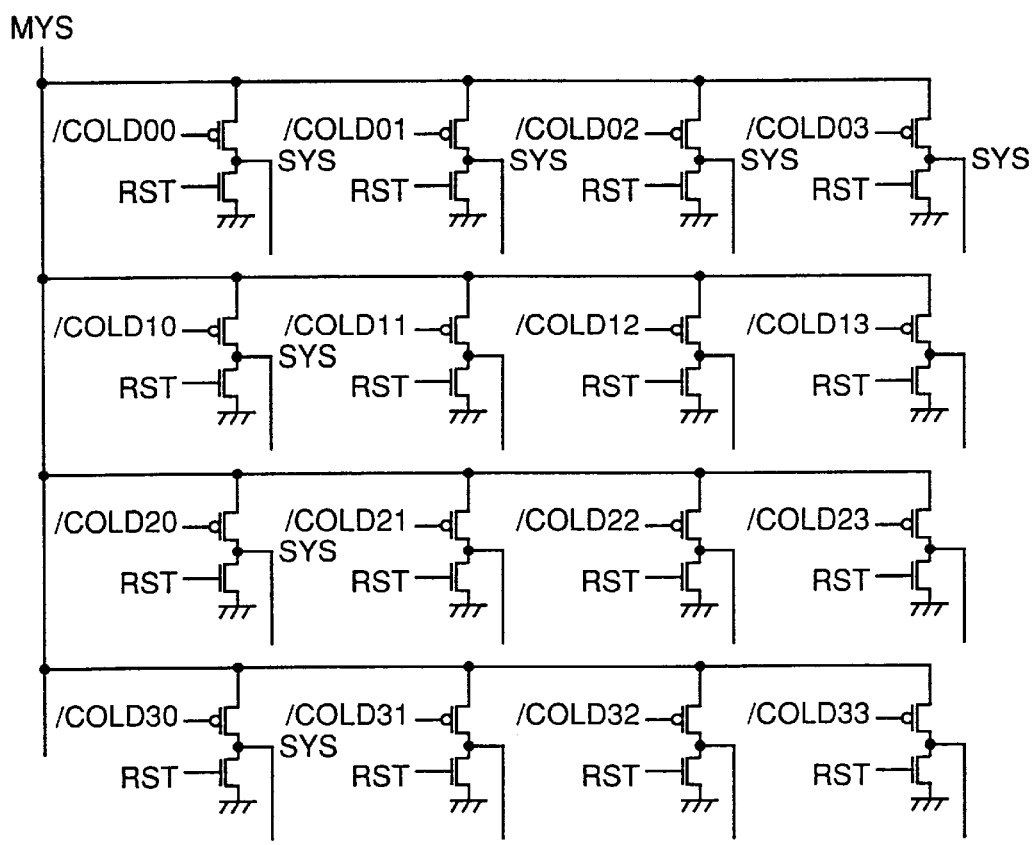
FIG. 24 is a diagram showing another arrangement of column selecting lines in a hierarchical configuration applied to bank-array.

FIG. 24 is a diagram showing another arrangement of hierarchical column selecting lines applied to bank array as shown in FIG. 21.

In the following description, a column selecting signal is applied pulse-wise, and a column is activated in a bank ij (i=0 to 3, j=0 to 3) among banks 00 to 33. In this case, a plurality (four in this example) of sub column selecting lines SYS are connected to a single main column selecting line MYS.

A flag signal /COLDik indicating that the k-th sub column selecting line (k=0 to 3) among the plurality of sub column selecting lines controlled by main selecting line MYS is activated, and a corresponding sub column selecting line SYS is activated when main column selecting line MYS is activated.

Note that as another possible method of independently activating a plurality of sub column selecting lines SYS, in place of a PMOS transistor receiving signal /COLDik at its gate, a PMOS transistor receiving a signal /COLBF at its gate and a plurality of MOS transistors receiving a decode signal at their gates may be provided in series such that a sub column selecting line is activated when flag signal /COLBF indicating that a column selecting operation is activated and a decode signal to select one of the plurality of sub column selecting lines SYS are input.

Figure 25:
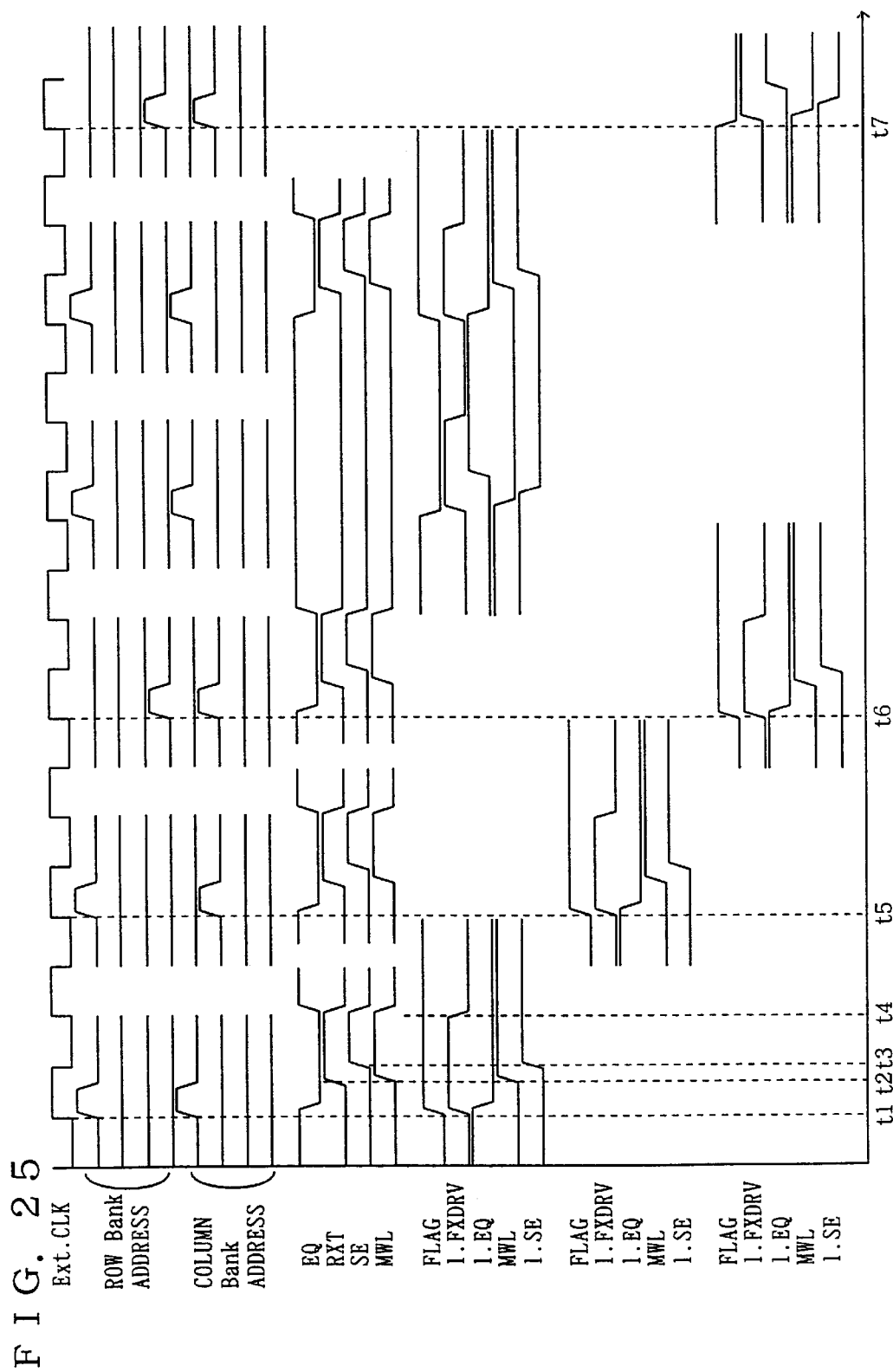
FIGS. 25 and 26 are first and second timing charts for use in illustration of operation of the synchronous semiconductor memory device according to the fifth embodiment of the invention.

FIG. 25 is timing chart for use in illustration of the operation of the synchronous semiconductor memory device shown in FIG. 21.

At time t1, a bank selected based on a row bank address and a column bank address is activated, and a flag signal FLAG is activated. In response to an inactivation of equalize signal EQ, local equalize signal l.EQ is inactivated, so that the equalized state of a bit line pair or the like in the selected bank is cancelled. Further, a local drive signal l.FXDRV instructing an operation of receiving an address signal is also activated. Meanwhile, signals SCRC and SCRC2 (not shown) are activated.

At time t2, word line activation signal RXT is activated, a selecting operation to a word line is performed based on a row address signal, and at time t3, in response to an activation of sense amplifier activation signal SE, local sense amplifier activation signal l.SE is also activated, and data from a plurality of selected memory cells is amplified as a corresponding bit line potential.

At time t4, local drive signal l.FXDRV is inactivated, while an address signal is held by a level holding circuit.

Local sense amplifier activation signal l.SE, local equalize signal l.EQ, or the like has its level held by the level holding circuit for a prescribed time period in the operation to the selected bank.

Thereafter, a selecting operation is sequentially performed to other banks based on a row bank address and a column bank address.

In the following description, signals EQ, RXT, SE and the like are active for corresponding prescribed periods, but these signals may be one-shot pulses, because local sense amplifier activation signal l.SE, local equalize signal l.EQ or the like has its level held by the level holding circuit.

Figure 26:
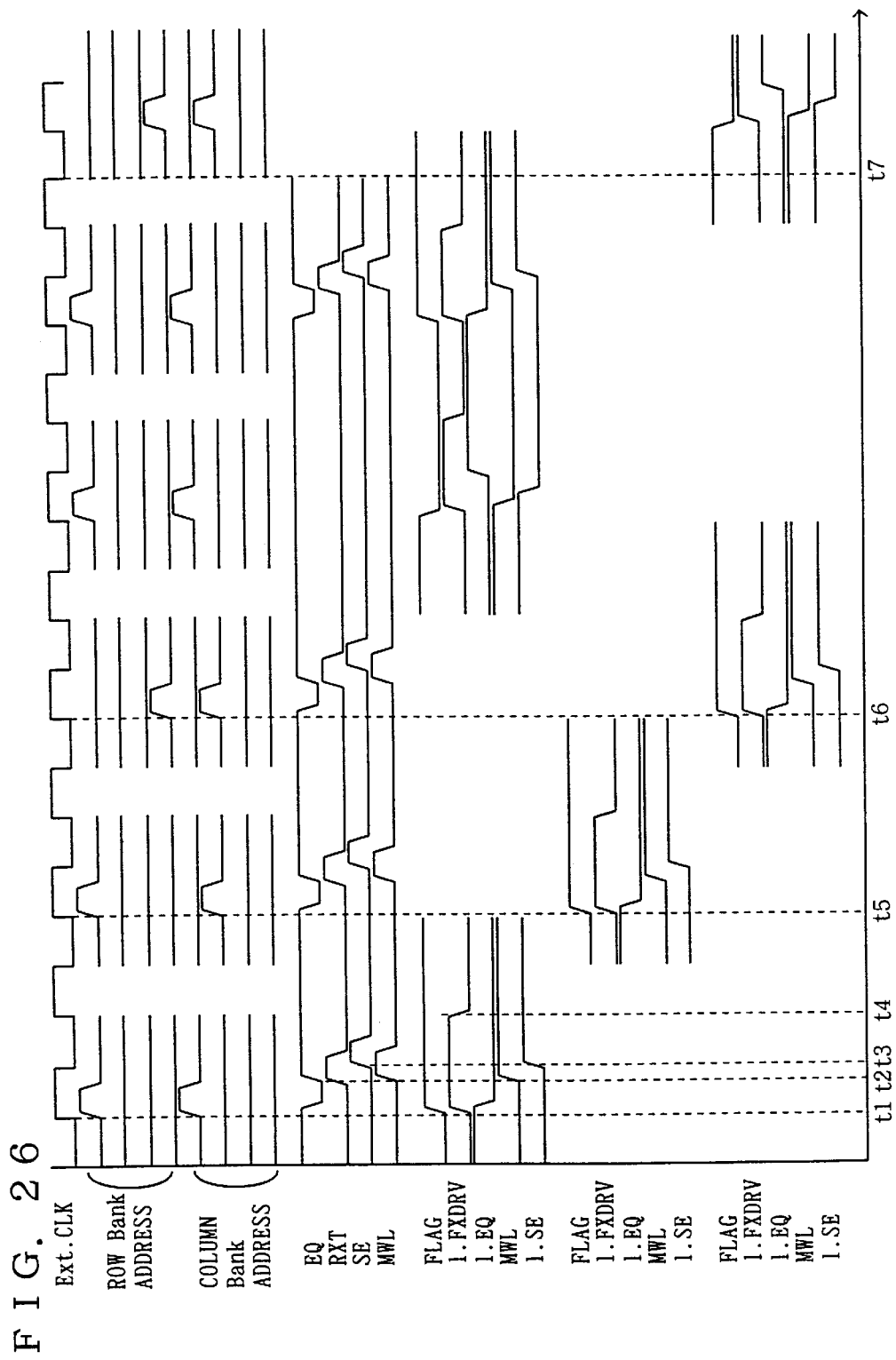

FIG. 26 is a timing chart for use in illustration of the operation in such a case, and since the operation is basically the same as the case shown in FIG. 25, the description is not repeated.

Thus, the area occupied by the control-related circuits in the chip area may be restricted, while the power consumption in the stand-by and active operations may be reduced.

Sixth Embodiment

In synchronous semiconductor memory device 2000 according to the fifth embodiment, banks are arranged in an array form. In synchronous semiconductor memory device 1000 according to the first embodiment, individual banks are further divided into an array form.

Figure 27:
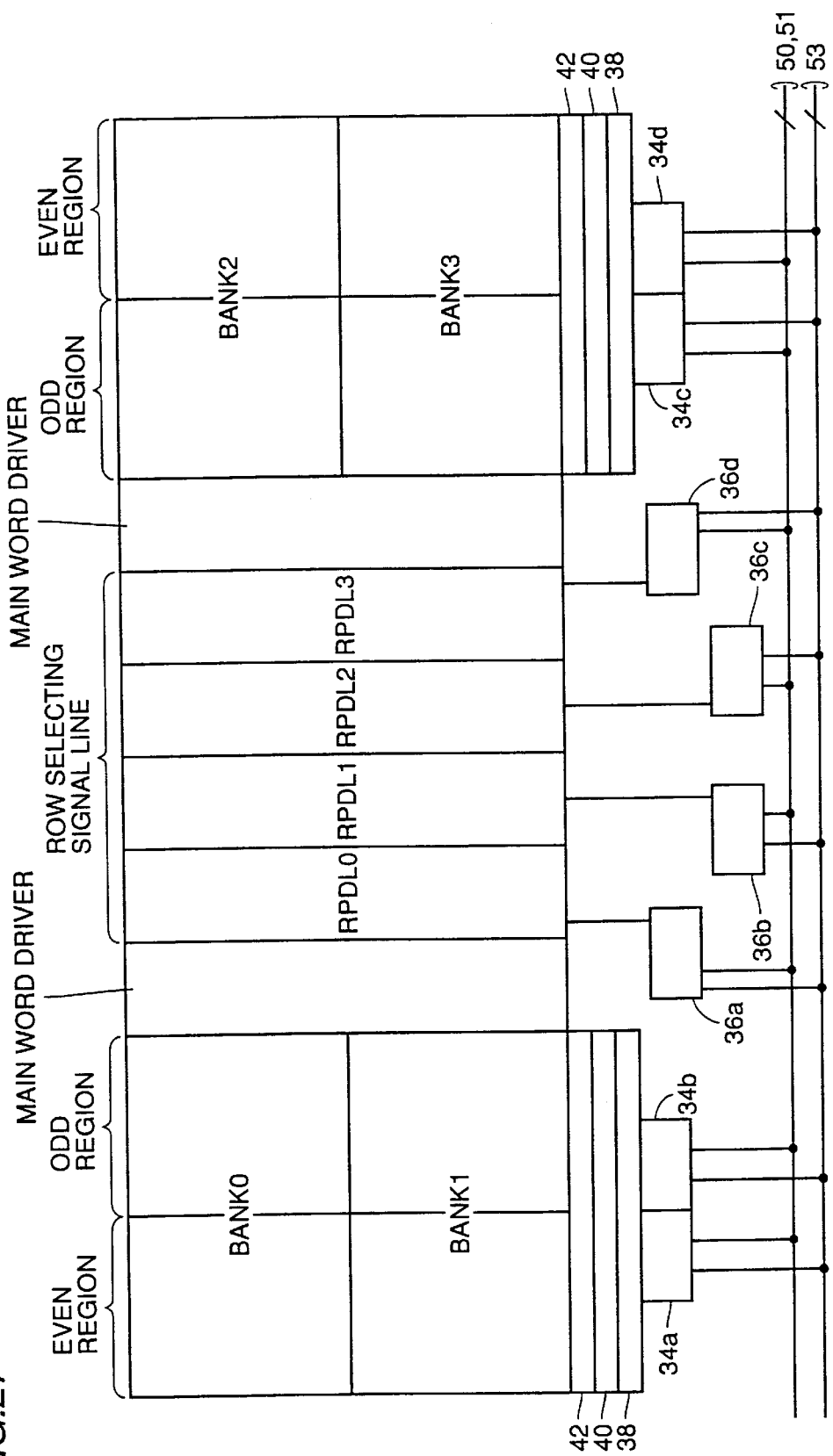
FIG. 27 is a schematic block diagram of the configuration of synchronous semiconductor memory device 1000 in which each bank is further divided into two in the row direction.

FIG. 27 is a schematic block diagram of another configuration of the synchronous semiconductor memory device shown in FIG. 1 in which memory cell blocks 100*a* and 100*b* are further divided into two in the row-direction, and the number of banks is four instead of two in FIG. 1.

In this configuration, row pre-decoders 36*a* to 36*d* and column pre-decoders 34*a* to 34*d* are provided corresponding to banks 0 to 3. In a row decoder 44, row electing signal lines RPDL0 to RPDL3 are provided corresponding to the banks.

In this configuration, row pre-decoder 36 and column pre-decoder 34, the local control-related circuits and row selecting signal lines RPDL0 to RPDL3 occupy an increased area in the chip area.

Figure 28:
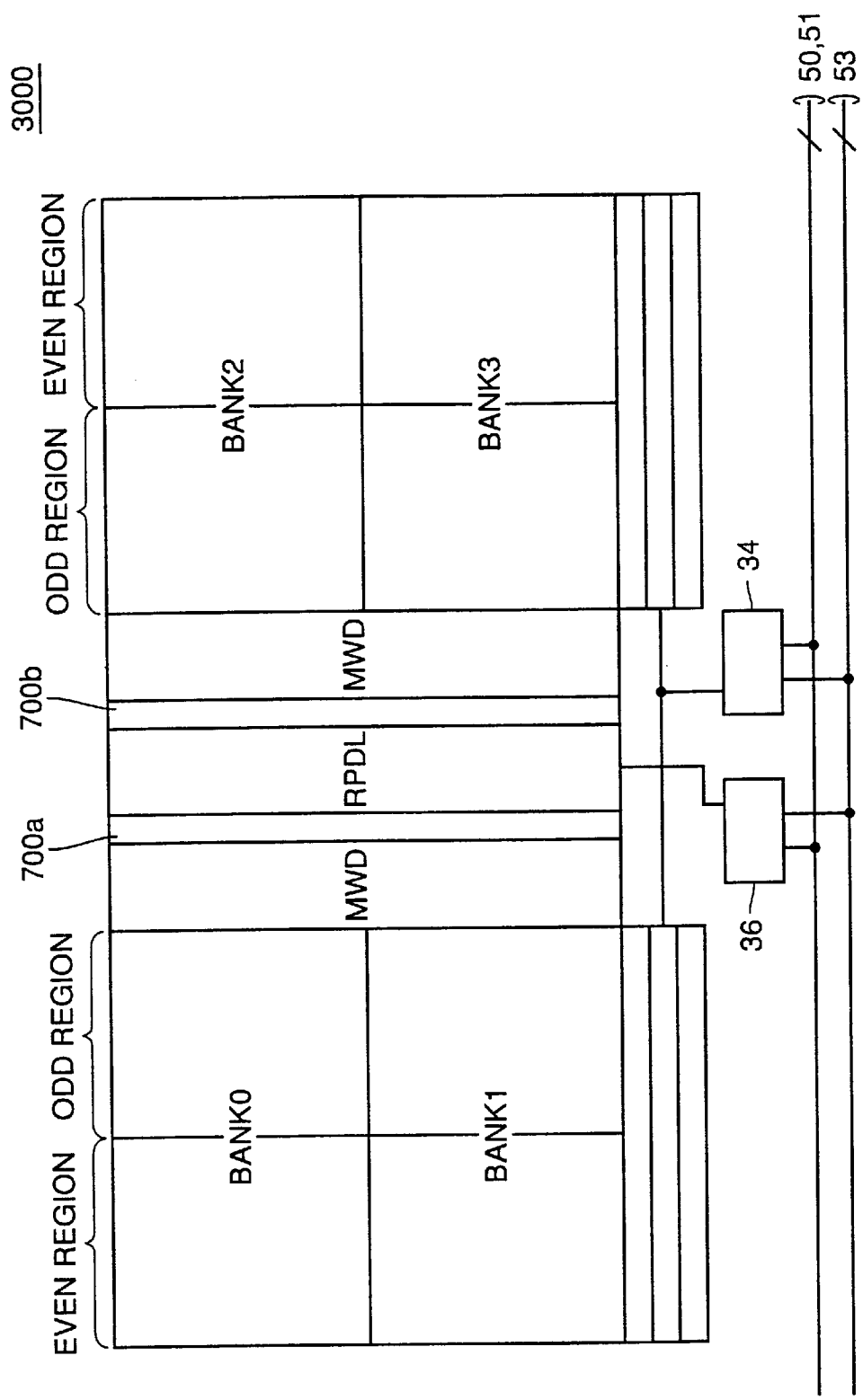
FIG. 28 is a circuit diagram of a part of a synchronous semiconductor memory device 300 according to a sixth embodiment of the invention.

FIG. 28 is a schematic block diagram for use in illustration of a part of the configuration of synchronous semiconductor memory device 3000 according to the sixth embodiment of the invention to avoid such problems. In the synchronous semiconductor memory device 3000, latch circuit strings 700*a* and 700*b* for holding a row selecting signal from row pre-decoder 36 are provided.

More specifically, when a signal is transmitted from an address bus 50 under the control of control circuit 20, and a corresponding bank is selected based on the signal from bank address bus 51, row pre-decoder 36 receives and pre-decodes a row address, and the pre-decode signal therefrom is transmitted to latch circuit strings 700*a* and 700*b* through row selecting signal line RPDL, and held therein. Main word line driver MWD selects a corresponding main word line based on the pre-decoded signal held by latch circuit strings 700*a* and 700*b*.

More specifically, row addresses are each held by a latch circuit in the process of being transmitted to row pre-decoder 36 and latch circuit strings 700a and 700b, and transmitted in a hierarchical manner.

Note that the banks are each divided into an even-address region and an odd-address region for the following reasons.

Hereinafter, basic parts of column pre-decoder 34 and row pre-decoder 36 in synchronous semiconductor memory device 3000 according to the sixth embodiment are the same as those according to the first to fourth embodiments, and therefore the basic configuration according to the first to fourth embodiments will be described by way of illustration.

Synchronous semiconductor memory device 3000 is operated to output data at both rising and falling edges of a clock signal in the timing of data output. Hereinafter, an SDRAM performing the operation will be referred to as double data rate SDRAM (DDR-SDRAM).

At this time, for example, referring to FIG. 15, in column related accessing, an address signal is received by a column address latch 550.

The column address changes in two different manners, an interleave method and a sequential method. Which method to select is stored as operation information in a mode register (not shown) in the form of a combination of address signals. Under the mode register control, burst address counters 552 and 554 will change in different manners.

In a DDR-SDRAM operation mode, data should be output twice in one cycle of an external clock signal. As the operation of the internal circuitry in the DDR-SDRAM operation mode, two pieces of data will be output from a selected memory array block in one clock cycle. Thus, for an address signal output from burst address counters 552 and 554, two addresses for reading out the two pieces of data should be generated at a time.

In this case, since the initial state of a burst address, in other words, an externally applied column address signal may be any of even and odd addresses, burst addresses are not generated simply by sequentially incrementing an input address.

For example, if 1 is input as an externally applied column signal, a pair of internal column address signals is (1, 2) for the sequential mode and (1, 0) for the interleave mode.

Therefore, a location for a column selection with an even address and a location to be paired therewith for a column selection with an odd address (a column at which a column selecting signal is activated) are different.

Thus, in synchronous semiconductor memory device 3000, memory cell array blocks are each divided into a region corresponding to even addresses and a region corresponding to odd addresses, and a decoder for a column selecting signal corresponding to an even address is separated from a decoder for a column selecting signal corresponding to an odd address, in other words, the decoders operate independently from each other.

Figure 29:
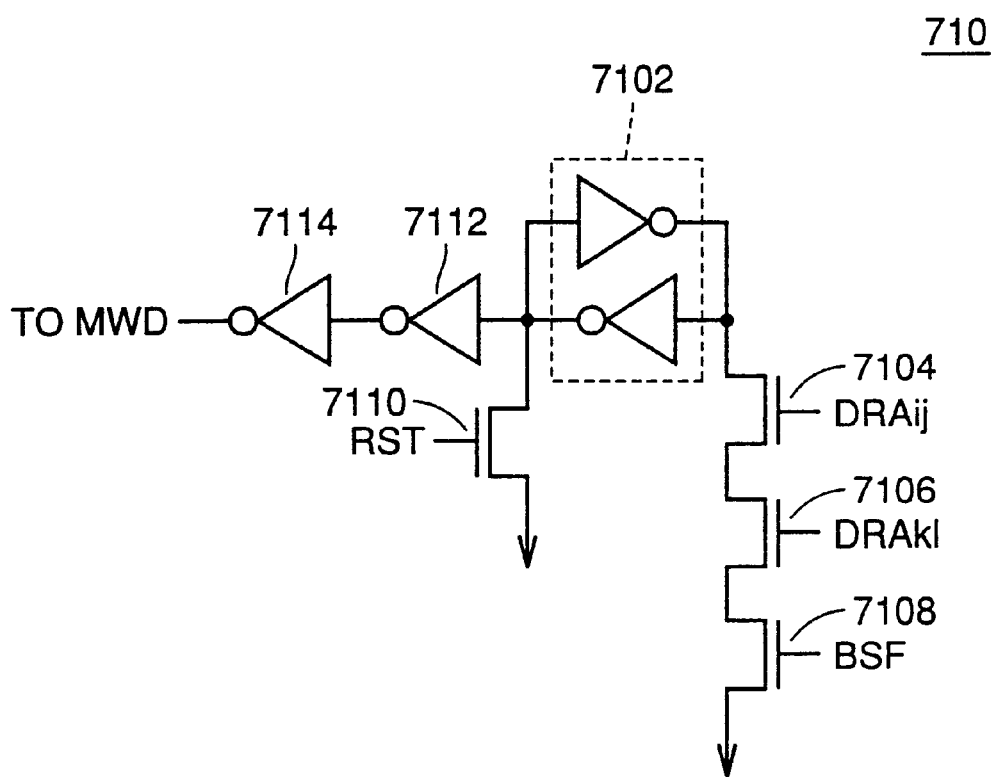
FIG. 29 is a circuit diagram of the configuration of a row latch 710 included in latch circuit columns 700a and 700b shown in FIG. 28.

FIG. 29 is a circuit diagram for use in illustration of a row latch circuit 710 included in latch circuits 700a and 700b shown in FIG. 28.

Referring to FIG. 29, row latch circuit 710 includes a latch circuit 7102, and N-channel MOS transistors 7104, 7106, and 7108 connected in series between the input node of latch circuit 7102 and a ground potential.

N-channel MOS transistor 7104 has its gate provided with a row pre-decode signal DRAij, N-channel MOS transistor 7106 has its gate provided with a row pre-decode signal DRAkl, and N-channel MOS transistor 7108 has its gate provided with a bank selecting signal BSF activated during the period in which a bank is selected.

N-channel MOS transistor 7110 which conducts by reset signal RST is connected between the output node of latch circuit 7102 and the ground potential.

Row latch circuit 710 further includes an inverter 7102 which receives the output of latch circuit 7112 and an inverter 7114 which receives the output of inverter 7112 and applies the received output to main word driver MWD. Main word line driver MWD receives the output of inverter 7114, and changes the received output to a raised voltage for application to a selected main word line MWL.

Figure 30:
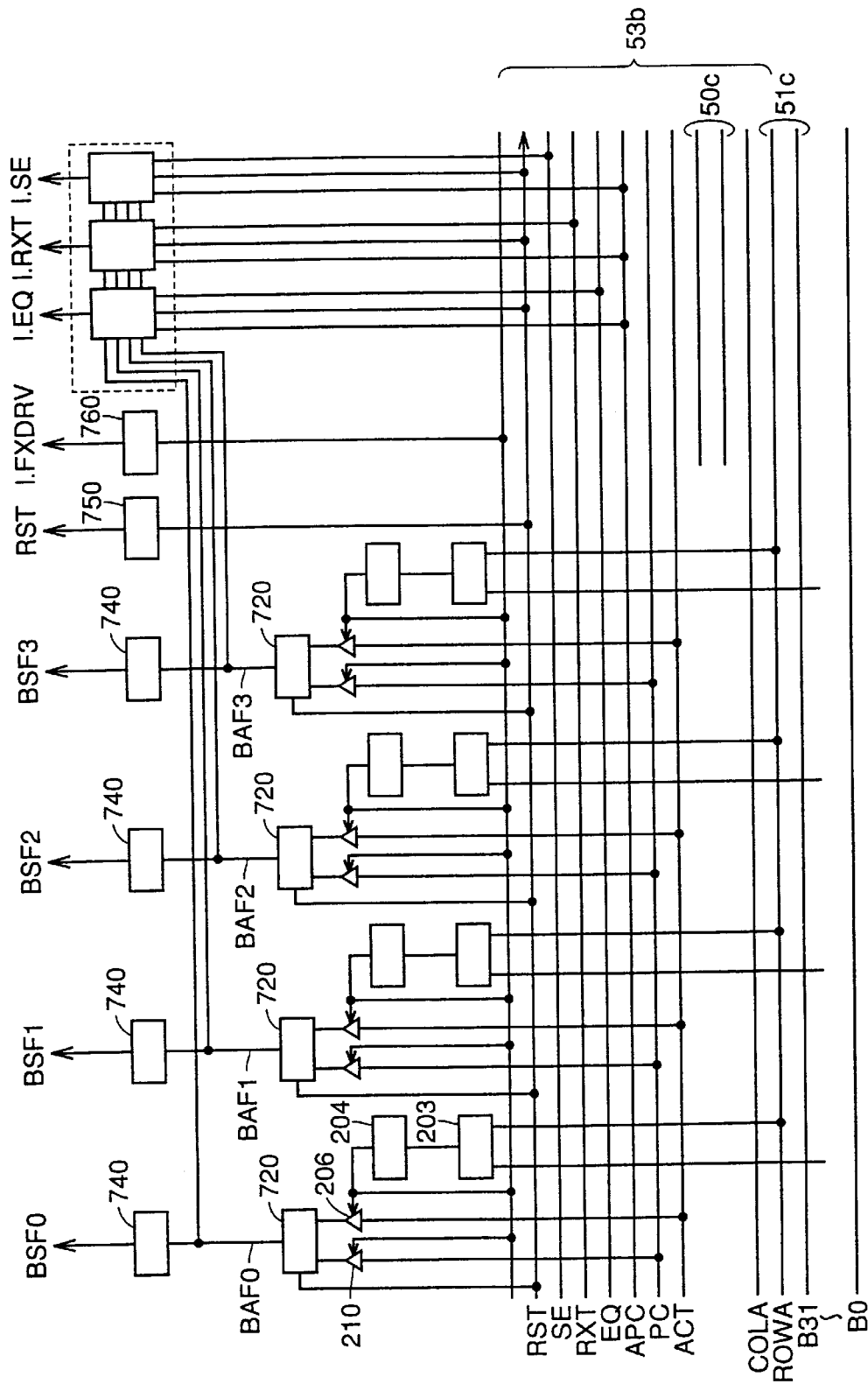
FIG. 30 is a schematic block diagram of the configuration of row pre-decoder 36 shown in FIG. 28.

FIG. 30 is a schematic block diagram of the configuration of row pre-decoder 36 shown in FIG. 28.

Since the number of banks increases, bank address bus 51c is replaced with buses B0 to B31.

Furthermore, since row pre-decoder 36 is provided commonly to four banks, there is provided a flag generation circuit 720 for generating each of bank activation flags BAF0 to BAF3 when a corresponding bank is selected.

There are further provided level holders 740 which receive and hold activation flags BAF0 to BAF3 and output bank selecting signals BSF0 to BSF3 to corresponding row latch circuits 700a and 700b.

More specifically, in synchronous semiconductor memory device 1000 according to the first embodiment shown in FIG. 4, an output signal from level holding circuit 208 indicates a selection/activation of a bank, while in the synchronous semiconductor memory device according to the sixth embodiment, bank activation flags BAF0 to BAF3 and bank selecting signals BSF0 to BSF3 corresponding to the banks are output from one row pre-decoder.

There are also provided a reset instruction circuit for outputting reset signal RST to each bank, and a drive circuit 760 for outputting a local drive signal l.FXDRV for instructing each bank to receive an address signal.

Note that signals 1.EQ, 1.RXT, and 1.SE are output basically in the same manner as shown in FIG. 4.

Figure 31:
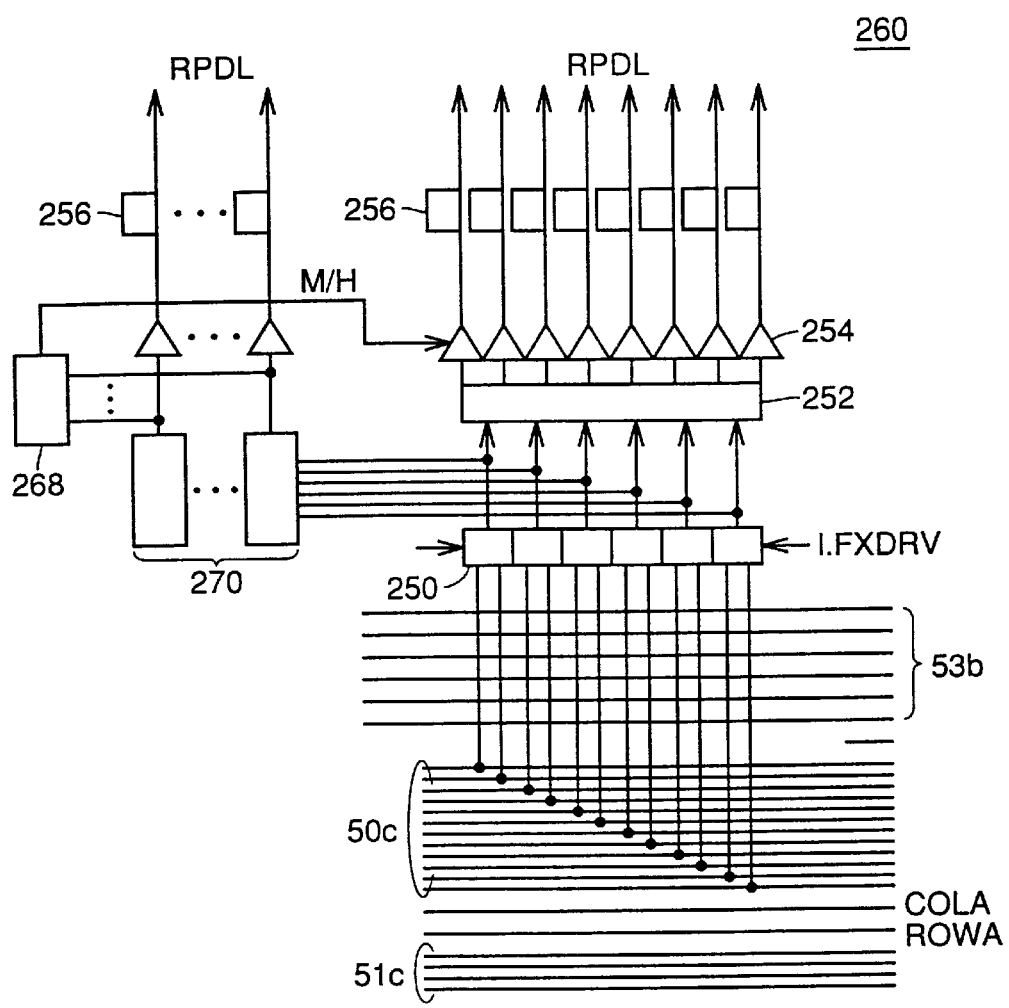
FIG. 31 is a schematic block diagram of the configuration of a row address receiving circuit 260.

FIG. 31 is a schematic block diagram of the configuration of a row address receiving circuit 260 for receiving a row address from a row address bus 50c in response to signal l.FXDRV from a row pre-decoder.

The configuration in FIG. 31 is basically the same as that in FIG. 4 except for the following points. In FIG. 31, a latch circuit 250 is driven by signal l.FXDRV. Latch circuit 250 is disconnected from address bus 50 after receiving a row address.

In FIG. 31, an output from the latch circuit is applied to a redundant row decoder 270 and then applied to a corresponding redundant row selecting signal line RDPL.

If a redundant row is selected in response to an output from a redundant row decoder 270, the operation of driver circuit 254 corresponding to a normal memory cell row is interrupted in response to a hit-miss signal H/M output from an output redundancy determination circuit 268.

Figure 32:
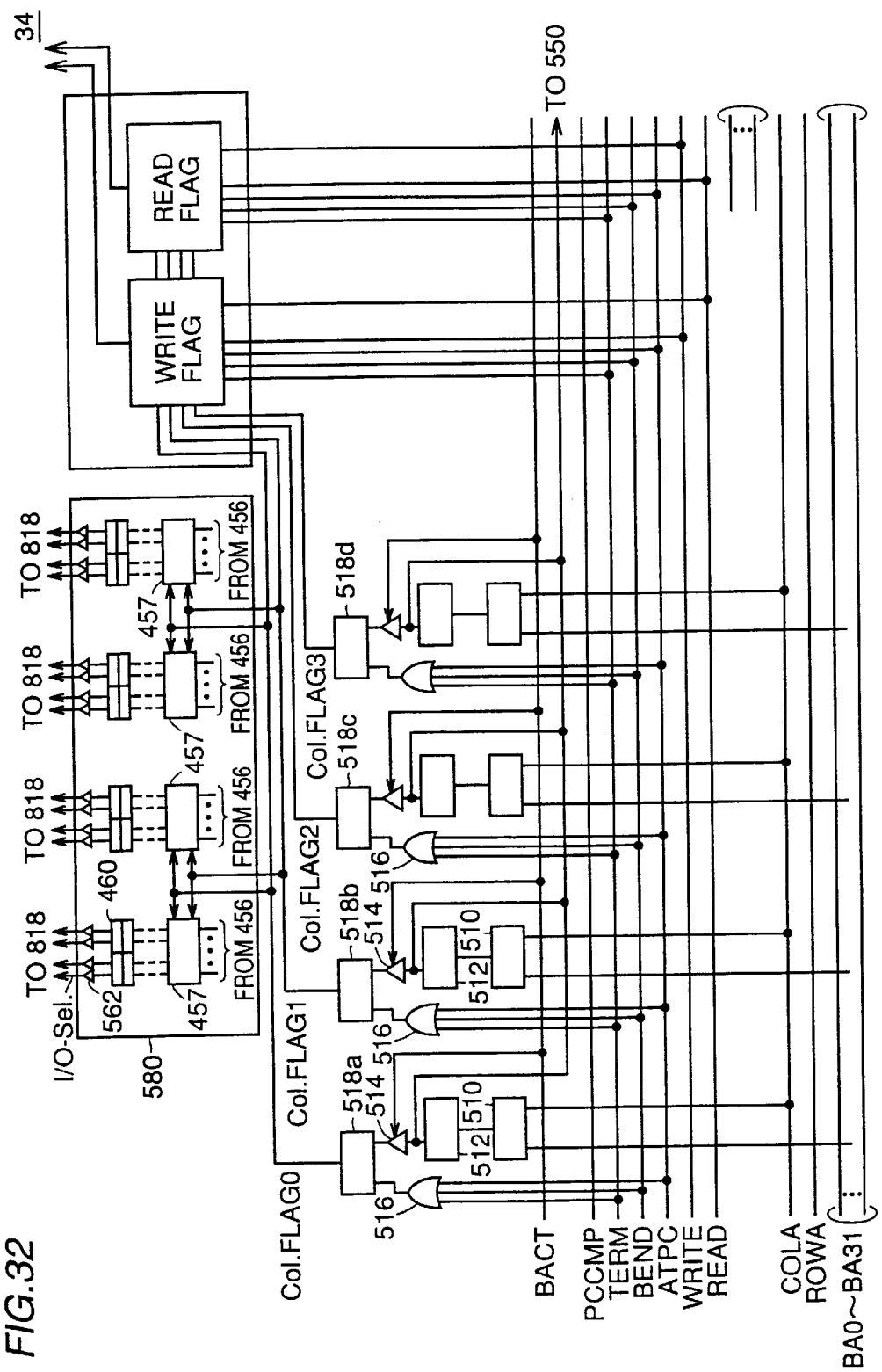
FIG. 32 is a schematic block diagram of the configuration of column pre-decoder 34 in FIG. 28.

FIG. 32 is a schematic block diagram of the configuration of column pre-decoder 34 shown in FIG. 28. The configuration in FIG. 28 is different from the fourth embodiment in FIG. 15 in the following points.

As described above, since the number of banks increases, bank address bus 51c is replaced with buses B0 to B31.

Furthermore, since a column pre-decoder 34 is provided commonly to four banks, there are provided flag generation circuits 518a to 518d for generating column selecting activation flags Col.FLAG0 to Col.FLAG3 if a corresponding bank is selected.

There is also provided a column selecting operation control circuit 580 which receives column activation flags Col.FLAG0 to Col.FLAG3 and controls the transmission of data read out from a corresponding column to a global I/O bus G-I/O as will be described. Column selecting operation control circuit 580 includes a decoder 457 which receives an output from a column redundant decoder 456 and generates a signal to control the connection between a main I/O line pair corresponding to a redundant column and global I/O bus G-I/O. Note that since column selecting operation control circuit 580 more generally produces a signal to control a column-related selecting operation, and the specific configuration of decoder 457 or the like is shown simply by way of illustration.

Note that signals Read.FLAG, Write.FLAG or the like are generated basically in the same manner as shown FIG. 15.

Figure 33:
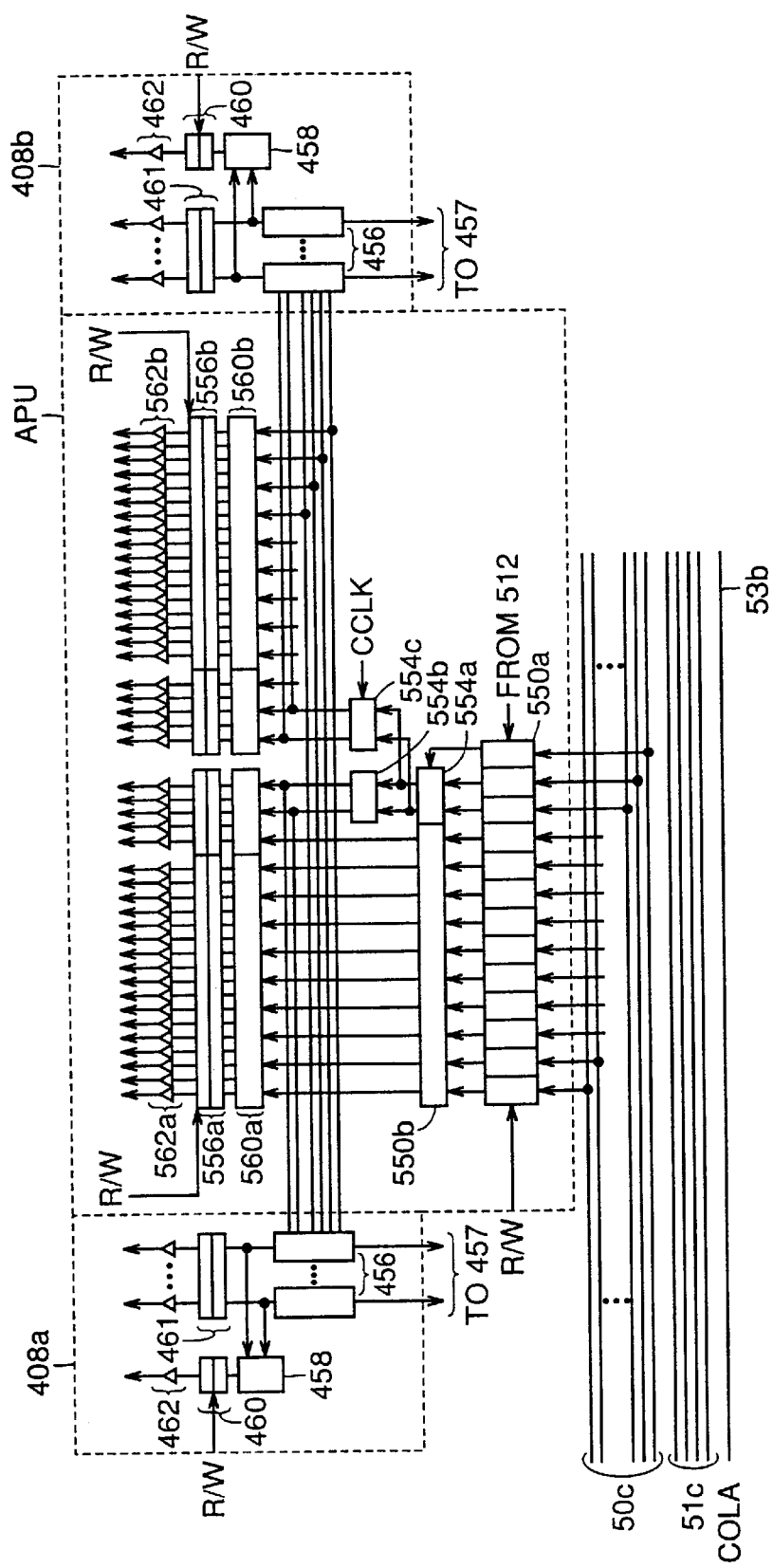
FIG. 33 a schematic block diagram of the configuration of a column-related local control circuit including the control system for a redundant portion.

FIG. 33 is a schematic block diagram of a configuration of a column-related control circuit including the control system of a redundant circuit portion.

Referring to FIG. 33, an address processing unit APU is a circuit for controlling a column selecting operation to banks 0 to 4, and a redundancy determination unit 408a is a circuit for controlling a column determining operation to redundant regions SR0 to SR3.

As will be described, redundant region SR0 can perform redundant replacement for both regions 100a0 and 100a1 corresponding to even addresses.

Address processing unit APU includes a primary latch circuit 550a for receiving 3-bit address Add (C:0) transmitted by address bus 50c from the center of the chip in response to the output of a pulse generation circuit 512, a latch circuit 550b for latching a column address output from primary latch circuit 550a, an address conversion circuit 554a for converting the less significant three bits from primary latch circuit 550a based on the operation conditions, counters 554b and 554c which receive the output of address conversion circuit 554a and count for a burst operation in synchronism with a clock signal CCLK, pre-decoders 556a, 556b, 557 and 558 which receive the outputs of latch circuit 550b and counters 554b and 554c, shifters 560a and 560b for delaying the outputs of pre-decoders 556a, 556b, 557 and 558 for output, drivers 562a and 562b for outputting the outputs of shifters 560a and 560b to the memory cell array, and a redundancy determination unit 408 for determining redundancy based on an address signal received by latch circuit 550b.

Herein, signal CCLK is the inverse of internal dock signal int. CLK, and counters 554b and 554c perform a counting-up operation during an inactive period of internal dock signal int. CLK.

In FIG. 33, pre-decoders 556a and 556b, shifters 560a and 560b, and drivers 562a and 562b are used to output a column selecting signal corresponding to an odd address region onto a pre-decode line.

Similarly to redundancy determination unit 408a for the even address region, a redundancy determination unit 408b is provided for odd-address region 100a2.

Redundancy determination unit 408b includes a redundancy determination circuit 456, shifters 460 and 461 which delay and output the outputs of redundancy determination circuit 456 and an OR circuit 458, and a driver 462 which outputs the output of shifter 460 into the memory array.

The operations will be briefly described.

An address signal sent from the central part of synchronous semiconductor memory device 3000 is received by primary latch circuit 550a as a column address in response to the output of a pulse generation circuit 512 based on an access signal COLA to a column and a bank address.

Primary latch circuit 550a is reset by signal SCRC after a column address is transmitted to latch circuit 550b and address conversion circuit 554a. When the power supply is turned on, primary latch circuit 550a is reset by a signal Vup generated only when the power supply is turned on.

The less significant three bits of the column address relate to a burst operation, and is subjected to an address conversion process and then input to a counter.

In practice, since an odd address and an even address are processed at a time, the least significant address bit is common, and two bits in the less significant three bits are processed by the counter.

The result is transmitted to each pre-decoder in the odd address region and even address region of the bank. If a column address is input to the redundancy determination circuit, and a replacement with a redundant memory column is performed, a signal output from OR circuit 458 is activated, in response to which an output from driver circuit 462 delayed by a prescribed time period is identified as a hit signal Hit indicating a replacement with a redundant memory column. If signal Hit is inactive, a replacement with a redundant memory column has not been performed, which state is herein referred to as "a replacement with a redundant column is missed". Therefore, signals output from driver circuit 462 are collectively called "hit/miss (H/M) signal".

As described above, a determination result from a plurality of redundancy determination circuits provided corresponding to even address unit 408 are ORed in OR circuit 458 and recognized as a determination result as to whether or not any redundancy replacement has been performed.

Input/output selecting signals I/O-Sel. output via a shifter and a driver from an input/output circuit 457 indicate to which global I/O bus G-I/O, data read out from a main I/O line pair RM-I/O belonging to redundant regions SR0 to SR3 is to be output.

Redundant Memory Cell Column Arrangement

Figure 34:
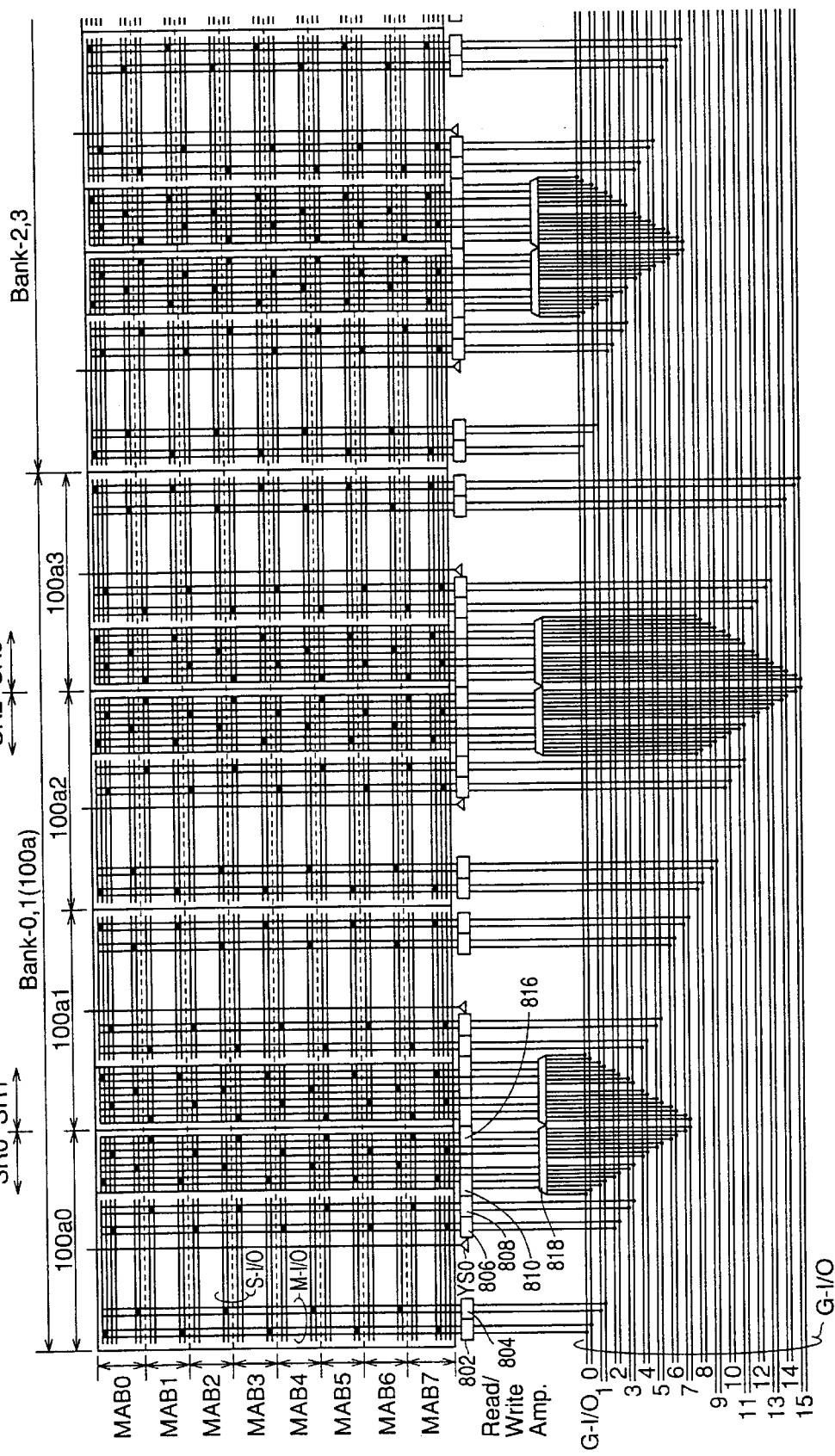
FIG. 34 is a schematic block diagram for use in illustration of a path to transmit read out data to a global I/O bus G-I/O.
Figure 35:
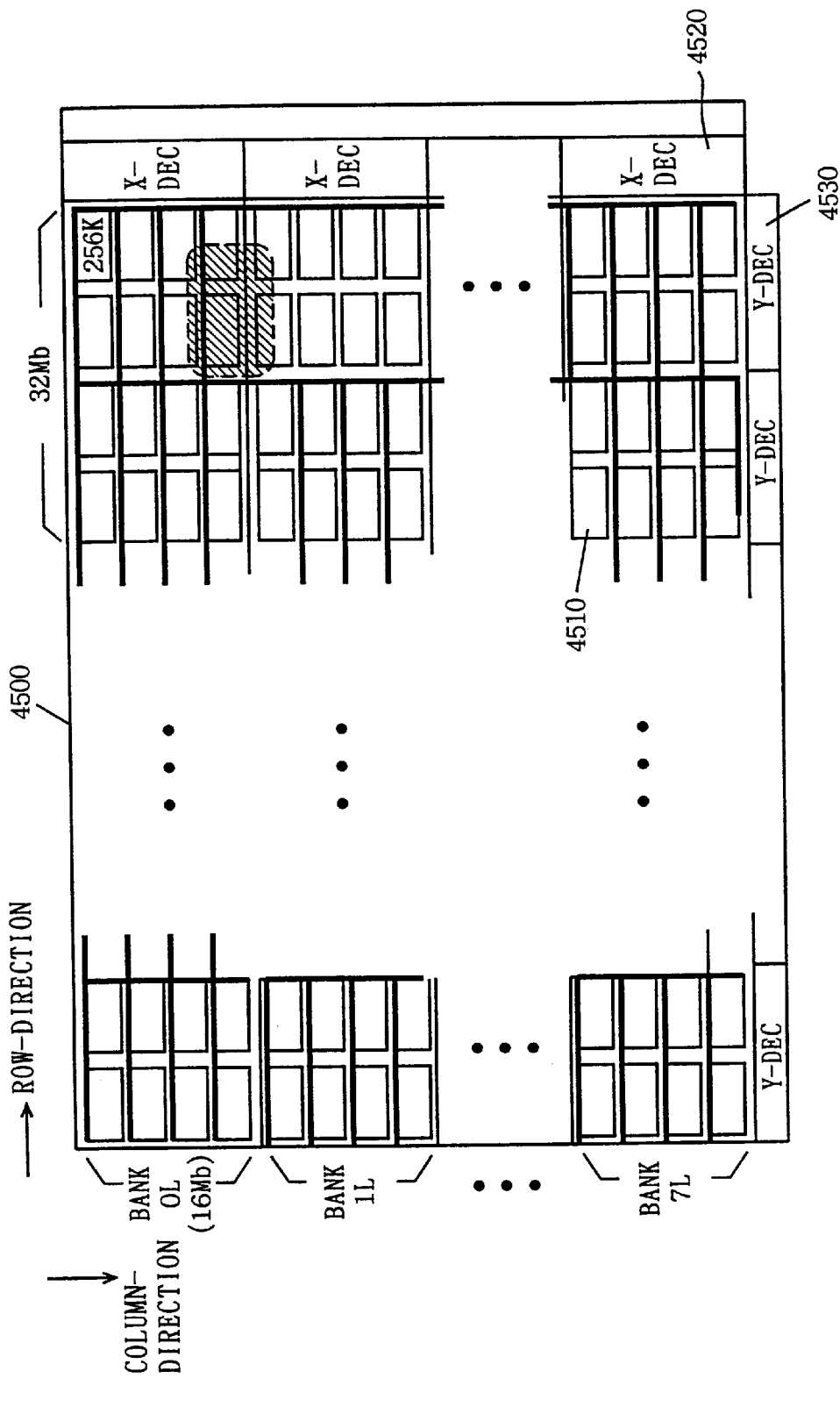
FIG. 35 is a schematic block diagram of the configuration of a memory cell array portion in a multi-bank DRAM 4000 according to Conventional Art 1.
Figure 36:
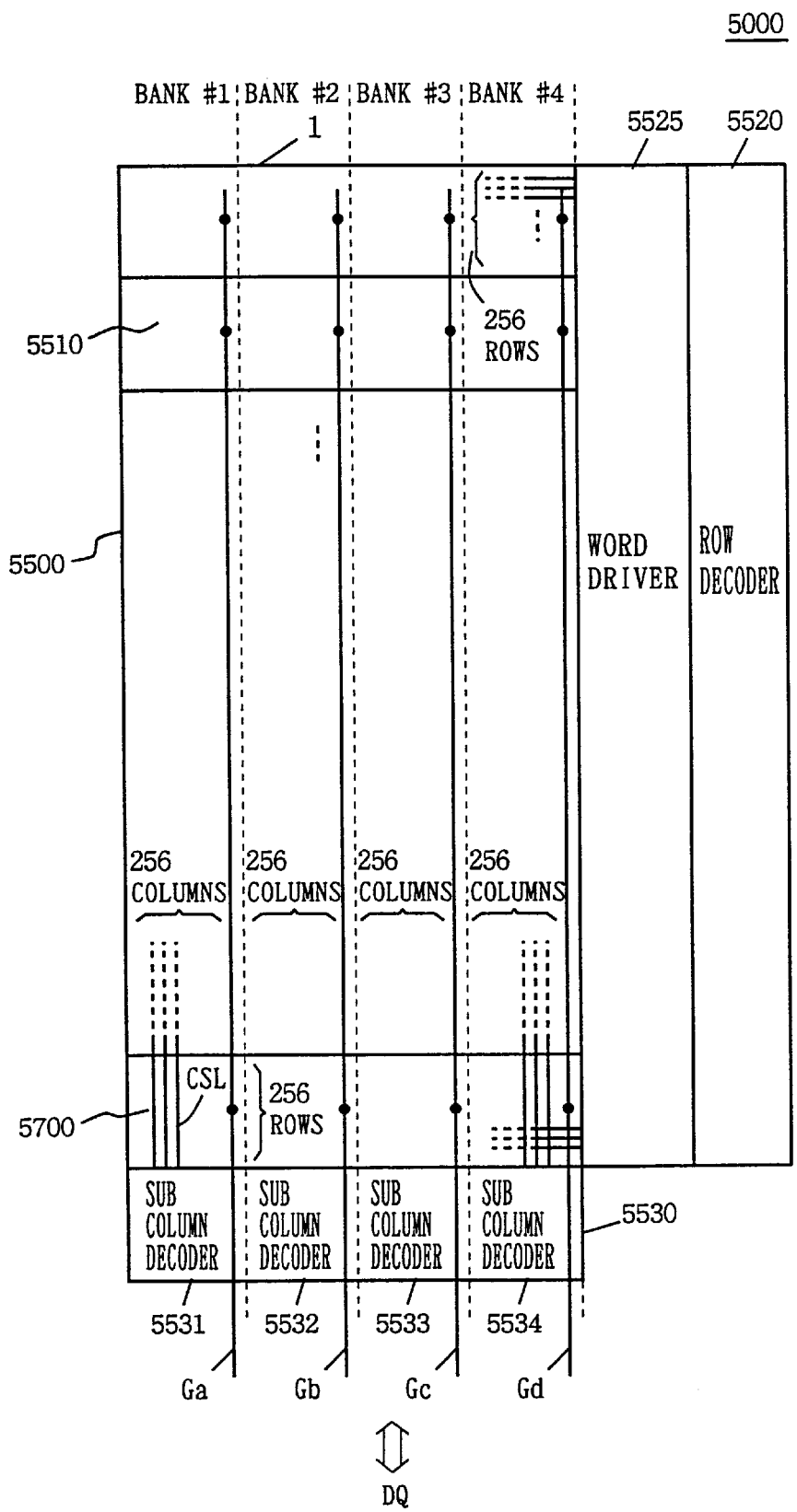
FIG. 36 is a schematic block diagram of the configuration of a memory cell array portion in a multi-bank DRAM 5000 according to Conventional Art 2.
Figure 37:
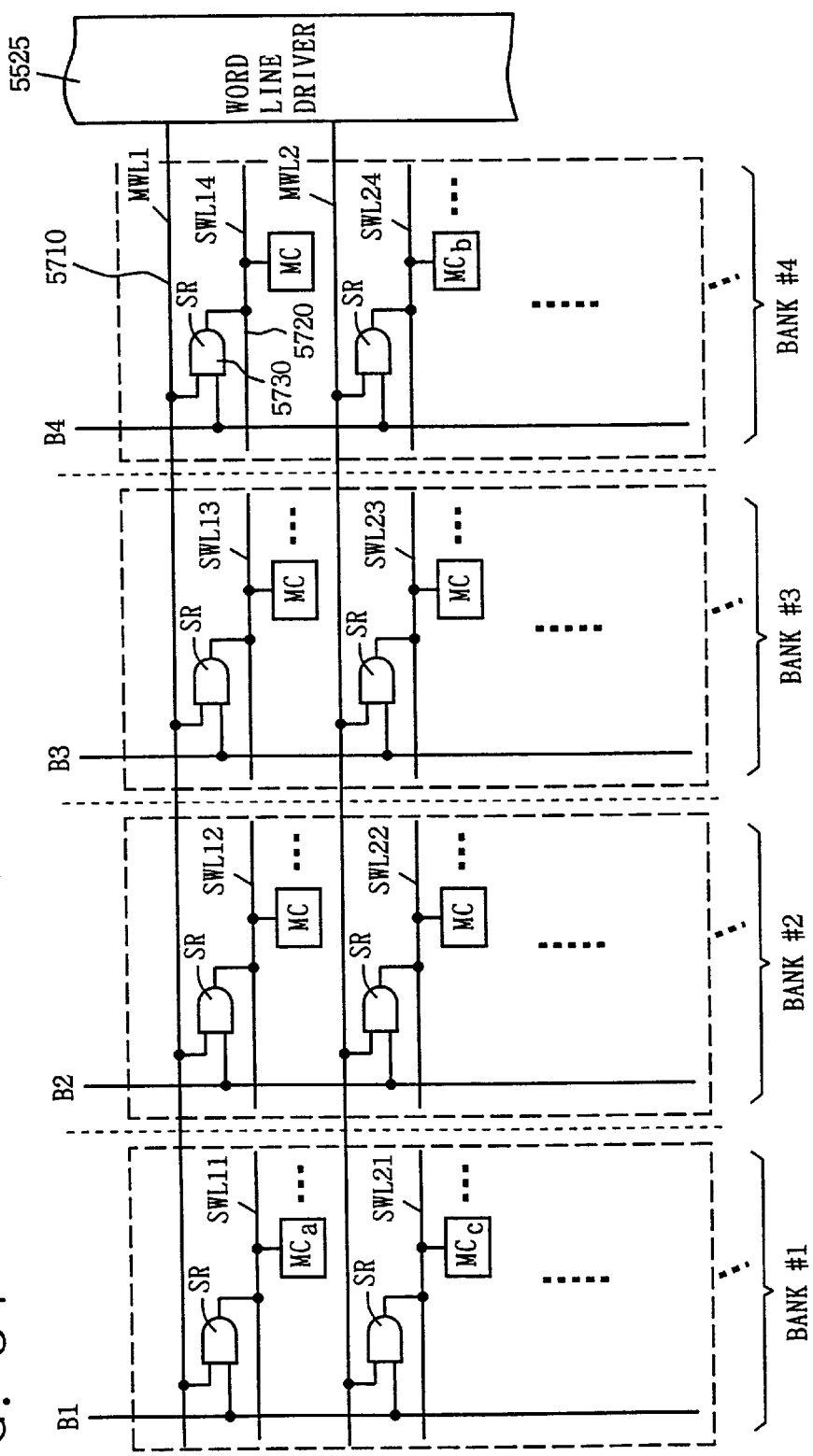
FIG. 37 is a diagram for use in illustration of the arrangement of word lines in multi-bank DRAM 5000.

FIG. 34 is a schematic block diagram of the path to transmit data read out from a normal memory cell column, a redundant memory cell column, sub I/O line pairs S-I/O and RS-I/O and main I/O line pairs M-I/O and RM-I/O to global I/O bus G-I/O.

Meanwhile, data read out in response to an activation of a column selecting line YS0 corresponding to a normal memory cell column in region 100a0 is transmitted to read/write amplifiers 802, 804, 806 and 808 via main I/O line pair M-I/0, amplified and then transmitted to a corresponding global I/O bus G-I/O.

Data read out via main I/O line pairs M-I/O provided corresponding to a redundant column region (spare region) SR0 in region 100a0 are amplified by read/write amplifiers 810 to 816.

The data amplified by read/write amplifiers 810 to 816 is input to a multiplexer 818, and transmitted to a prescribed data line pair in corresponding global I/O buses G-I/O in response to signal I/O-Sel. described in conjunction with FIG. 32.

Herein, data read out from a region of a normal memory cell column in region 100a0 is transmitted to global G-I/O line pair G-I/O0 to 3.

Data read out from redundant column region SR0 is transmitted to any of G-I/O line pairs 0 to 7 in a global I/O bus via multiplexer 818.

This is because data read out from region 100a1, another even address region is transmitted to G-I/O line pairs 4 to 7, and an output from multiplexer 618 is connected to all the G-I/O line pairs connected to regions 100a0 and 100a1 such that spare region SR0 is replaceable with any of the normal memory cell region in region 100a0 and the normal memory cell region in region 100a1.

Thus, in synchronous semiconductor memory device 1000 according to the first embodiment, the individual banks may further be divided into an array form to implement synchronous semiconductor memory device 3000 having banks in an array form. In this case, the same width of data as that in synchronous semiconductor memory device 1000 is secured at the time of reading out the data from a selected memory cell column, as the size of each bank in the row-direction is not changed.

Thus, while restricting increase in the chip area and power consumption, the number of pieces of data which can be taken out from a single memory cell array mat can be secured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device receiving an address signal and a control signal, and exchanging storage data in synchronism with an externally applied clock signal, comprising:
    a memory cell array having a plurality of memory cells arranged in a matrix of rows and columns, said memory cell array being divided into a plurality of memory cell blocks;
    an internal synchronizing signal generation circuit for outputting an internal clock signal in synchronism with said externally applied clock signal;
    an address signal input circuit for externally receiving said address signal in synchronism with said internal clock signal;
    an address bus provided commonly to said plurality of memory cell blocks for transmitting said address signal from said address signal input circuit; and
    a plurality of selecting circuits provided corresponding to said memory cell blocks, each for selecting a memory cell row and a memory cell column in a corresponding memory cell block based on said address signal from said address bus,
    said selecting circuit being activated in response to a selection of the corresponding memory cell block based on said address signal.

2. The synchronous semiconductor memory device as recited in claim 1, wherein
    said memory cell block is a bank which permits an independent reading/writing operation.

3. The synchronous semiconductor memory device as recited in claim 2, further comprising:
    a central control circuit responsive to said control signal for outputting an internal control signal to control the operation of said synchronous semiconductor memory device; and
    a command data bus provided commonly to said plurality of memory cell blocks for transmitting said internal control signal,
    said selecting circuit being activated in response to a selection of said corresponding memory cell block based on said internal control signal and said address signal.

4. The synchronous semiconductor memory device as recited in claim 3, further comprising a plurality of local control circuits provided corresponding to said memory cell blocks for controlling the operation of said corresponding memory cell block in response to said internal control signal from said command data bus,
    said local control circuit receiving said internal control signal in response to a selection of said corresponding memory cell block based on said address signal.

5. The synchronous semiconductor memory device as recited in claim 2, further comprising:
    a central control circuit responsive to said control signal for outputting an internal control signal to control the operation of said synchronous semiconductor memory device;
    a command data bus provided commonly to said plurality of memory cell blocks for transmitting said internal control signal,
    said internal control signal including,
    a row activation signal to instruct an activation of a row-related circuit, and
    a column activation signal to instruct an activation of a column-related circuit,
    each said selecting circuit including,
    a row selecting circuit for selecting a row in a corresponding memory cell block, and
    a column selecting circuit for selecting a column in a corresponding memory cell block,
    said row selecting circuit receiving a row address from said address bus in response to an activation of said row selecting activation signal and a selection of said corresponding memory cell block based on said address signal,
    said column selecting circuit receiving a column address from said address bus in response to an activation of said column selecting activation signal and a selection of said corresponding memory cell block based on said address signal.

6. The synchronous semiconductor memory device as recited in claim 3, further comprising a plurality of local control circuits provided corresponding to said memory cell blocks for controlling the operation of said corresponding memory cell block based on said internal control signal from said command data bus,
    said local control circuit including,
    a control signal receiving circuit responsive to a selection of said corresponding memory cell block based on said internal control signal and said address signal, and
    a first level holding circuit for holding the level of a signal from said control signal receiving circuit,
    an internal control signal from said central control circuit being inactivated after the holding operation of the signal level in said first level holding circuit is completed.

7. The synchronous semiconductor memory device as recited in claim 6, wherein
    said control signal receiving circuit includes,
    a hierarchical power supply circuit controlled by said central control circuit for reducing leakage current in a stand-by operation mode, and a driving circuit supplied with a power supply potential through said hierarchical power supply circuit for transmitting said internal control signal from said command bus to said first level holding circuit, said hierarchical power supply circuit attaining said standby operation mode after the holding operation of the signal level in said first level holding circuit is completed.

8. The synchronous semiconductor memory device as recited in claim 3, wherein said selecting circuit includes, an address signal receiving circuit responsive to a selection of said corresponding memory cell block based said internal control signal and said address signal, and a second level holding circuit for holding the level of a signal from said address signal receiving circuit.

9. A synchronous semiconductor memory device receiving an address signal and a control signal and exchanging storage data in response to an externally applied clock signal, comprising:

a memory cell array having a plurality of memory cells arranged in a matrix of rows and columns, said memory cell array being divided into a plurality of memory cell blocks;

an internal synchronizing signal generation circuit for outputting an internal clock signal in synchronism with said externally applied clock signal;

a central control circuit for externally receiving said control signal in synchronism with said internal clock signal and outputting an internal control signal to control the operation of said synchronous semiconductor memory device;

a command data bus provided commonly to said plurality of memory cell blocks for transmitting said internal control signal; and a plurality of local control circuits provided corresponding to said memory cell block for controlling the operation of said corresponding memory cell block in response to said internal control signal from said command data bus, said local control circuit receiving said internal control signal in response to a selection of said corresponding memory cell block.

10. The synchronous semiconductor memory device as recited in claim 9, wherein said memory cell block is a bank which permits an independent reading/writing operation.

11. The synchronous semiconductor memory device as recited in claim 10, further comprising, an address signal input circuit for externally receiving said address signal in synchronism with said internal clock signal, and an address bus provided commonly to said plurality of memory cell blocks for transmitting said address signal from said address signal input circuit, said local control circuit receiving said internal control signal in response to a selection of a corresponding memory cell block based on said address signal for receiving said internal control signal.

12. The synchronous semiconductor memory device as recited in claim 11, wherein said local control circuit includes, a control signal receiving circuit responsive to a selection of said corresponding memory cell block based on said internal control signal and said address signal for receiving said internal control signal, and a first level holding circuit for holding the level of a signal from said control signal receiving circuit.

13. The synchronous semiconductor memory device as recited in claim 12, wherein the internal control signal from said central control circuit is inactivated after the holding operation of a signal level in said first level holding circuit.

14. The synchronous semiconductor memory device as recited in claim 12, further comprising:

a plurality of row selecting circuits provided corresponding to said memory cell block for selecting a row of said memory cells based on said address signal from said address bus, and a plurality of word lines provided corresponding to a row of said memory cell blocks and selectively activated by said row selecting circuit, said row selecting circuit including, an address signal receiving circuit responsive to a selection of said corresponding memory cell block based on said control signal and said address signal for receiving said address signal, and a second level holding circuit for holding the level of a signal from said address signal receiving circuit, said second level holding circuit having a latch circuit provided for each of said word lines.

15. The synchronous semiconductor memory device as recited in claim 12, wherein said memory cell block is divided into a plurality of sub memory cell blocks, said synchronous semiconductor memory device, further comprising:

a plurality of row selecting circuits provided corresponding to said memory cell blocks for selecting a row of said memory cells based on said address signal from said address bus;

a plurality of main word lines provided corresponding to said memory cell blocks and commonly to said plurality of sub memory cell blocks; and a plurality of sub word lines provided corresponding to rows of said sub memory cell blocks and activated by said row selecting circuit in response to a selective activation of a corresponding main word line, said row selecting circuit, including, an address signal receiving circuit responsive to a selection of said corresponding memory cell block based on said internal control signal and said address signal for receiving said address signal, and a second level holding circuit for holding the level of a signal from said address signal receiving circuit, said second level holding circuit including a latch circuit provided for each of said sub word lines.

16. A synchronous semiconductor memory device receiving an address signal and a control signal and exchanging storage data in synchronism with an externally applied clock signal, comprising:

a memory cell array having a plurality of memory cells arranged in a matrix of rows and columns, said memory cell array being divided into a plurality of memory cell blocks provided in a matrix of a first plurality of columns and a second plurality of rows;

an internal synchronizing signal generation circuit for outputting an internal clock signal in synchronism with said externally applied clock signal;

an address signal input circuit for externally receiving said address signal in synchronism with said internal clock signal;

an address bus provided commonly to said plurality of memory cell blocks for transmitting said address signal from said address signal input circuit; and a plurality of selecting circuits provided corresponding to said memory cell blocks for selecting said memory cell based on said address signal from said address bus, said selecting circuit being activated in response to a selection of a corresponding memory cell block based on said address signal.

17. The synchronous semiconductor memory device as recited in claim 16, wherein said memory cell block is a bank which permits an independent reading/writing operation.

18. The synchronous semiconductor memory device as recited in claim 17, further comprising:

a central control circuit responsive to said control signal for outputting an internal control signal to control the operation of said synchronous semiconductor memory device; and a command data bus provided commonly to said plurality of memory cell blocks for transmitting said internal control signal, said internal control signal including, a row activation signal to instruct an activation of a row-related circuit, and a column activation signal to instruct an activation of a column-related circuit, each said selecting circuit including, a row selecting circuit for selecting a corresponding row of memory cell blocks, said row selecting circuit receiving and holding a row address from said address bus in response to an activation of said row selecting activation signal and a selection of said corresponding memory cell block based on said address signal, and a column selecting circuit for selecting a corresponding column of memory cell blocks, said column selecting circuit receiving and holding a column address from said address bus in response to an activation of said column selecting activation signal and a selection of said corresponding memory cell block based on said address signal.

19. The synchronous semiconductor memory device as recited in claim 18, wherein said plurality of memory cell blocks are divided into a plurality of bank groups, said row selecting circuit includes, a plurality of main row selecting circuits provided corresponding to said bank groups, receiving signals from said address bus and said command data bus and responsive to an activation of said row selecting activation signal and a selection of said corresponding memory cell block for receiving and holding a row address signal from said address bus, and a plurality of sub row selecting circuits provided corresponding to said memory cell blocks for receiving and holding the row address signal held by said main row selecting circuit and generating a signal to select a corresponding memory cell row.

20. The synchronous semiconductor memory device as recited in claim 17, wherein said selecting circuit includes, an address signal receiving circuit responsive to a selection of said corresponding memory cell block based on said internal control signal and said address signal for receiving said address signal, a level holding circuit for holding the level of a signal from said address signal receiving circuit.

* * * * *